(12) United States Patent
Taguchi et al.

(10) Patent No.: US 12,038,688 B2
(45) Date of Patent: Jul. 16, 2024

(54) COMPOSITION, LIGHT SHIELDING FILM, SOLID-STATE IMAGING ELEMENT, IMAGE DISPLAY DEVICE, AND METHOD FOR MANUFACTURING CURED FILM

(71) Applicant: FUJIFILM Corporation, Tokyo (JP)

(72) Inventors: Yoshinori Taguchi, Shizuoka (JP); Hiroaki Idei, Shizuoka (JP); Misaho Adachi, Shizuoka (JP); Teppei Abe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 33 days.

(21) Appl. No.: 17/898,423

(22) Filed: Aug. 29, 2022

(65) Prior Publication Data

US 2023/0095789 A1    Mar. 30, 2023

(30) Foreign Application Priority Data

Aug. 31, 2021 (JP) ................................ 2021-141691

(51) Int. Cl.
*G03F 7/004* (2006.01)
*G03F 7/038* (2006.01)
(52) U.S. Cl.
CPC .......... *G03F 7/0042* (2013.01); *G03F 7/0045* (2013.01); *G03F 7/0388* (2013.01)

(58) Field of Classification Search
CPC ........................................................ G03F 7/00
See application file for complete search history.

(56) References Cited

U.S. PATENT DOCUMENTS

2011/0315049 A1* 12/2011 Aoki ................... C09D 11/322
106/31.86

FOREIGN PATENT DOCUMENTS

| CN | 1514845 A | * | 7/2004 | .......... C07C 251/66 |
| EP | 2407456 A1 | * | 1/2012 | .......... C07D 209/86 |
| JP | 2005255754 A | * | 9/2005 | .......... C08L 101/00 |
| JP | 4626096 B2 | * | 2/2011 | |
| JP | 2019082533 | | 5/2019 | |

* cited by examiner

*Primary Examiner* — Chanceity N Robinson
(74) *Attorney, Agent, or Firm* — JCIPRNET

(57) ABSTRACT

A composition with which a cured film having excellent light shielding properties and low reflection properties can be produced is provided; a light shielding film; a solid-state imaging element; an image display device; and a method for manufacturing a cured film. The composition including carbon black, barium sulfate, one or more kinds selected from the group consisting of copper phthalocyanine and a copper phthalocyanine derivative, a resin, and a solvent, in which the solvent includes a solvent A having a boiling point of 180° C. or higher, a solvent B having a boiling point of 140° C. or higher and lower than 180° ° C., and a solvent C having a boiling point of 100° C. or higher and lower than 140° C.

20 Claims, 3 Drawing Sheets

COMPOSITION, LIGHT SHIELDING FILM, SOLID-STATE IMAGING ELEMENT, IMAGE DISPLAY DEVICE, AND METHOD FOR MANUFACTURING CURED FILM

CROSS-REFERENCE TO RELATED APPLICATIONS

The present application claims priority under 35 U.S.C. § 119 to Japanese Patent Application No. 2021-141691, filed on Aug. 31, 2021. The above application is hereby expressly incorporated by reference, in its entirety, into the present application.

BACKGROUND OF THE INVENTION

1. Field of the Invention

The present invention relates to a composition, a light shielding film, a solid-state imaging element, an image display device, and a method for manufacturing a cured film.

2. Description of the Related Art

A composition including black powder has been used for various purposes in the related art, and for example, the composition is used in the production of a light shielding film to be disposed in a liquid crystal display device and a solid-state imaging device such as a charge coupled device (CCD) image sensor and a complementary metal-oxide semiconductor (CMOS) image sensor. For example, a color filter used in the liquid crystal display device includes a light shielding film which is called a black matrix, for the purpose of shielding colored pixels from light, enhancing contrast, and the like. In addition, the solid-state imaging element is also provided with a light shielding film at a predetermined position for the purpose of preventing generation of noise, improving image quality, and the like.

For example, JP2019-082533A discloses, as a pigment dispersion resist composition for a black matrix with good light shielding properties and low reflectivity, a "pigment dispersion composition for a black matrix, including carbon black, precipitated barium sulfate, a basic group-containing pigment dispersant, a pigment derivative, an alkali-soluble resin, and a solvent, characterized in that a content ratio of the carbon black and the precipitated barium sulfate (carbon black/precipitated barium sulfate) is 95/5 to 65/35". In the example column of JP2019-082533A, only one kind of propylene glycol monomethyl ether acetate (PGMEA) is used alone as the solvent.

SUMMARY OF THE INVENTION

As a result of studying the composition disclosed in JP2019-082533A, the present inventors have clarified that, although the light shielding properties are good, the reflectivity may be higher than the level required in recent years. That is, it is clarified that it is necessary to further reduce reflection properties while maintaining good light shielding properties.

Therefore, an object of the present invention is to provide a composition with which a cured film having excellent light shielding properties and low reflection properties can be produced.

Another object of the present invention is to provide a light shielding film, a solid-state imaging element, an image display device, and a method for manufacturing a cured film.

As a result of conducting an extensive investigation to achieve the objects, the present inventors have found that the objects can be achieved by the following constitution.

[1] A composition comprising:
carbon black;
barium sulfate;
one or more kinds selected from the group consisting of copper phthalocyanine and a copper phthalocyanine derivative;
a resin; and
a solvent,
in which the solvent includes a solvent A having a boiling point of 180° C. or higher, a solvent B having a boiling point of 140° C. or higher and lower than 180° C., and a solvent C having a boiling point of 100° C. or higher and lower than 140° C.

[2] The composition according to [1], further comprising:
a compound including an unsaturated double bond; and
a polymerization initiator.

[3] The composition according to [2],
in which the polymerization initiator includes a compound represented by Formula (1) described later.

[4] The composition according to any one of [1] to [3],
in which a solubility parameter of the solvent A is 11.0 to 14.0 $(cal/cm^3)^{1/2}$.

[5] The composition according to any one of [1] to [4],
in which a solubility parameter of the solvent A is 12.0 to 13.0 $(cal/cm^3)^{1/2}$.

[6] The composition according to any one of [1] to [5],
in which the solvent A is one or more kinds selected from the group consisting of γ-butyrolactone, dimethyl sulfoxide, and benzyl alcohol,
the solvent B is one or more kinds selected from the group consisting of propylene glycol monomethyl ether acetate and cyclohexanone, and
the solvent C is one or more kinds selected from the group consisting of butyl acetate and ethyl butyrate.

[7] The composition according to any one of [1] to [6],
in which the copper phthalocyanine derivative is a salt composed of copper phthalocyanine having a sulfonic acid group and dimethyldioctadecylammonium.

[8] The composition according to any one of [1] to [7],
in which a content of the carbon black is 15% to 40% by mass with respect to a total solid content of the composition.

[9] The composition according to any one of [1] to [8], further comprising:
one or more kinds of metal-containing particles selected from the group consisting of a metal nitride and a metal oxynitride.

[10] The composition according to [9],
in which the metal-containing particles are a nitride or an oxynitride of one or more kinds of metals selected from the group consisting of titanium, zirconium, vanadium, and niobium.

[11] The composition according to any one of [1] to [10], further comprising:
a silicone-based surfactant.

[12] The composition according to [11],
in which the silicone-based surfactant is a surfactant having a phenyl group.

[13] The composition according to any one of [1] to [12],
in which a content of a solid content is 10% to 40% by mass.

[14] The composition according to any one of [1] to [13],
in which a content of water is 1.0% by mass or less with respect to a total mass of the composition.

[15] The composition according to any one of [1] to [14], in which a content of the solvent A is 1.0% to 25.0% by mass with respect to a total content of the solvent A, the solvent B, and the solvent C,
a content of the solvent B is 50.0% to 98.0% by mass with respect to the total content of the solvent A, the solvent B, and the solvent C, and
a content of the solvent C is 1.0% to 25.0% by mass with respect to the total content of the solvent A, the solvent B, and the solvent C.

[16] The composition according to any one of [1] to [15], in which the composition is a composition for forming a light shielding film.

[17] A light shielding film comprising:
a cured film formed from the composition according to any one of [1] to [15].

[18] A solid-state imaging element comprising:
a cured film formed from the composition according to any one of [1] to [15].

[19] An image display device comprising:
a cured film formed from the composition according to any one of [1] to [15].

[20] A method for manufacturing a cured film, comprising:
a composition layer forming step of forming a composition layer consisting of the composition according to [2] on a support;
an exposure step of exposing the composition layer by irradiating the composition layer with an actinic ray or a radiation; and
a development step of performing a development treatment on the composition layer after the exposure.

According to the present invention, it is possible to provide a composition with which a cured film having excellent light shielding properties and low reflection properties can be produced.

In addition, according to the present invention, it is possible to provide a light shielding film, a solid-state imaging element, an image display device, and a method for manufacturing a cured film.

DESCRIPTION OF THE PREFERRED EMBODIMENTS

Figure 1:
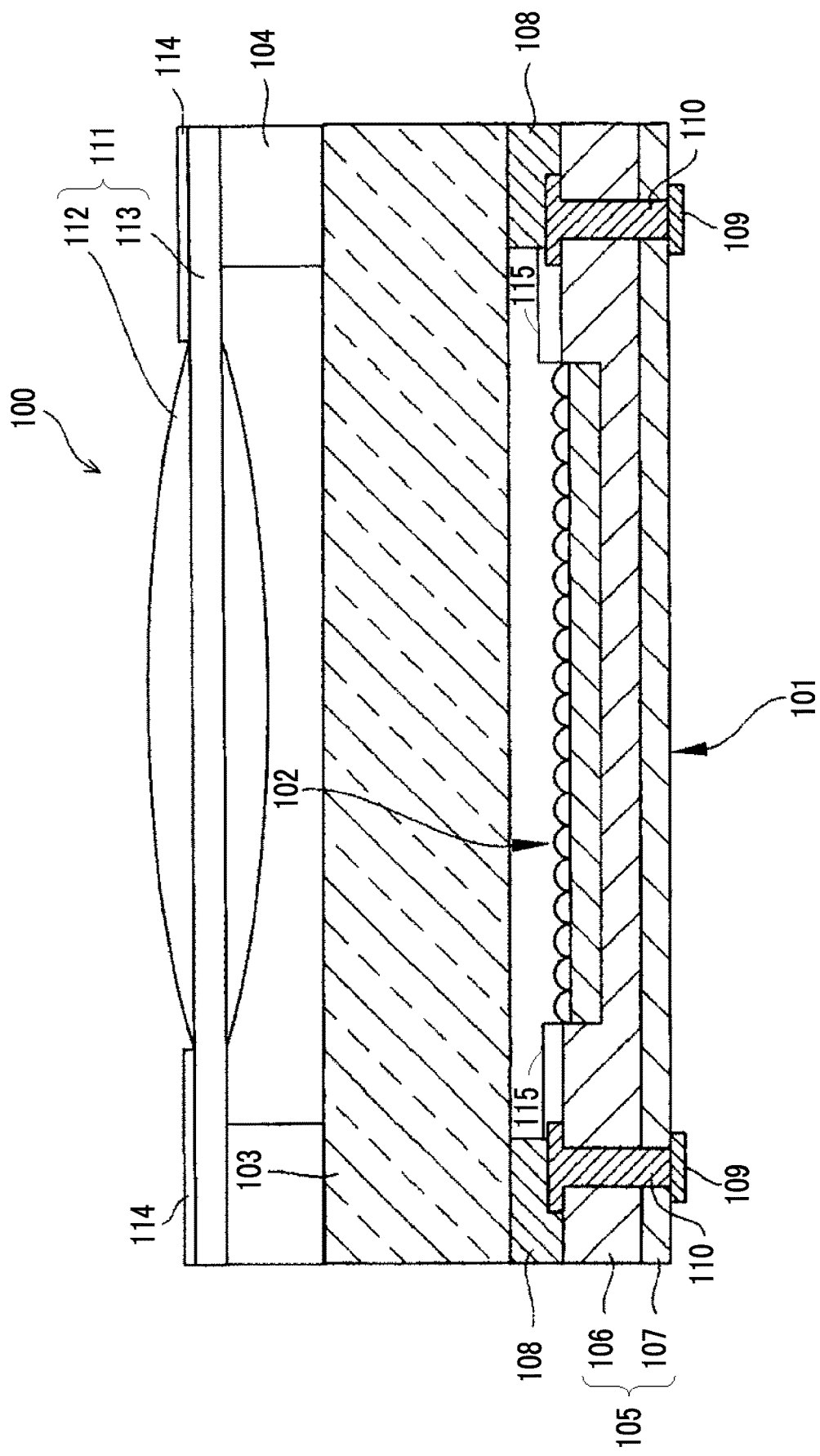
FIG. 1 is a schematic cross-sectional view showing an example of the configuration of a solid-state imaging device.

Hereinafter, the present invention will be described in detail.

The description of the following configuration requirements is made based on typical embodiments of the present invention in some cases, but the present invention is not limited to the embodiments.

Furthermore, in the present specification, a numerical range expressed using "to" means a range including numerical values described before and after "to" as a lower limit value and an upper limit value.

In the present specification, regarding the description of a group (atomic group), in a case where whether the group is substituted or unsubstituted is not described, the group includes a group which has a substituent as well as a group which does not have a substituent. For example, an "alkyl group" includes not only an alkyl group (unsubstituted alkyl group) which does not have a substituent but also an alkyl group (substituted alkyl group) which has a substituent.

In addition, in the present specification, "actinic rays" or "radiations" refers to, for example, far ultraviolet rays, extreme ultraviolet rays (EUV: extreme ultraviolet lithography), X-rays, electron beams, and the like. In addition, in the present specification, light refers to actinic rays and radiations. In the present specification, unless otherwise specified, "exposure" includes not only exposure with far ultraviolet rays, X-rays, EUV light, or the like but also drawing by particle beams such as electron beams and ion beams.

In the present specification, "(meth)acrylate" represents acrylate and methacrylate. In the present specification, "(meth)acryl" represents acryl and methacryl. In the present specification, "(meth)acryloyl" represents acryloyl and methacryloyl. In the present specification, "(meth)acrylamide" represents acrylamide and methacrylamide. In the present specification, a "monomeric substance" and a "monomer" have the same definition.

In the present specification, a weight-average molecular weight (Mw) is a value in terms of polystyrene, as measured by a gel permeation chromatography (GPC) method.

In the present specification, the GPC method is based on a method in which HLC-8020 GPC (manufactured by TOSOH CORPORATION) is used, TSKgel SuperHZM-H, TSKgel SuperHZ4000, and TSKgel SuperHZ2000 (manufactured by TOSOH CORPORATION, 4.6 mm ID×15 cm) are used as columns, and tetrahydrofuran (THF) is used as an eluent.

In the present specification, a solid content in a composition means a composition layer formed of the composition, and in a case where the composition includes a solvent, the solid content means all components except the solvent. In addition, in a case where the components are components which form a composition layer, the components are considered to be solid contents even in a case where the components are liquid components.

Composition

A composition according to an embodiment of the present invention includes carbon black, barium sulfate, one or more kinds (hereinafter, also referred to as "copper phthalocyanines") selected from the group consisting of copper phthalocyanine and a copper phthalocyanine derivative, a resin, and a solvent, in which the solvent includes a solvent A having a boiling point of 180° C. or higher (hereinafter, may be abbreviated as a "solvent A"), a solvent B having a boiling point of 140° C. or higher and lower than 180° C. (hereinafter, may be abbreviated as a "solvent B"), and a solvent C having a boiling point of 100° C. or higher and lower than 140° C. (hereinafter, may be abbreviated as a "solvent C").

A cured film produced by the composition according to the embodiment of the present invention has excellent light shielding properties (high minimum OD value at a wavelength of 400 to 1000 nm) and excellent low reflection properties (low maximum reflectivity at a wavelength of 400 to 700 nm). The mechanism by which the composition according to the embodiment of the present invention having such a configuration can solve the problems is not always clear, but since the composition includes the above-described solvents A to C, it is presumed that layer separation is likely to be induced in a case where the film of the composition is formed, and as a result, irregularities are likely to be formed on a surface, and excellent low reflection properties are exhibited. In addition, since the composition according to the embodiment of the present invention mainly includes carbon black, excellent light shielding properties are exhibited.

In the present specification, the "cured film" may be a film formed of a composition, and includes both a film which has been subjected to a curing treatment such as an exposure treatment and a film which has not been subjected to a curing treatment such as an exposure treatment.

Hereinafter, the fact that the cured film produced by the composition has more excellent light shielding properties (higher minimum OD value at a wavelength of 400 to 1000 nm), the fact that the cured film produced by the composition has more excellent low reflection properties (lower maximum reflectivity at a wavelength of 400 to 700 nm), the fact that the cured film produced by the composition has more excellent undercut suppression performance, the fact that the cured film produced by the composition has more excellent pencil hardness, the fact that the cured film produced by the composition has more excellent peeling resistance against moisture after aging, the fact that the composition has more excellent viscosity stability over time, the fact that the composition has more excellent solvent resistance (in other words, more excellent solvent removability), and/or the fact that the composition has more excellent coating unevenness suppression is also referred to that "the effects of the present invention are more excellent".

Carbon Black

The composition includes carbon black.

The carbon black may be neutral, acidic, or basic, but from the viewpoint that the effects of the present invention are more excellent, the carbon black is preferably acidic.

The pH of the acidic carbon black is preferably 2.0 to 4.0.

Specific examples of the acidic carbon black include Raven1080 (average primary particle diameter: 28 nm, pH: 2.4) and Raven1100 (average primary particle diameter: 32 nm, pH: 2.9) manufactured by Columbia Chemical; MA8 (average primary particle diameter: 24 nm, pH: 3.0), MA100 (average primary particle diameter: 24 nm, pH: 3.5), MA7 (average primary particle diameter: 24 nm, pH: 3.0), MA77 (average primary particle diameter: 23 nm, pH: 2.5), MA220 (average primary particle diameter: 55 nm, pH: 3.0), #2350 (average primary particle diameter: 15 nm, pH: 2.5, manufactured by Mitsubishi Chemical Corporation) manufactured by Mitsubishi Chemical Corporation; and SPECIAL BLACK 250 (average primary particle diameter: 56 nm, pH: 3.0), SPECIAL BLACK 350 (average primary particle diameter: 31 nm, pH: 3.0), SPECIAL BLACK 550 (average primary particle diameter: 25 nm, pH: 4), NEROX2500 (average primary particle diameter: 56 nm, pH: 3.0), and NEROX 3500 (average primary particle diameter: 31 nm, pH: 3.0) manufactured by Orion Engineered Carbons S.A.

Examples of the neutral and basic carbon black include those having a pH of 6.5 or more.

Specific examples of the neutral and basic carbon black include PRINTEX 25 (average primary particle diameter: 56 nm, pH: 9.5), PRINTEX 35 (average primary particle diameter: 31 nm, pH: 9.5), and PRINTEX 65 (average primary particle diameter: 21 nm, pH: 9.5) manufactured by Orion Engineered Carbons S.A.; and #30 (average primary particle diameter: 30 nm, pH: 8.0) and #2600 (average primary particle diameter: 13 nm, pH: 6.5) manufactured by Mitsubishi Chemical Corporation.

An average primary particle diameter of the carbon black is preferably, for example, 10 to 60 nm, and from the viewpoint that the effects of the present invention are more excellent, more preferably 10 to 30 nm.

The above-described pH of the carbon black is a catalog value, or is a value obtained by the following measuring method in a case where there is no catalog value.

pH Measuring Method 1 g of carbon black is added to 20 ml of distilled water (pH: 7.0) from which carbonic acid has been removed, and is mixed with a magnetic stirrer to prepare an aqueous suspension, and then a value is measured at 25° C. using a glass electrode (German Industrial Standard DIN ISO 787/9).

In addition, the above-described average primary particle diameter of the carbon black is a catalog value, or is a value of an arithmetic mean diameter by electron microscope observation in a case where there is no catalog value.

A content of the carbon black is preferably 5% by mass or more, more preferably 10% by mass or more, and still more preferably 15% by mass or more with respect to the total solid content of the composition. Moreover, the upper limit value thereof is preferably 60% by mass or less, more preferably 45% by mass or less, and still more preferably 40% by mass or less.

The carbon black may be used singly or in combination of two or more kinds thereof. In a case where two or more kinds of the carbon blacks are used in combination, the total content thereof is preferably within the above-described range.

Barium Sulfate

The composition includes barium sulfate.

From the viewpoint that the effects of the present invention are more excellent and/or dispersion stability is more excellent, an average primary particle diameter of the barium sulfate is preferably 0.01 to 0.08 μm.

From the viewpoint that the effects of the present invention are more excellent, a mass-based formulating amount ratio (carbon black/barium sulfate) of the carbon black and the barium sulfate is preferably 95/5 to 65/35 and more preferably 90/10 to 75/25.

Examples of a suitable aspect of the barium sulfate include a precipitated barium sulfate.

Examples of a commercially available product of the barium sulfate include BF-20, BF-10, BF-21, BF-1, and BF-40 (all manufactured by SAKAI CHEMICAL INDUSTRY CO., LTD.).

A content of the barium sulfate is preferably 1.0% by mass or more, more preferably 1.5% by mass or more, and still more preferably 2.0% by mass or more with respect to the total solid content of the composition. Moreover, the upper limit value thereof is preferably 10.0% by mass or less, more preferably 8.0% by mass or less, and still more preferably 6.0% by mass or less.

Copper Phthalocyanine and Copper Phthalocyanine Derivative (Copper Phthalocyanines)

The composition includes one or more kinds selected from the group consisting of copper phthalocyanine and a copper phthalocyanine derivative (copper phthalocyanines).

The copper phthalocyanine is intended to be a copper complex of phthalocyanine. The copper phthalocyanine derivative is intended to be a copper complex of phthalocyanine having a substituent (in a case where the substituent includes a polar group such as an acid group and a basic group, the copper complex may have a salt structure), and examples thereof include a copper complex of phthalocyanine having a substituent including a polar group such as an acid group and a basic group, and a salt thereof.

Examples of the acid group include a sulfonic acid group, a carboxylic acid group, and a phosphoric acid group, and from the viewpoint that the effects of the present invention are more excellent, a sulfonic acid group is preferable.

Examples of the basic group include a primary amino group, a secondary amino group, a tertiary amino group, a hetero ring including an N atom, and an amide group.

The salt is not particularly limited, and examples thereof include a halide salt, an alkali metal salt, and a quaternary ammonium salt.

Examples of a halide ion constituting the halide salt include a fluoride ion, a chloride ion, a bromide ion, and an iodide ion.

Examples of an alkali metal ion constituting the alkali metal salt include a lithium ion, a sodium ion, and a potassium ion.

Examples of a quaternary ammonium ion constituting the quaternary ammonium salt include a quaternary ammonium ion represented by Formula (NA).

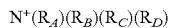

$$N^+(R_A)(R_B)(R_C)(R_D) \quad \text{Formula (NA)}$$

$R_A$ to $R_D$ each independently represent a hydrogen atom, an alkyl group, an alkenyl group, or an alkynyl group, which may have a substituent. Among them, $R_A$ to $R_D$ are preferably an alkyl group which may have a substituent. The substituent is not particularly limited, and examples thereof include a hydroxyl group.

The alkyl group, alkenyl group, and alkynyl group are preferably linear or branched.

The number of carbon atoms in the alkyl group is preferably 1 to 30 and more preferably 1 to 25.

The number of carbon atoms in the alkenyl group and alkynyl group is preferably 2 to 30 and more preferably 2 to 25.

Examples of a suitable aspect of the quaternary ammonium ion represented by Formula (NA) include an aspect in which $R_A$ and RB are long chains (for example, the numbers of carbon atoms in $R_A$ and $R_B$ are each independently preferably 12 to 30 and more preferably 12 to 25), and $R_C$ and $R_D$ are short chains (for example, the numbers of carbon atoms in $R_C$ and $R_D$ are each independently preferably 1 to 10, more preferably 1 to 6, and it is still more preferable to be a methyl group).

From the viewpoint that the effects of the present invention are more excellent, the quaternary ammonium ion represented by Formula (NA) is preferable dimethyldioctadecylammonium.

As the copper phthalocyanines, from the viewpoint that the effects of the present invention are more excellent, a copper complex of phthalocyanine having a substituent including a sulfonic acid group or a salt thereof is preferable, a quaternary ammonium salt of a copper complex of phthalocyanine having a substituent including a sulfonic acid group is more preferable, and a salt composed of a copper complex of phthalocyanine having a substituent including a sulfonic acid group and dimethyldioctadecylammonium is still more preferable.

The substituent including a sulfonic acid group may be a sulfonic acid group or a group represented by *-$L^A$-sulfonic acid group ($L^A$ represents a divalent linking group and * represents a bonding position). The divalent linking group represented by $L^A$ is not particularly limited, and examples thereof include an alkylene group, an alkenylene group, an alkynylene group, —O—, —S—, —NR$^A$—, —CO—, and a group of a combination of these groups. $R^A$ represents a hydrogen atom or an alkyl group having 1 to 6 carbon atoms. The above-described alkylene group, alkenylene group, and alkynylene group may further have a substituent.

Examples of the Copper Phthalocyanines Include C. I. Pigment Blue 15:3.

In addition, examples of a commercially available product of the copper phthalocyanines include "5000" of "SOLSPERSE" series (manufactured by Lubrizol Japan Limited), and a copper phthalocyanine-3,4',4'',4'''-tetrasulfonic acid tetrasodium salt available from Sigma-Aldrich Co., LLC.

A content of the copper phthalocyanines is preferably 1.0% by mass or more, more preferably 1.5% by mass or more, and still more preferably 2.0% by mass or more with respect to the total solid content of the composition. Moreover, the upper limit value thereof is preferably 10.0% by mass or less, more preferably 8.0% by mass or less, and still more preferably 6.0% by mass or less.

Furthermore, a content ratio of the barium sulfate to the copper phthalocyanines (mass ratio; content of barium sulfate/content of copper phthalocyanines) is, for example, preferably 0.1 to 5.0, and from the viewpoint that the effects of the present invention are more excellent, more preferably 1.0 to 3.0.

The copper phthalocyanines may be used singly or in combination of two or more thereof. In a case where two or more copper phthalocyanines are used in combination, the total content thereof is preferably within the above-described range.

Resin

The composition according to the embodiment of the present invention includes a resin. Examples of the resin include a dispersant and an alkali-soluble resin.

A content of the resin in the composition is not particularly limited, but is preferably 3% to 60% by mass, more preferably 9% to 40% by mass, and still more preferably 9% to 35% by mass with respect to the total solid content of the composition. The resin may be used alone or in combination of two or more thereof. In a case where two or more resins are used in combination, the total content thereof is preferably within the above-described range.

A molecular weight of the resin is more than 2000. In a case where the molecular weight of the resin is polydisperse, a weight-average molecular weight thereof is more than 2000.

Dispersant

The composition preferably includes a dispersant. In the present specification, a dispersant means a compound different from the alkali-soluble resin which will be described later.

A content of the dispersant in the composition is not particularly limited, but is preferably 2% to 40% by mass, more preferably 5% to 30% by mass, and still more preferably 10% to 25% by mass with respect to the total solid content of the composition.

The dispersant may be used alone or in combination of two or more thereof. In a case where two or more dispersants are used in combination, the total content thereof is preferably within the above-described range.

Moreover, in the composition, a mass ratio of the content of the dispersant to the content of the carbon black (content of the dispersant/content of the carbon black) is preferably 0.05 to 1.00, more preferably 0.1 to 0.80, and still more preferably 0.20 to 0.80.

As the dispersant, for example, known dispersants can be appropriately selected and used. Among them, a polymer compound is preferable.

Examples of the dispersant include a polymer dispersant [for example, polyamidoamine and a salt thereof, polycarboxylic acid and a salt thereof, high-molecular-weight unsaturated acid ester, modified polyurethane, modified polyester, modified poly(meth)acrylate, a (meth)acrylic copolymer, and a naphthalenesulfonic acid-formalin condensate], polyoxyethylene alkyl phosphoric acid ester, polyoxyethylene alkylamine, and a pigment derivative.

The polymer compound can be further classified into a linear polymer, a terminal-modified polymer, a graft polymer, and a block polymer based on the structure.

Polymer Compound

The polymer compound acts to prevent the reaggregation of a substance to be dispersed by being adsorbed onto a surface of the substance to be dispersed, such as the carbon black and another pigment (hereinafter, the carbon black and the other pigment are collectively and simply referred to as a "pigment" as well) used in combination as desired. Therefore, a terminal-modified polymer, a graft (including a polymer chain) polymer, or a block polymer is preferable which includes a moiety anchored to the pigment surface.

The above-described polymer compound may include a curable group.

Examples of the curable group include an ethylenically unsaturated group (for example, a (meth)acryloyl group, a vinyl group, a styryl group, and the like), and a cyclic ether group (for example, an epoxy group, an oxetanyl group, and the like), but the present invention is not limited thereto.

Among them, from the viewpoint that polymerization can be controlled by a radical reaction, as the curable group, an ethylenically unsaturated group is preferable. As the ethylenically unsaturated group, a (meth)acryloyl group is more preferable.

The resin including a curable group preferably includes one or more kinds selected from the group consisting of a polyester structure and a polyether structure. In this case, the polyester structure and/or the polyether structure may be included in a main chain, and as will be described later, in a case where the above-described resin has a structural unit including a graft chain, the above-described polymer chain may have a polyester structure and/or a polyether structure.

As the resin, a resin in which the polymer chain has a polyester structure is more preferable.

The polymer compound preferably has a structural unit including a graft chain. In the present specification, the "structural unit" has the same definition as a "repeating unit".

Such a polymer compound having the structural unit including a graft chain has an affinity with a solvent due to the graft chain, and thus is excellent in dispersibility of a pigment or the like and dispersion stability after the lapse of time. Moreover, due to the presence of the graft chain, the polymer compound having the structural unit including a graft chain has an affinity with a polymerizable compound or other resins which can be used in combination. As a result, residues are less likely to be generated in alkali development.

In a case where the graft chain is prolonged, a steric repulsion effect is enhanced, and thus the dispersibility of the pigment or the like is improved. Meanwhile, in a case where the graft chain is too long, adsorptive power to the pigment or the like is reduced, and thus the dispersibility of the pigment or the like tends to be reduced. Therefore, the number of atoms excluding a hydrogen atom in the graft chain is preferably 40 to 10000, more preferably 50 to 2000, and still more preferably 60 to 500.

Herein, the graft chain refers to a portion from the base (in a group which is branched off from the main chain, an atom bonded to the main chain) of a main chain of the copolymer to the terminal of a group branched off from the main chain.

The graft chain preferably includes a polymer structure, and examples of such a polymer structure include a poly (meth)acrylate structure (for example, a poly(meth)acryl structure), a polyester structure, a polyurethane structure, a polyurea structure, a polyamide structure, and a polyether structure.

In order to improve interactive properties between the graft chain and the solvent, and thus enhance the dispersibility of the pigment or the like, the graft chain is preferably a graft chain having one or more kinds selected from the group consisting of a polyester structure, a polyether structure, and a poly(meth)acrylate structure, and more preferably a graft chain having at least one of a polyester structure or a polyether structure.

A macromonomer (a monomer which has a polymer structure and constitutes a graft chain by being bonded to the main chain of a copolymer) including such a graft chain is not particularly limited, but a macromonomer including a reactive double bond group can be suitably used.

As a commercial macromonomer, which corresponds to the structural unit including a graft chain included in the polymer compound and is suitably used for synthesizing the polymer compound, AA-6 (trade name, manufactured by TOAGOSEI CO., LTD.), AA-10 (trade name, manufactured by TOAGOSEI CO., LTD.), AB-6 (trade name, manufactured by TOAGOSEI CO., LTD.), AS-6 (trade name, manufactured by TOAGOSEI CO., LTD.), AN-6 (trade name, manufactured by TOAGOSEI CO., LTD.), AW-6 (trade name, manufactured by TOAGOSEI CO., LTD.), AA-714 (trade name, manufactured by TOAGOSEI CO., LTD.), AY-707 (trade name, manufactured by TOAGOSEI CO., LTD.), AY-714 (trade name, manufactured by TOAGOSEI CO., LTD.), AK-5 (trade name, manufactured by TOAGOSEI CO., LTD.), AK-30 (trade name, manufactured by TOAGOSEI CO., LTD.), AK-32 (trade name, manufactured by TOAGOSEI CO., LTD.), BLEMMER PP-100 (trade name, manufactured by NOF CORPORATION), BLEMMER PP-500 (trade name, manufactured by NOF CORPORATION), BLEMMER PP-800 (trade name, manufactured by NOF CORPORATION), BLEMMER PP-1000 (trade name, manufactured by NOF CORPORATION), BLEMMER 55-PET-800 (trade name, manufactured by NOF CORPORATION), BLEMMER PME-4000 (trade name, manufactured by NOF CORPORATION), BLEMMER PSE-400 (trade name, manufactured by NOF CORPORATION), BLEMMER PSE-1300 (trade name, manufactured by NOF CORPORATION), BLEMMER 43PAPE-600B (trade name, manufactured by NOF CORPORATION), or the like is used. Among them, AA-6 (trade name, manufactured by TOAGOSEI CO., LTD.), AA-10 (trade name, manufactured by TOAGOSEI CO., LTD.), AB-6 (trade name, manufactured by TOAGOSEI CO., LTD.), AS-6 (trade name, manufactured by TOAGOSEI CO., LTD.), AN-6 (trade name, manufactured by TOAGOSEI CO., LTD.), or BLEMMER PME-4000 (trade name, manufactured by NOF CORPORATION) is preferable.

The dispersant preferably has one or more structures selected from the group consisting of polymethyl acrylate, polymethyl methacrylate, and cyclic or chain-like polyester, more preferably has one or more structures selected from the group consisting of polymethyl acrylate, polymethyl methacrylate, and chain-like polyester, and still more preferably has one or more structures selected from the group consisting of a polymethyl acrylate structure, a polymethyl methacrylate structure, a polycaprolactone structure, and a polyvalerolactone structure. The dispersant may be a dispersant having the above-described structure alone in one dispersant, or may be a dispersant having a plurality of these structures in one dispersant.

Herein, the polycaprolactone structure refers to a structure including a structure, which is obtained by ring opening of ε-caprolactone, as a repeating unit. The polyvalerolactone structure refers to a structure including a structure, which is obtained by ring opening of δ-valerolactone, as a repeating unit.

Specific examples of the dispersant having a polycaprolactone structure include dispersants in which j and k in Formula (1) and Formula (2) are each 5. Moreover, specific examples of the dispersant having a polyvalerolactone structure include dispersants in which j and k in Formula (1) and Formula (2) are each 4.

Specific examples of the dispersant having a polymethyl acrylate structure include dispersants in which in Formula (4), $X^5$ is a hydrogen atom and $R^4$ is a methyl group. Moreover, specific examples of the dispersant having a polymethyl methacrylate structure include dispersants in which in Formula (4), $X^5$ is a methyl group and $R^4$ is a methyl group.

Structural Unit Including Graft Chain

As the structural unit including a graft chain, the polymer compound preferably has a structural unit represented by any one of Formula (1), . . . , or Formula (4), and more preferably has a structural unit represented by any one of Formula (1A), Formula (2A), Formula (3A), Formula (3B), or Formula (4).

In Formulae (1) to (4), $W^1$, $W^2$, $W^3$, and $W^4$ each independently represent an oxygen atom or NH. $W^1$, $W^2$, $W^3$, and $W^4$ are each preferably an oxygen atom.

In Formulae (1) to (4), $X^1$, $X^2$, $X^3$, $X^4$, and $X^5$ each independently represent a hydrogen atom or a monovalent organic group. From the viewpoint of the restriction on synthesis, $X^1$, $X^2$, $X^3$, $X^4$, and $X^5$ are preferably each independently a hydrogen atom or an alkyl group having 1 to 12 carbon atoms (the number of carbon atoms), more preferably each independently a hydrogen atom or a methyl group, and still more preferably each independently a methyl group.

In Formulae (1) to (4), $Y^1$, $Y^2$, $Y^3$, and $Y^4$ each independently represent a divalent linking group, and the linking group has no particular restriction on a structure. Specific examples of the divalent linking groups represented by $Y^1$, $Y^2$, $Y^3$, and $Y^4$ include linking groups represented by the following (Y-1) to (Y-21). In the following structures, A and B mean moieties bonded to the left terminal group and the right terminal group in Formulae (1) to (4), respectively. Among the following structures, from the viewpoint of simplicity of synthesis, (Y-2) or (Y-13) is more preferable.

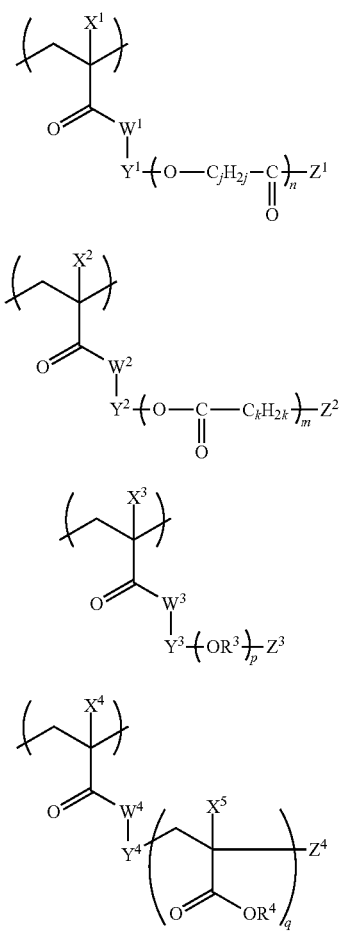

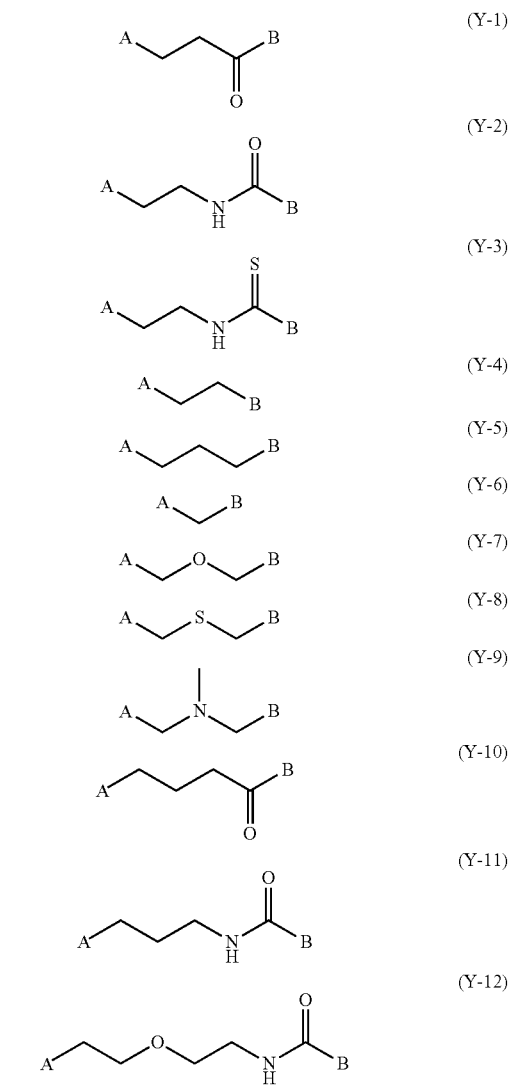

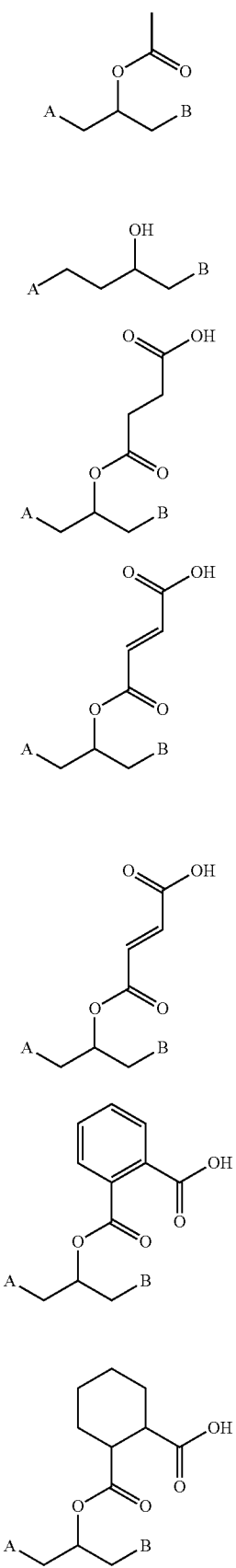

(Y-13)
(Y-14)
(Y-15)
(Y-16)
(Y-17)
(Y-18)
(Y-19)

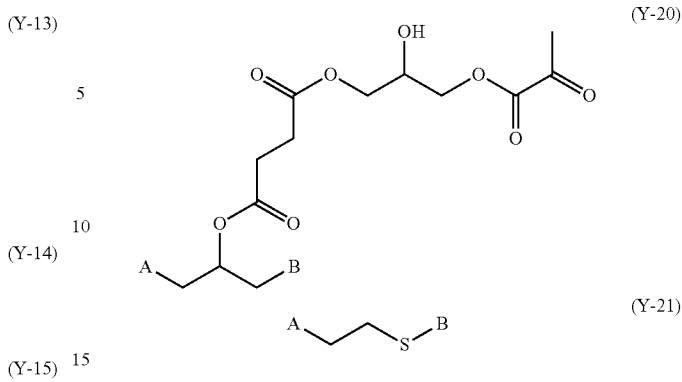

(Y-20)
(Y-21)

In Formulae (1) to (4), $Z^1$, $Z^2$, $Z^3$, and $Z^4$ each independently represent a monovalent organic group. The structure of the organic group is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among them, particularly from the viewpoint of improvement in the dispersibility, the organic groups represented by $Z^1$, $Z^2$, $Z^3$, and $Z^4$ are each preferably a group exhibiting a steric repulsion effect, and more preferably each independently an alkyl group or alkoxy group having 5 to 24 carbon atoms, and, among them, in particular, still more preferably each independently a branched alkyl group having 5 to 24 carbon atoms, a cyclic alkyl group having 5 to 24 carbon atoms, or an alkoxy group having 5 to 24 carbon atoms. Furthermore, the alkyl group included in the alkoxy group may be any of linear, branched, or cyclic.

In Formulae (1) to (4), n, m, p, and q are each independently an integer of 1 to 500.

In addition, in Formulae (1) and (2), j and k each independently represent an integer of 2 to 8. From the viewpoints of the viscosity stability over time and developability of the composition, j and k in Formulae (1) and (2) are each preferably an integer of 4 to 6 and more preferably 5.

In Formulae (1) and (2), n and m are each preferably an integer of 10 or more and more preferably an integer of 20 or more. Moreover, in a case where the dispersant has a polycaprolactone structure and a polyvalerolactone structure, the sum of the repetition number of the polycaprolactone structure and the repetition number of the polyvalerolactone structure is preferably an integer 10 of more and more preferably an integer of 20 or more.

In Formula (3), $R^3$ represents a branched or linear alkylene group, and is preferably an alkylene group having 1 to 10 carbon atoms and more preferably an alkylene group having 2 or 3 carbon atoms. In a case where p is 2 to 500, a plurality of $R^3$'s may be the same as or different from each other.

In Formula (4), $R^4$ represents a hydrogen atom or a monovalent organic group, and the monovalent organic group has no particular limitation on a structure. As $R^4$, a hydrogen atom, an alkyl group, an aryl group, or a heteroaryl group is preferable, and a hydrogen atom or an alkyl group is more preferable. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is still more preferable. In a case where q in Formula (4) is 2 to 500, a plurality of $X^5$'s and a plurality of $R^4$'s in the graft copolymer may be respectively the same as or different from each other.

In addition, the polymer compound may have a structural unit which includes two or more different structures and includes a graft chain. That is, the structural units which are represented by Formulae (1) to (4) and have structures different from one another may be included in a molecule of the polymer compound, and in a case where n, m, p, and q in Formulae (1) to (4) each represent an integer equal to or greater than 2, in Formulae (1) and (2), structures in which j and k are different from each other may be included in the side chain, and in Formulae (3) and (4), a plurality of $R^3$'s, a plurality of $R^4$'s, and a plurality of $X^5$'s in the molecule may be respectively the same as or different from each other.

From the viewpoints of the viscosity stability over time and developability of the composition, the structural unit represented by Formula (1) is more preferably a structural unit represented by Formula (1A).

Furthermore, from the viewpoints of the viscosity stability over time and developability of the composition, the structural unit represented by Formula (2) is more preferably a structural unit represented by Formula (2A).

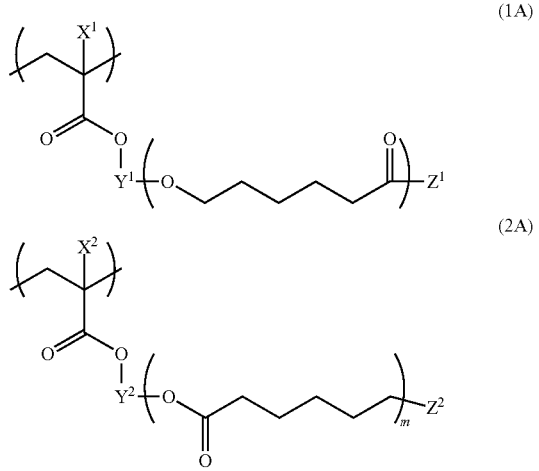

(1A)

(2A)

$X^1$, $Y^1$, $Z^1$, and n in Formula (1A) have the same definitions as $X^1$, $Y^1$, $Z^1$, and n in Formula (1), and preferred ranges thereof are also the same. $X^2$, $Y^2$, $Z^2$, and m in Formula (2A) have the same definitions as $X^2$, $Y^2$, $Z^2$, and m in Formula (2), and preferred ranges thereof are also the same.

In addition, from the viewpoints of the viscosity stability over time and developability of the composition, the structural unit represented by Formula (3) is more preferably a structural unit represented by Formula (3A) or (3B).

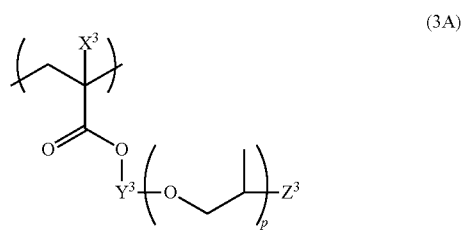

(3A)

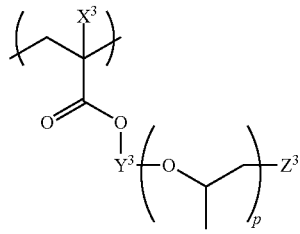

(3B)

$X^3$, $Y^3$, $Z^3$, and p in Formula (3A) or (3B) have the same definitions as $X^3$, $Y^3$, $Z^3$, and p in Formula (3), and preferred ranges thereof are also the same.

The polymer compound more preferably has, as a structural unit including a graft chain, the structural unit represented by Formula (1A).

The content of the structural unit (for example, the structural units represented by Formulae (1) to (4)) including a graft chain in the polymer compound is preferably within a range of 2% to 90% by mass and more preferably within a range of 5% to 30% by mass, in terms of mass with respect to the total mass of the polymer compound. In a case where the structural unit including a graft chain is within the above-described range, the dispersibility of the pigment is high and the developability of the cured film after exposure is good.

Hydrophobic Structural Unit

The polymer compound preferably includes a hydrophobic structural unit which is different from the structural unit including a graft chain (that is, the structural unit does not correspond to the structural unit including a graft chain). Here, in the present specification, the hydrophobic structural unit is a structural unit which does not have an acid group (for example, a carboxylic acid group, a sulfonic acid group, a phosphoric acid group, a phenolic hydroxyl group, or the like).

As the hydrophobic structural unit, a structural unit derived from (corresponding to) a compound (monomer) having a C log P value of 1.2 or more is preferable, and a structural unit derived from a compound having a C log P value of 1.2 to 8 is more preferable. By doing so, the effects of the present invention can be more reliably exhibited.

The C log P value is a value calculated by a program "C LOG P" available from Daylight Chemical Information System, Inc. This program provides a value of "calculated log P" calculated by the fragment approach (see the following documents) of Hansch and Leo. The fragment approach is based on a chemical structure of a compound, and the log P value of the compound is estimated by dividing the chemical structure into partial structures (fragments) and summing up degrees of contribution to log P which are assigned to the fragments. Details of the method are described in the following documents. In the present specification, a C log P value calculated by a program C LOG P v4.82 is used.

A. J. Leo, Comprehensive Medicinal Chemistry, Vol. 4, C. Hansch, P. G. Sammnens, J. B. Taylor and C. A. Ramsden, Eds., p. 295, Pergamon Press, 1990, C. Hansch & A. J. Leo. SUbstituent Constants For Correlation Analysis in Chemistry and Biology. John Wiley & Sons. A. J. Leo. Calculating log Poct from structure. Chem. Rev., 93, 1281 to 1306, 1993.

The log P refers to a common logarithm of a partition coefficient P, is a physical property value that shows how a certain organic compound is partitioned in an equilibrium of a two-phase system consisting of oil (generally, 1-octanol)

and water by using a quantitative numerical value, and is expressed by the following expression.

log $P$=log(Coil/Cwater)

In the expression, Coil represents a molar concentration of a compound in an oil phase, and Cwater represents a molar concentration of the compound in a water phase.

The greater the positive log P value based on 0, the higher the oil solubility, and the greater the absolute value of negative log P, the higher the water solubility. Accordingly, the value of log P has a negative correlation with the water solubility of an organic compound and is widely used as a parameter for estimating the hydrophilicity and hydrophobicity of an organic compound.

The polymer compound preferably includes, as the hydrophobic structural unit, one or more structural units selected from structural units derived from monomers represented by Formulae (i) to (iii).

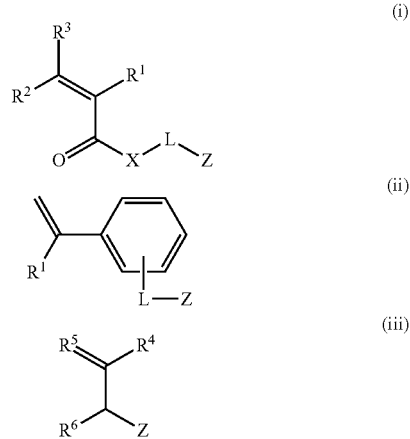

In Formulae (i) to (iii), $R^1$, $R^2$, and $R^3$ each independently represent a hydrogen atom, a halogen atom (for example, a fluorine atom, a chlorine atom, a bromine atom, or the like), or an alkyl group (for example, a methyl group, an ethyl group, a propyl group, or the like) having 1 to 6 carbon atoms.

$R^1$, $R^2$, and $R^3$ are each preferably a hydrogen atom or an alkyl group having 1 to 3 carbon atoms, and more preferably a hydrogen atom or a methyl group. $R^2$ and $R^3$ are each still more preferably a hydrogen atom.

X represents an oxygen atom (—O—) or an imino group (—NH—), and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), a divalent heterocyclic group, an oxygen atom (—O—), a sulfur atom (—S—), an imino group (—NH—), a substituted imino group (—NR$^{31}$—, where R$^{31}$ is an aliphatic group, an aromatic group, or a heterocyclic group), a carbonyl group (—CO—), and a combination thereof.

The divalent aliphatic group may have a cyclic structure or a branched structure. The number of carbon atoms in the aliphatic group is preferably 1 to 20, more preferably 1 to 15, and still more preferably 1 to 10. The aliphatic group may be an unsaturated aliphatic group or a saturated aliphatic group, but is preferably a saturated aliphatic group. In addition, the aliphatic group may have a substituent. Examples of the substituent include a halogen atom, an aromatic group, and a heterocyclic group.

The number of carbon atoms in the divalent aromatic group is preferably 6 to 20, more preferably 6 to 15, and still more preferably 6 to 10. In addition, the aromatic group may have a substituent. Examples of the substituent include a halogen atom, an aliphatic group, an aromatic group, and a heterocyclic group.

The divalent heterocyclic group preferably includes a 5-membered ring or a 6-membered ring as a heterocyclic ring. The heterocyclic ring may be fused with another heterocyclic ring, an aliphatic ring, or an aromatic ring. In addition, the heterocyclic group may have a substituent. Examples of the substituent include a halogen atom, a hydroxyl group, an oxo group (=O), a thioxo group (=S), an imino group (=NH), a substituted imino group (=N—R$^{32}$, where R$^{32}$ is an aliphatic group, an aromatic group, or a heterocyclic group), an aliphatic group, an aromatic group, and a heterocyclic group.

L is preferably a single bond, an alkylene group, or a divalent linking group having an oxyalkylene structure. The oxyalkylene structure is more preferably an oxyethylene structure or an oxypropylene structure. Moreover, L may have a polyoxyalkylene structure which includes two or more repeating oxyalkylene structures. As the polyoxyalkylene structure, a polyoxyethylene structure or a polyoxypropylene structure is preferable. The polyoxyethylene structure is represented by —(OCH$_2$CH$_2$)$_n$—, and n is preferably an integer of 2 or more and more preferably an integer of 2 to 10.

Examples of Z include an aliphatic group (for example, an alkyl group, a substituted alkyl group, an unsaturated alkyl group, or a substituted unsaturated alkyl group), an aromatic group (for example, an aryl group, a substituted aryl group, an arylene group, or a substituted arylene group), a heterocyclic group, and a combination thereof. These groups may contain an oxygen atom (—O—), a sulfur atom (—S—), an imino group (—NH—), a substituted imino group (—NR$^{31}$—, where R$^{31}$ is an aliphatic group, an aromatic group, or a heterocyclic group), or a carbonyl group (—CO—).

The aliphatic group may have a cyclic structure or a branched structure. The number of carbon atoms in the aliphatic group is preferably 1 to 20, more preferably 1 to 15, and still more preferably 1 to 10. The aliphatic group further contains a ring-aggregated hydrocarbon group or a crosslinked cyclic hydrocarbon group, and examples of the ring-aggregated hydrocarbon group include a bicyclohexyl group, a perhydronaphthalenyl group, a biphenyl group, and a 4-cyclohexylphenyl group. Examples of a crosslinked cyclic hydrocarbon ring include a bicyclic hydrocarbon ring such as pinane, bornane, norpinane, norbornane, and bicyclooctane rings (a bicyclo[2.2.2]octane ring, a bicyclo[3.2.1]octane ring, or the like); a tricyclic hydrocarbon ring such as homobredane, adamantane, tricyclo[5.2.1.0$^{2,6}$]decane, and tricyclo[4.3.1.1$^{2,5}$]undecane rings; and a tetracyclic hydrocarbon ring such as tetracyclo[4.4.0.1$^{2,5}$.1$^{7,10}$]dodecane and perhydro-1,4-methano-5,8-methanonaphthalene rings. In addition, the crosslinked cyclic hydrocarbon ring also includes a fused cyclic hydrocarbon ring, for example, a fused ring in which a plurality of 5- to 8-membered cycloalkane rings, such as perhydronaphthalene (decalin), perhydroanthracene, perhydrophenanthrene, perhydroacenaphthene, perhydrofluorene, perhydroindene, and perhydrophenalene rings, are fused.

As the aliphatic group, a saturated aliphatic group is preferable to an unsaturated aliphatic group. In addition, the aliphatic group may have a substituent. Examples of the substituent include a halogen atom, an aromatic group, and a heterocyclic group. Here, the aliphatic group does not have an acid group as a substituent.

The number of carbon atoms in the aromatic group is preferably 6 to 20, more preferably 6 to 15, and still more preferably 6 to 10. In addition, the aromatic group may have a substituent. Examples of the substituent include a halogen atom, an aliphatic group, an aromatic group, and a heterocyclic group. Here, the aromatic group does not have an acid group as a substituent.

The heterocyclic group preferably includes a 5-membered ring or a 6-membered ring as a heterocyclic ring. The heterocyclic ring may be fused with another heterocyclic ring, an aliphatic ring, or an aromatic ring. In addition, the heterocyclic group may have a substituent. Examples of the substituent include a halogen atom, a hydroxyl group, an oxo group (=O), a thioxo group (=S), an imino group (=NH), a substituted imino group (=N—$R^{32}$, where $R^{32}$ is an aliphatic group, an aromatic group, or a heterocyclic group), an aliphatic group, an aromatic group, and a heterocyclic group. Here, the heterocyclic group does not have an acid group as a substituent.

In Formula (iii), $R^4$, $R^5$, and $R^6$ each independently represent a hydrogen atom, a halogen atom (for example, a fluorine atom, a chlorine atom, a bromine atom, or the like), an alkyl group (for example, a methyl group, an ethyl group, a propyl group, or the like) having 1 to 6 carbon atoms, Z, or L-Z. Herein, L and Z have the same definitions as the groups described above. $R^4$, $R^5$, and $R^6$ are each preferably a hydrogen atom or an alkyl group having 1 to 3 carbon atoms, and more preferably a hydrogen atom.

The monomer represented by Formula (i) is preferably a compound in which $R^1$, $R^2$, and $R^3$ are each a hydrogen atom or a methyl group, L is a single bond, an alkylene group, or a divalent linking group having an oxyalkylene structure, X is an oxygen atom or an imino group, and Z is an aliphatic group, a heterocyclic group, or an aromatic group.

The monomer represented by Formula (ii) is preferably a compound in which $R^1$ is a hydrogen atom or a methyl group, L is an alkylene group, and Z is an aliphatic group, a heterocyclic group, or an aromatic group. Moreover, the monomer represented by Formula (iii) is preferably a compound in which $R^4$, $R^5$, and $R^6$ are each a hydrogen atom or a methyl group, and Z is an aliphatic group, a heterocyclic group, or an aromatic group.

Examples of typical compounds represented by Formulae (i) to (iii) include radically polymerizable compounds selected from acrylic acid esters, methacrylic acid esters, and styrenes.

Furthermore, regarding the examples of the typical compounds represented by Formulae (i) to (iii), reference can be made to the compounds described in paragraphs 0089 to 0093 of JP2013-249417A, the contents of which are incorporated into the present specification.

The content of the hydrophobic structural unit in the polymer compound is preferably within a range of 10% to 90% and more preferably within a range of 20% to 80%, in terms of mass with respect to the total mass of the polymer compound. In a case where the content is within the above-described range, sufficient pattern formation can be obtained.

Functional Group Capable of Forming Interaction with Pigment or the Like

A functional group capable of forming interaction with the pigment or the like (for example, a light shielding pigment) can be introduced into the polymer compound. Herein, it is preferable that the polymer compound further has a structural unit including a functional group capable of forming interaction with the pigment or the like.

Examples of the functional group capable of forming interaction with the pigment or the like include an acid group, a basic group, a coordinating group, and a reactive functional group.

In a case where the polymer compound includes an acid group, a basic group, a coordinating group, or a reactive functional group, it is preferable that the polymer compound has a structural unit including an acid group, a structural unit including a basic group, a structural unit including a coordinating group, or a structural unit including a reactive functional group.

In particular, in a case where the polymer compound further contains, as an acid group, an alkali-soluble group such as a carboxylic acid group, developability for pattern formation by alkali development can be imparted to the polymer compound.

That is, in a case where an alkali-soluble group is introduced into the polymer compound, in the composition, the polymer compound as a dispersant making a contribution to the dispersion of the pigment or the like has alkali solubility. The composition including such a polymer compound is excellent in light shielding properties of a cured film formed by exposure, and improves alkali developability of a non-exposed portion.

Furthermore, in a case where the polymer compound has a structural unit including an acid group, the polymer compound is easily compatible with the solvent, and coating properties also tend to be improved.

It is presumed that this is because the acid group in the structural unit including an acid group easily interacts with the pigment or the like, the polymer compound stably disperses the pigment or the like, the viscosity of the polymer compound dispersing the pigment or the like is reduced, and thus the polymer compound is also easily dispersed in a stable manner.

Here, the structural unit including an alkali-soluble group as an acid group may be the same as or different from the structural unit including a graft chain, but the structural unit including an alkali-soluble group as an acid group is a structural unit different from the hydrophobic structural unit (that is, the structural unit does not correspond to the hydrophobic structural unit).

Examples of the acid group, which is the functional group capable of forming interaction with the pigment or the like, include a carboxylic acid group, a sulfonic acid group, a phosphoric acid group, and a phenolic hydroxyl group, and one or more kinds of the group consisting of a carboxylic acid group, a sulfonic acid group, and a phosphoric acid group is preferable, and a carboxylic acid group is more preferable. The carboxylic acid group has favorable adsorptive power to the pigment or the like and high dispersibility.

That is, it is preferable that the polymer compound further has a structural unit including one or more kinds of the group consisting of a carboxylic acid group, a sulfonic acid group, and a phosphoric acid group.

The polymer compound may have one or more of the structural units including an acid group.

The polymer compound may or may not include the structural unit including an acid group, but in a case where the polymer compound includes the structural unit including an acid group, the content thereof, in terms of mass with respect to the total mass of the polymer compound is preferably 5% to 80% by mass, and more preferably 10% to 60% by mass from the viewpoint of suppressing damage of the image intensity by alkali development.

Examples of the basic group, which is the functional group capable of forming interaction with the pigment or the like, include a primary amino group, a secondary amino group, a tertiary amino group, a hetero ring including a N atom, and an amide group, and a preferred basic group is a tertiary amino group from the viewpoints of favorable adsorptive power to the pigment or the like and high dispersibility. The polymer compound may contain one or more of these basic groups.

The polymer compound may or may not include the structural unit including a basic group, but in a case where the polymer compound includes the structural unit including a basic group, the content thereof, in terms of mass with respect to the total mass of the polymer compound is preferably 0.01% to 50% by mass, and more preferably 0.01% to 30% by mass from the viewpoint of suppressing developability inhibition.

Examples of the coordinating group and the reactive functional group which are the functional groups capable of forming interaction with the pigment or the like include an acetyl acetoxy group, a trialkoxysilyl group, an isocyanate group, an acid anhydride, and an acid chloride. A preferred functional group is an acetyl acetoxy group from the viewpoints of favorable adsorptive power to the pigment or the like and high dispersibility of the pigment or the like. The polymer compound may have one or more of these groups.

The polymer compound may or may not include the structural unit including a coordinating group or the structural unit including a reactive functional group, but in a case where the polymer compound includes the structural unit including a coordinating group or the structural unit including a reactive functional group, the content thereof, in terms of mass with respect to the total mass of the polymer compound is preferably 10% to 80% by mass, and more preferably 20% to 60% by mass from the viewpoint of suppressing developability inhibition.

In a case where the polymer compound includes, other than the graft chain, the functional group capable of forming interaction with the pigment or the like, the functional groups capable of forming interaction with various pigments or the like may be contained, the way these functional groups are introduced is not particularly limited, but it is preferable that the polymer compound contains one or more structural units selected from structural units derived from monomers represented by Formulae (iv) to (vi).

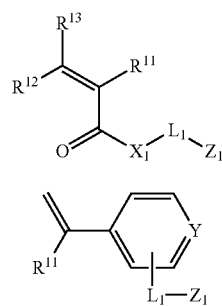

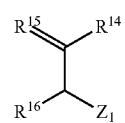

In Formulae (iv) to (vi), $R^{11}$, $R^{12}$, and $R^{13}$ each independently represent a hydrogen atom, a halogen atom (for example, a fluorine atom, a chlorine atom, a bromine atom, or the like), or an alkyl group (for example, a methyl group, an ethyl group, a propyl group, or the like) having 1 to 6 carbon atoms.

In Formulae (iv) to (vi), $R^{11}$, $R^{12}$, and $R^{13}$ are preferably each independently a hydrogen atom or an alkyl group having 1 to 3 carbon atoms, and more preferably each independently a hydrogen atom or a methyl group. In Formula (iv), $R^{12}$ and $R^{13}$ are each still more preferably a hydrogen atom.

In Formula (iv), $X_1$ represents an oxygen atom (—O—) or an imino group (—NH—), and is preferably an oxygen atom.

In addition, in Formula (v), Y represents a methine group or a nitrogen atom.

In addition, in Formulae (iv) and (v), $L_1$ represents a single bond or a divalent linking group. The divalent linking group has the same definition as the divalent linking group represented by L in Formula (i).

$L_1$ is preferably a single bond, an alkylene group, or a divalent linking group having an oxyalkylene structure. The oxyalkylene structure is more preferably an oxyethylene structure or an oxypropylene structure. Moreover, $L_1$ may have a polyoxyalkylene structure which includes two or more repeating oxyalkylene structures. As the polyoxyalkylene structure, a polyoxyethylene structure or a polyoxypropylene structure is preferable. The polyoxyethylene structure is represented by —(OCH$_2$CH$_2$)$_n$—, and n is preferably an integer of 2 or more and more preferably an integer of 2 to 10.

In Formulae (iv) to (vi), $Z_1$ represents a functional group capable of forming interaction with the pigment or the like other than a graft chain, and is preferably a carboxylic acid group and a tertiary amino group and more preferably a carboxylic acid group.

In Formula (vi), $R^{14}$, $R^{15}$, and $R^{16}$ each independently represent a hydrogen atom, a halogen atom (for example, a fluorine atom, a chlorine atom, a bromine atom, or the like), an alkyl group (for example, a methyl group, an ethyl group, a propyl group, or the like) having 1 to 6 carbon atoms, —$Z_1$, or $L_1$-$Z_1$. Herein, $L_1$ and $Z_1$ have the same definitions as $L_1$ and $Z_1$ described above, and preferred examples thereof are also the same. $R^{14}$, $R^{15}$, and $R^{16}$ are preferably each independently a hydrogen atom or an alkyl group having 1 to 3 carbon atoms, and more preferably each independently a hydrogen atom.

The monomer represented by Formula (iv) is preferably a compound in which $R^{11}$, $R^{12}$, and $R^{13}$ are each independently a hydrogen atom or a methyl group, $L_1$ is an alkylene group or a divalent linking group having an oxyalkylene structure, $X_1$ is an oxygen atom or an imino group, and $Z_1$ is a carboxylic acid group.

In addition, the monomer represented by Formula (v) is preferably a compound in which $R^{11}$ is a hydrogen atom or a methyl group, $L_1$ is an alkylene group, $Z_1$ is a carboxylic acid group, and Y is a methine group.

Furthermore, the monomer represented by Formula (vi) is preferably a compound in which $R^{14}$, $R^{15}$, and $R^{16}$ are each independently a hydrogen atom or a methyl group, and $Z_1$ is a carboxylic acid group.

Typical examples of the monomers (compounds) represented by Formulae (iv) to (vi) are shown below.

Examples of the monomers include methacrylic acid, crotonic acid, isocrotonic acid, a reaction product of a compound (for example, 2-hydroxyethyl methacrylate) including an addition polymerizable double bond and a hydroxyl group in a molecule with a succinic acid anhydride, a reaction product of a compound containing an addition polymerizable double bond and a hydroxyl group in a molecule with a phthalic acid anhydride, a reaction product of a compound containing an addition polymerizable double bond and a hydroxyl group in a molecule with a tetrahydroxyphthalic acid anhydride, a reaction product of a compound including an addition polymerizable double bond and a hydroxyl group in a molecule with trimellitic acid anhydride, a reaction product of a compound including an addition polymerizable double bond and a hydroxyl group in a molecule with a pyromellitic acid anhydride, acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

From the viewpoint of the interaction with the pigment or the like, the viscosity stability over time, and the permeability into a developer, the content of the structural unit including a functional group capable of forming interaction with the pigment or the like is preferably 0.05% to 90% by mass, more preferably 1.0% to 80% by mass, and still more preferably 10% to 70% by mass with respect to the total mass of the polymer compound.

Other Structural Units

In addition, for the purpose of improving various performances such as image intensity, as long as the effects of the present invention are not impaired, the polymer compound may further have other structural units (for example, a structural unit including a functional group or the like having an affinity with the solvent which will be described later) which have various functions and are different from the structural unit including a graft chain, the hydrophobic structural unit, and the structural unit including a functional group capable of forming interaction with the pigment or the like.

Examples of such other structural units include structural units derived from radically polymerizable compounds selected from acrylonitriles and methacrylonitriles.

The polymer compound may use one or more of these other structural units, and the content thereof is preferably 0% to 80% by mass and more preferably 10% to 60% by mass, in terms of mass with respect to the total mass of the polymer compound. In a case where the content is within the above-described range, sufficient pattern formability is maintained.

Physical Properties of Polymer Compound

An acid value of the polymer compound is preferably 0 to 250 mgKOH/g, more preferably 10 to 200 mgKOH/g, and still more preferably 30 to 180 mgKOH/g.

In a case where the acid value of the polymer compound is 160 mgKOH/g or less, pattern peeling during development of the cured film after exposure is more effectively suppressed. In addition, in a case where the acid value of the polymer compound is 10 mgKOH/g or more, the alkali developability is improved. Furthermore, in a case where the acid value of the polymer compound is 20 mgKOH/g or more, the precipitation of the pigment or the like can be further suppressed, the number of coarse particles can be further reduced, and the viscosity stability of the composition over time can be further improved.

In the present specification, the acid value can be calculated, for example, from the average content of acid groups in the compound. Moreover, a resin having a desired acid value can be obtained by changing the content of the structural unit including an acid group, which is a constituent component of the resin.

A weight-average molecular weight of the polymer compound is preferably 4,000 to 300,000, more preferably 5,000 to 200,000, still more preferably 6,000 to 100,000, and particularly preferably 10,000 to 50,000.

The polymer compound can be synthesized based on known methods.

Specific examples of the polymer compound include "DA-7301" manufactured by Kusumoto Chemicals, Ltd., "Disperbyk-101 (polyamidoamine phosphate), 107 (carboxylic acid ester), 110 (copolymer including an acid group), 111 (phosphoric acid-based dispersant), 130 (polyamide), 161, 162, 163, 164, 165, 166, 167, 170, and 190 (polymeric copolymer)" and "BYK-P104 and P105 (high-molecular-weight unsaturated polycarboxylic acid)" manufactured by BYK-Chemie GmbH, "EFKA 4047, 4050 to 4010 to 4165 (based on polyurethane), EFKA 4330 to 4340 (block copolymer), 4400 to 4402 (modified polyacrylate), 5010 (polyester amide), 5765 (high-molecular-weight polycarboxylate), 6220 (fatty acid polyester), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E and No. 300 (acrylic copolymer)" manufactured by KYOEISHA CHEMICAL Co., LTD., "DISPARLON KS-860, 873SN, 874, #2150 (aliphatic polyvalent carboxylic acid), #7004 (polyether ester), DA-703-50, DA-705, and DA-725" manufactured by Kusumoto Chemicals, Ltd., "DEMOL RN, N (naphthalenesulfonic acid-formalin polycondensate), MS, C, and SN-B (aromatic sulfonic acid-formalin polycondensate)", "HOMOGENOL L-18 (polymeric polycarboxylic acid)", "EMULGEN 920, 930, 935, and 985 (polyoxyethylene nonylphenyl ether)", and "ACETAMIN 86 (stearylamine acetate)" manufactured by Kao Corporation, "22000 (azo pigment derivative), 13240 (polyester amine), 3000, 12000, 17000, 20000, 27000 (polymer including a functional portion on a terminal portion), 24000, 28000, 32000, and 38500 (graft copolymer)" manufactured by Lubrizol Japan Limited, "NIKKOL T106 (polyoxyethylene sorbitan monooleate), and MYS-IEX (polyoxyethylene monostearate)" manufactured by Nikko Chemicals Co., Ltd., HINO-ACT T-8000E and the like manufactured by Kawaken Fine Chemicals Co., Ltd., an organosiloxane polymer KP341 manufactured by Shin-Etsu Chemical Co., Ltd., "W001: cationic surfactant", nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and a sorbitan fatty acid ester, and anionic surfactants such as "W004, W005, and W017" manufactured by Yusho Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA & CO., LTD., polymer dispersants such as "DISPERSE AID 6, DISPERSE AID 8, DISPERSE AID 15, and DISPERSE AID 9100" manufactured by SAN NOPCO LIMITED, "ADEKA PLURONIC (registered trademark) L31, F38, L42, L44, L61, L64, F68, L72, P95, F77, P84, F87, P94, L101, P103, F108, L121, and P-123" manufactured by ADEKA CORPORATION, and "IONET (product name) S-20" manufactured by Sanyo Chemical Industries, Ltd. In addition, ACRYBASE FFS-6752 and ACRYBASE FFS-187 can also be used.

In addition, it is also preferable that an amphoteric resin including an acid group and a basic group is used. The amphoteric resin is preferably a resin having an acid value of 5 mgKOH/g or more and an amine value of 5 mgKOH/g or more.

Examples of a commercial product of the amphoteric resin include DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 manufactured by BYK-Chemie GmbH, and AJISPER PB821, AJISPER PB822, and AJISPER PB881 manufactured by Ajinomoto Fine-Techno Co., Inc.

These polymer compounds may be used alone or in combination of two or more thereof.

Furthermore, regarding specific examples of the polymer compound, reference can be made to the polymer compound described in paragraphs 0127 to 0129 of JP2013-249417A, the contents of which are incorporated into the present specification.

In addition, as the dispersant, in addition to the above-described polymer compounds, the graft copolymer described in paragraphs 0037 to 0115 of JP2010-106268A (corresponding to paragraphs 0075 to 0133 of US2011/0124824A) can be used, the contents of which can be incorporated by reference into the present specification.

Moreover, in addition to the above-described dispersant, the polymer compound described in paragraphs 0028 to 0084 of JP2011-153283A (corresponding to paragraphs 0075 to 0133 of US2011/0279759A) which includes a constituent component having a side chain structure formed by bonding of acid groups through a linking group can be used, the contents of which can be incorporated by reference into the present specification.

Furthermore, as the dispersant, the resin described in paragraphs 0033 to 0049 of JP2016-109763A can also be used, the contents of which are incorporated into the present specification.

In addition, as the dispersant, a resin having a repeating unit including a polyalkyleneimine structure and a polyester structure (hereinafter, also referred to as a "resin X1") can also be suitably used. It is preferable that the repeating unit including a polyalkyleneimine structure and a polyester structure includes the polyalkyleneimine structure in a main chain and includes the polyester structure as a graft chain.

The above-described polyalkyleneimine structure is a polymerization structure including two or more identical or different alkyleneimine chains Specific examples of the alkyleneimine chain include alkyleneimine chains represented by Formulae (4A) and (4B).

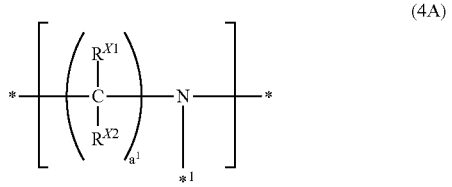

In Formula (4A), $R^{X1}$ and $R^{X2}$ each independently represent a hydrogen atom or an alkyl group. $a^1$ represents an integer of 2 or more. $*^1$ represents a bonding position with a polyester chain, an adjacent alkyleneimine chain, or with a hydrogen atom or a substituent.

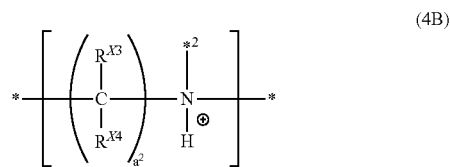

In Formula (4B), $R^{X3}$ and $R^{X4}$ each independently represent a hydrogen atom or an alkyl group. $a^2$ represents an integer of 2 or more. The alkyleneimine chain represented by Formula (4B) is bonded to a polyester chain having an anionic group by forming a salt-crosslinked group from $N^+$ specified in Formula (4B) and the anionic group included in the polyester chain.

* in Formula (4A) and Formula (4B) and $*^2$ in Formula (4B) each independently represent a position where an adjacent alkyleneimine chain, or a hydrogen atom or a substituent is bonded.

Among them, * in Formula (4A) and Formula (4B) preferably represents a position where an adjacent alkyleneimine chain is bonded.

$R^{X1}$ and $R^{X2}$ in Formula (4A) and $R^{X3}$ and $R^{X4}$ in Formula (4B) each independently represent a hydrogen atom or an alkyl group.

The number of carbon atoms in the alkyl group is preferably 1 to 6 and more preferably 1 to 3.

In Formula (4A), both $R^{X1}$ and $R^{X2}$ are preferably a hydrogen atom.

In Formula (4B), both $R^{X3}$ and $R^{X4}$ are preferably a hydrogen atom.

$a^1$ in Formula (4A) and $a^2$ in Formula (4B) are not particularly limited as long as they are an integer of 2 or more. The upper limit value thereof is preferably 10 or less, more preferably 6 or less, still more preferably 4 or less, even more preferably 2 or 3, and particularly preferably 2.

In Formula (4A) and Formula (4B), * represents a bonding position with an adjacent alkyleneimine chain or with a hydrogen atom or a substituent.

Examples of the above-described substituent include an alkyl group (for example, an alkyl group having 1 to 6 carbon atoms), and a substituent such as an organic group represented by —CO—$R^T$. Examples of the $R^T$ include an alkyl group (for example, having 1 to 6 carbon atoms) or alkenyl group (for example, having 2 to 6 carbon atoms) which may be substituted with an acid group (for example, a carboxy group, a sulfo group, a phosphoric acid group, or the like).

In addition, in Formula (4A) and Formula (4B), a polyester chain may be bonded as a substituent at the bonding position represented by *.

The alkyleneimine chain represented by Formula (4A) is preferably linked to the polyester chain at the position of $*^1$ described above. Specifically, it is preferable that a carbonyl carbon in the polyester chain is bonded at the position of $*^1$ described above.

Examples of the above-described polyester chain include a polyester chain represented by Formula (5A).

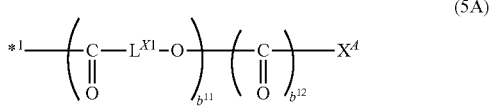

(5A)

In a case where the alkyleneimine chain is the alkyleneimine chain represented by Formula (4B), it is preferable that the polyester chain includes an anionic group (preferably, oxygen anion $O^-$), and this anionic group and $N^+$ in Formula (4B) form a salt-crosslinked group.

Examples of such a polyester chain include a polyester chain represented by Formula (5B).

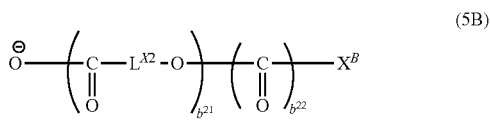

(5B)

$L^{X1}$ in Formula (5A) and $L^{X2}$ in Formula (5B) each independently represent a divalent linking group. Preferred examples of the divalent linking group include an alkylene group having 3 to 30 carbon atoms.

$b^{11}$ in Formula (5A) and $b^{21}$ in Formula (5B) each independently represent an integer of 2 or more, preferably an integer of 6 or more, and the upper limit thereof is, for example, 200 or less.

$b^{12}$ in Formula (5A) and $b^{22}$ in Formula (5B) each independently represent 0 or 1.

$X^A$ in Formula (5A) and $X^B$ in Formula (5B) each independently represent a hydrogen atom or a substituent. Examples of the substituent include an alkyl group, an alkoxy group, a polyalkyleneoxyalkyl group, and an aryl group.

Examples of the number of carbon atoms in the above-described alkyl group (which may be linear, branched, or cyclic) and an alkyl group included in the above-described alkoxy group (which may be linear, branched, or cyclic) include 1 to 30, and 1 to 10 are preferable. In addition, the above-described alkyl group may further have a substituent, and examples of the substituent include a hydroxyl group and a halogen atom (including a fluorine atom, a chlorine atom, a bromine atom, an iodine atom, and the like).

The polyalkyleneoxyalkyl group is a substituent represented by $R^{X6}(OR^{X7})_p(O)_q$—. $R^{X6}$ represents an alkyl group, $R^{X7}$ represents an alkylene group, p represents an integer of 2 or more, and q represents 0 or 1.

The alkyl group represented by $R^{X6}$ is synonymous with the alkyl group represented by $X^A$. In addition, examples of the alkylene group represented by $R^{X7}$ include a group obtained by removing one hydrogen atom from the alkyl group represented by $X^A$.

p is an integer of 2 or more, and the upper limit value thereof is, for example, 10 or less, preferably 5 or less.

Examples of the aryl group include an aryl group having 6 to 24 carbon atoms (which may be monocyclic or polycyclic).

The above-described aryl group may further have a substituent, and examples of the substituent include an alkyl group, a halogen atom, and a cyano group.

The above-described polyester chain preferably has a decyclized structure of a lactone such as ε-caprolactone, δ-caprolactone, β-propiolactone, γ-butyrolactone, δ-valerolactone, γ-valerolactone, enantholactone, β-butyrolactone, γ-hexanolactone, γ-octanolactone, δ-hexanolactone, δ-octanolactone, δ-dodecanolactone, α-methyl-γ-butyrolactone, and lactide (which may be an L-form or a D-form), and more preferably has a decyclized structure of ε-caprolactone or δ-valerolactone.

The resin having a repeating unit including a polyalkyleneimine structure and a polyester structure can be synthesized according to the synthesis method described in JP5923557B.

As the resin having a repeating unit including a polyalkyleneimine structure and a polyester structure, reference can be made to a resin having a repeating unit including a polyalkyleneimine structure and a polyester structure, which is described in JP5923557B, the contents of which are incorporated into the present specification.

An acid value of the resin X1 is preferably 10 to 100 mgKOH/g and more preferably 20 to 80 mgKOH/g. An amine value of the resin X1 is preferably 5 mgKOH/g or more, more preferably 20 mgKOH/g or more, and still more preferably 30 mgKOH/g or more. The upper limit value thereof is preferably, for example, 100 mgKOH/g or less.

A weight-average molecular weight of the resin X1 is not particularly limited, but for example, 3,000 or more is preferable, 4,000 or more is more preferable, 5,000 or more is still more preferable, and 6,000 or more is particularly preferable. Moreover, the upper limit value thereof is, for example, preferably 300,000 or less, more preferably 200,000 or less, still more preferably 100,000 or less, and particularly preferably 50,000 or less.

Alkali-Soluble Resin

The composition preferably includes an alkali-soluble resin. In the present specification, the alkali-soluble resin means a resin including a group (an alkali-soluble group, for example, an acid group such as a carboxylic acid group) which promotes alkali solubility, and a resin different from the dispersant described above.

A content of the alkali-soluble resin in the composition is not particularly limited, but is preferably 1% to 30% by mass, more preferably 2% to 20% by mass, and still more preferably 5% to 15% by mass with respect to the total solid content of the composition.

The alkali-soluble resin may be used singly or in combination of two or more thereof. In a case where two or more alkali-soluble resins are used in combination, the total content thereof is preferably within the above-described range.

As the alkali-soluble resin, a resin including at least one alkali-soluble group in a molecule is mentioned, and examples thereof include a polyhydroxystyrene resin, a polysiloxane resin, a (meth)acrylic resin, a (meth)acrylamide resin, a (meth)acryl/(meth)acrylamide copolymer resin, an epoxy-based resin, and a polyimide resin.

Specific examples of the alkali-soluble resin include a copolymer of an unsaturated carboxylic acid and an ethylenically unsaturated compound.

The unsaturated carboxylic acid is not particularly limited, but examples thereof include monocarboxylic acids such as (meth)acrylic acid, crotonic acid, and vinyl acetate; dicarboxylic acid such as itaconic acid, maleic acid, and fumaric acid or an acid anhydride thereof; and polyvalent carboxylic acid monoesters such as mono(2-(meth)acryloyloxyethyl)phthalate.

Examples of a copolymerizable ethylenically unsaturated compound include methyl (meth)acrylate. Moreover, the compounds described in paragraph 0027 of JP2010-097210A and paragraphs 0036 and 0037 of JP2015-

068893A can also be used, the contents of which are incorporated into the present specification.

As the alkali-soluble resin, from the viewpoint that the effects of the present invention are more excellent, an alkali-soluble resin including a curable group is also preferable.

As the curable group, the curable groups which may be included in the above-described polymer compound are also mentioned, and preferred ranges thereof are also the same.

Examples of an aspect of the alkali-soluble resin including a curable group include an acrylic resin including an ethylenically unsaturated group in a side chain. An acrylic resin including an ethylenically unsaturated group in a side chain can be obtained, for example, by addition-reacting a carboxylic acid group of an acrylic resin including the carboxylic acid group with an ethylenically unsaturated compound including a glycidyl group or an alicyclic epoxy group.

The alkali-soluble resin including a curable group is preferably an alkali-soluble resin having a curable group in the side chain, or the like. Examples of the alkali-soluble resin including a curable group include DIANAL NR series (manufactured by Mitsubishi Rayon Co., Ltd.), Photomer 6173 (COOH-containing polyurethane acrylic oligomer, manufactured by Diamond Shamrock Co., Ltd.), VISCOAT R-264 and KS resist 106 (all manufactured by OSAKA ORGANIC CHEMICAL INDUSTRY LTD.), CYCLOMER P series (for example, ACA230AA) and PLACCEL CF200 series (all manufactured by DAICEL CORPORATION), Ebecryl 3800 (manufactured by DAICEL-ALLNEX LTD.), and ACRYCURE RD-F8 (manufactured by NIPPON SHOKUBAI CO., LTD.).

As the alkali-soluble resin, for example, the radical polymers which include a carboxylic acid group in a side chain and are described in JP1984-044615A (JP-S59-044615A), JP1979-34327B (JP-S54-34327B), JP1983-012577B (JP-S58-012577B), JP1979-025957B (JP-S54-025957B), JP1979-092723A (JP-554-092723A), JP1984-053836A (JP-559-053836A), and JP1984-071048A (JP-559-071048A); the acetal-modified polyvinyl alcohol-based binder resins which include an alkali-soluble group and are described in EP993966B, EP1204000B, and JP2001-318463A; polyvinyl pyrrolidone; polyethylene oxide; polyether or the like which is a reaction product of alcohol-soluble nylon, 2,2-bis-(4-hydroxyphenyl)-propane, and epichlorohydrin; the polyimide resin described in WO2008/123097A; and the like can be used.

As the alkali-soluble resin, for example, the compound described in paragraphs 0225 to 0245 of JP2016-075845A can also be used, the contents of which are incorporated into the present specification.

As the alkali-soluble resin, a polyimide precursor can also be used. The polyimide precursor means a resin obtained by causing an addition polymerization reaction between a compound including an acid anhydride group and a diamine compound at a temperature of 40° C. to 100° C.

Examples of the polyimide precursor include a resin having a repeating unit represented by Formula (1). Examples of the structure of the polyimide precursor include polyimide precursors including an amic acid structure represented by Formula (2), and imide structures represented by Formula (3) obtained in a case where imide ring closure occurs in a portion of an amic acid structure and Formula (4) obtained in a case where imide ring closure occurs in the entirety of an amic acid structure.

Furthermore, in the present specification, the polyimide precursor having an amic acid structure is referred to as polyamic acid in some cases.

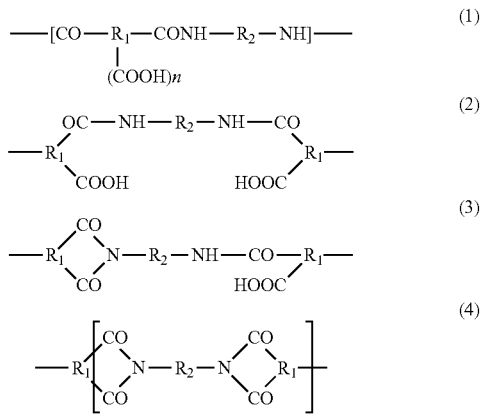

In Formulae (1) to (4), $R_1$ represents a tetravalent organic group having 2 to 22 carbon atoms, $R_2$ represents a divalent organic group having 1 to 22 carbon atoms, and n represents 1 or 2.

Specific examples of the polyimide precursor include the compound described in paragraphs 0011 to 0031 of JP2008-106250A, the compound described in paragraphs 0022 to 0039 of JP2016-122101A, and the compound described in paragraphs 0061 to 0092 of JP2016-068401A, the contents of which are incorporated into the present specification.

From the viewpoint that a pattern shape of the cured film formed by exposure is more excellent, the alkali-soluble resin preferably includes one or more kinds selected from the group consisting of a polyimide resin and a polyimide precursor.

The polyimide resin including an alkali-soluble group is not particularly limited, and known polyimide resins including an alkali-soluble group can be used. Examples of the polyimide resin include the resin described in paragraph 0050 of JP2014-137523A, the resin described in paragraph 0058 of JP2015-187676A, and the resin described in paragraphs 0012 and 0013 of JP2014-106326A, the contents of which are incorporated into the present specification.

Solvent

The composition according to the embodiment of the present invention includes a solvent.

Examples of the solvent include water and an organic solvent.

The above-described solvent includes a solvent A having a boiling point of 180° C. or higher, a solvent B having a boiling point of 140° C. or higher and lower than 180° C., and a solvent C having a boiling point of 100° C. or higher and lower than 140° C.

In the present specification, the "boiling point" means a boiling point under 1 atm (760 mmHg).

Solvent A

A boiling point of the solvent A is not particularly limited as long as it is 180° C. or higher. The upper limit value thereof is preferably lower than 235° C.

From the viewpoint that the effects of the present invention are more excellent, the boiling point of the solvent A is preferably 185° C. to 220° C. and more preferably 189° C. to 215° C.

A solubility parameter of the solvent A is not particularly limited, and for example, 9.0 $(cal/cm^3)^{1/2}$ or more is preferable, and from the viewpoint that the effects of the present invention are more excellent, 11.0 $(cal/cm^3)^{1/2}$ or more is more preferable and 12.0 $(cal/cm^3)^{1/2}$ or more is still more preferable. Moreover, the upper limit value thereof is, for example, preferably 20.0 $(cal/cm^3)^{1/2}$ or less, more preferably 17.0 $(cal/cm^3)^{1/2}$ or less, still more preferably 14.0 $(cal/cm^3)^{1/2}$ or less, and particularly preferably 13.0 $(cal/cm^3)^{1/2}$ or less.

In the present specification, the "solubility parameter $(cal/cm^3)^{1/2}$" is described in Hansen, Charles (1967). The Three Dimensional Solubility Parameter and Solvent Diffusion Coefficient and Their Importance in Surface Coating Formulation. Copenhagen: Danish Technical Press, or is data obtained from known documents.

The main representative examples of the solvent A, and boiling points and solubility parameters thereof are shown below.

TABLE 1

| Example of solvent A/ solvent type | Boiling point (760 mmHg) [° C.] | Solubility parameter [$(cal/cm^3)^{1/2}$] |
| --- | --- | --- |
| n-Butyl lactate | 185 | 9.7 |
| Dimethyl sulfoxide | 189 | 12.9 |
| Diethylene glycol monoethyl ether | 202 | 11.0 |
| γ-Butyrolactone | 204 | 12.8 |
| Benzyl alcohol | 206 | 12.0 |
| 1,3-Butanediol | 208 | 14.1 |
| Dipropylene glycol | 232 | 15.5 |

In addition, examples of the solvent A other than the above also include diethylene glycol monomethyl ether (boiling point: 194° C.) and diethylene glycol diethyl ether (boiling point: 188° C.).

As the solvent A, from the viewpoint that the effects of the present invention are more excellent, one or more kinds selected from the group consisting of γ-butyrolactone, dimethyl sulfoxide, and benzyl alcohol are preferable.

Solvent B

A boiling point of the solvent B is not particularly limited as long as it is 140° C. or higher and lower than 180° C., but from the viewpoint that the effects of the present invention are more excellent, the boiling point is preferably 140° C. to 160° C. and more preferably 145° C. to 160° C.

A solubility parameter of the solvent B is not particularly limited, and for example, 8.0 $(cal/cm^3)^{1/2}$ or more is preferable, and from the viewpoint that the effects of the present invention are more excellent, 9.0 $(cal/cm^3)^{1/2}$ or more is more preferable. Moreover, the upper limit value thereof is, for example, preferably 11.0 $(cal/cm^3)^{1/2}$ or less and more preferably 10.5 $(cal/cm^3)^{1/2}$ or less.

The main representative examples of the solvent B, and boiling points and solubility parameters thereof are shown below.

TABLE 2

| Example of solvent B/ solvent type | Boiling point (760 mmHg) [° C.] | Solubility parameter [$(cal/cm^3)^{1/2}$] |
| --- | --- | --- |
| Isoamyl acetate | 142 | 8.3 |
| PGMEA | 146 | 9.4 |
| Ethyl lactate | 155 | 10.6 |
| Cyclohexanone | 156 | 9.9 |

TABLE 2-continued

| Example of solvent B/ solvent type | Boiling point (760 mmHg) [° C.] | Solubility parameter [$(cal/cm^3)^{1/2}$] |
| --- | --- | --- |
| Cyclohexanol | 161 | 11.0 |
| Diacetone alcohol | 168 | 10.2 |

In addition, examples of the solvent B other than the above include acetylacetone (boiling point: 140° C.), ethylene glycol monomethyl ether acetate (boiling point: 145° C.), ethylene glycol ethyl ether acetate (boiling point: 145° C.), ethylene glycol monoisopropyl ether (boiling point: 144° C.), ethylene glycol monobutyl ether acetate (boiling point: 145° C.), 3-methoxypropanol (boiling point: 153° C.), diethylene glycol dimethyl ether (boiling point: 162° C.), propylene glycol monoethyl ether acetate (boiling point: 160° C.), 3-methoxypropyl acetate (boiling point: 146° C.), N,N-dimethylformamide (boiling point: 153° C.), and methyl lactate (boiling point: 144° C.).

As the solvent B, from the viewpoint that the effects of the present invention are more excellent, one or more kinds selected from the group consisting of propylene glycol monomethyl ether acetate and cyclohexanone are preferable.

Solvent C

A boiling point of the solvent C is not particularly limited as long as it is 100° C. or higher and lower than 140° C., but from the viewpoint that the effects of the present invention are more excellent, the boiling point is preferably 100° C. to 135° C. and more preferably 120° C. to 135° C.

A solubility parameter of the solvent C is not particularly limited, and for example, 8.0 $(cal/cm^3)^{1/2}$ or more is preferable, and from the viewpoint that the effects of the present invention are more excellent, 8.5 $(cal/cm^3)^{1/2}$ or more is more preferable. Moreover, the upper limit value thereof is, for example, preferably 11.0 $(cal/cm^3)^{1/2}$ or less, more preferably 10.5 $(cal/cm^3)^{1/2}$ or less, and still more preferably 9.0 $(cal/cm^3)^{1/2}$ or less.

In addition, the solvent C is preferably an organic solvent.

The main representative examples of the solvent C, and boiling points and solubility parameters thereof are shown below.

TABLE 3

| Example of solvent C/ solvent type | Boiling point (760 mmHg) [° C.] | Solubility parameter [$(cal/cm^3)^{1/2}$] |
| --- | --- | --- |
| Propyl acetate | 102 | 8.7 |
| Isobutyl acetate | 118 | 8.4 |
| Butyl acetate | 126 | 8.5 |
| Ethyl butyrate | 121 | 8.5 |
| Cyclopentanone | 131 | 10.8 |
| n-Pentanol | 138 | 10.6 |

In addition, examples of the solvent C other than the above include toluene (boiling point: 110° C.), ethylene glycol monomethyl ether (boiling point: 124° C.), ethylene glycol monoethyl ether (boiling point: 135° C.), propylene glycol monomethyl ether (boiling point: 121° C.), and propylene glycol monoethyl ether (boiling point: 133° C.).

As the solvent C, from the viewpoint that the effects of the present invention are more excellent, one or more kinds selected from the group consisting of butyl acetate and ethyl butyrate are preferable.

Other Solvents

The solvent may optionally include a solvent (solvent having a boiling point of lower than 100° C.) other than the solvent A, the solvent B, and the solvent C.

Content

The total content of the solvent A, the solvent B, and the solvent C is preferably 80% by mass or more with respect to the total mass of the solvent, and from the viewpoint that the effects of the present invention are more excellent, the total content is more preferably 90% by mass or more and still more preferably 95% by mass or more. Moreover, the upper limit value thereof is preferably 100% by mass or less.

The content of the solvent A is preferably 1.0% by mass or more with respect to the total content of the solvent A, the solvent B, and the solvent C, and from the viewpoint that the effects of the present invention are more excellent, the content is more preferably 2.0% by mass or more, still more preferably 3.0% by mass or more, and particularly preferably 5.0% by mass or more. Moreover, the upper limit value thereof is preferably 30.0% by mass or less, and from the viewpoint that the effects of the present invention are more excellent, the upper limit value is more preferably 25.0% by mass or less, still more preferably 20.0% by mass or less, and particularly preferably 15.0% by mass or less.

The content of the solvent B is preferably 50.0% by mass or more with respect to the total content of the solvent A, the solvent B, and the solvent C, and from the viewpoint that the effects of the present invention are more excellent, the content is more preferably 55.0% by mass or more, still more preferably 60.0% by mass or more, and particularly preferably 70.0% by mass or more. Moreover, the upper limit value thereof is preferably 98.0% by mass or less, and from the viewpoint that the effects of the present invention are more excellent, the upper limit value is more preferably 96.0% by mass or less, still more preferably 95.0% by mass or less, particularly preferably 90.0% by mass or less, and most preferably 85.0% by mass or less.

The content of the solvent C is preferably 1.0% by mass or more with respect to the total content of the solvent A, the solvent B, and the solvent C, and from the viewpoint that the effects of the present invention are more excellent, the content is more preferably 2.0% by mass or more, still more preferably 3.0% by mass or more, particularly preferably 5.0% by mass or more, and most preferably 10.0% by mass or more. Moreover, the upper limit value thereof is preferably 30.0% by mass or less, and from the viewpoint that the effects of the present invention are more excellent, the upper limit value is more preferably 25.0% by mass or less, still more preferably 20.0% by mass or less, and particularly preferably 15.0% by mass or less.

Suitable examples of the contents of the solvent A, the solvent B, and the solvent C include a combination in which the content of the solvent A is 5.0% to 15.0% by mass with respect to the total content of the solvent A, the solvent B, and the solvent C, the content of the solvent B is 70.0% to 90.0% by mass with respect to the total content of the solvent A, the solvent B, and the solvent C, and the content of the solvent C is 5.0% to 15.0% by mass with respect to the total content of the solvent A, the solvent B, and the solvent C.

Water

The composition may further include water. With respect to the total mass of the composition, the upper limit value of the content of water in the composition is, for example, preferably 5.0% by mass or less, more preferably 3.0% by mass or less, and from the viewpoint that the viscosity stability of the composition over time is more excellent, still more preferably 1.0% by mass or less. The lower limit value of the content of water in the composition is, for example, preferably 0.001% by mass or more, more preferably 0.01% by mass or more, and still more preferably 0.1% by mass or more with respect to the total mass of the composition.

Polymerization Initiator

The composition according to the embodiment of the present invention preferably includes a polymerization initiator.

The polymerization initiator is not particularly limited, and known polymerization initiators can be used. Examples of the polymerization initiator include a photopolymerization initiator and a thermal polymerization initiator, and a photopolymerization initiator is preferable. In addition, as the polymerization initiator, a so-called radical polymerization initiator is preferable.

A content of the polymerization initiator in the composition is not particularly limited, but is preferably 0.5% to 20% by mass, more preferably 1.0% to 10% by mass, and still more preferably 1.5% to 8% by mass with respect to the total solid content of the composition. The polymerization initiators may be used singly or in combination of two or more thereof. In a case where two or more polymerization initiators are used in combination, the total content thereof is preferably within the above-described range.

Thermal Polymerization Initiator

Examples of the thermal polymerization initiator include an azo compound such as 2,2'-azobisisobutyronitrile (AIBN), 3-carboxypropionitrile, azobismalononitrile, and dimethyl-(2,2')-azobis(2-methylpropionate) [V-601] and an organic peroxide such as benzoyl peroxide, lauroyl peroxide, and potassium persulfate.

Specific examples of the thermal polymerization initiator include the polymerization initiator described in pp. 65 to 148 of "Ultraviolet Curing System" (published by Sogo Gijutsu Center, 1989) written by Kiyomi KATO.

Photopolymerization Initiator

The above-described composition preferably includes a photopolymerization initiator.

The photopolymerization initiator is not particularly limited as long as the photopolymerization initiator can initiate the polymerization of the polymerizable compound, and known photopolymerization initiators can be used. As the photopolymerization initiator, for example, a photopolymerization initiator exhibiting photosensitivity from an ultraviolet range to a visible light range is preferable. In addition, the photopolymerization initiator may be an activator which generates active radicals by causing a certain action with a photoexcited sensitizer, or an initiator which initiates cationic polymerization according to the type of the polymerizable compound.

Furthermore, the photopolymerization initiator preferably includes one or more compounds having a molar absorption coefficient of at least 50 in a range of 300 to 800 nm (more preferably 330 to 500 nm).

A content of the photopolymerization initiator in the composition is not particularly limited, but is preferably 0.5% to 20% by mass, more preferably 1.0% to 10% by mass, and still more preferably 1.5% to 8% by mass with respect to the total solid content of the composition. The photopolymerization initiator may be used singly or in combination of two or more thereof. In a case where two or more photopolymerization initiators are used in combination, the total content thereof is preferably within the above-described range.

Examples of the photopolymerization initiator include a halogenated hydrocarbon derivative (for example, a compound including a triazine skeleton, a compound including an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, and hydroxyacetophenone.

Regarding specific examples of the photopolymerization initiator, reference can be made to, for example, paragraphs 0265 to 0268 of JP2013-029760A, the contents of which are incorporated into the present specification.

More specifically, as the photopolymerization initiator, for example, the aminoacetophenone-based initiator described in JP1998-291969A (JP-H10-291969A) and the acyl phosphine-based initiator described in JP4225898B can also be used.

As the hydroxyacetophenone compound, for example, Omnirad-184, Omnirad-1173, Omnirad-500, Omnirad-2959, and Omnirad-127 (product names, all manufactured by IGM RESINS B.V.) can be used.

As the aminoacetophenone compound, for example, Omnirad-907, Omnirad-369, and Omnirad-379EG (product names, all manufactured by IGM RESINS B.V.), which are commercial products, can be used. As the aminoacetophenone compound, the compound which is described in JP2009-191179A and whose absorption wavelength is matched to a light source having a long wavelength such as a wavelength of 365 nm or a wavelength of 405 nm can also be used.

As the acyl phosphine compound, for example, Omnirad-819 and Omnirad-TPO (product names, both manufactured by IGM RESINS B.V.), which are commercial products, can be used.

Oxime Compound

As the photopolymerization initiator, an oxime ester-based polymerization initiator (oxime compound) is more preferable. In particular, an oxime compound has high sensitivity and high polymerization efficiency, easily designs the content of the light shielding pigment in the composition to be high, and thus is preferable.

As specific examples of the oxime compound, the compound described in JP2001-233842A, the compound described in JP2000-080068A, or the compound described in JP2006-342166A can be used.

Examples of the oxime compound include 3-benzoyloxy-iminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Furthermore, the compounds described in J. C. S. Perkin II (1979) pp. 1653 to 1660, J. C. S. Perkin II (1979) pp. 156 to 162, Journal of Photopolymer Science and Technology (1995) pp. 202 to 232, JP2000-066385A, JP2000-080068A, JP2004-534797A, and JP2006-342166A can also be mentioned.

Among commercial products, IRGACURE-OXE01 (manufactured by BASF SE), IRGACURE-OXE02 (manufactured by BASF SE), IRGACURE-OXE03 (manufactured by BASF SE), or IRGACURE-OXE04 (manufactured by BASF SE) is also preferable. In addition, TR-PBG-304 (manufactured by TRONLY), ADEKA ARKLS NCI-831 and ADEKA ARKLS NCI-930 (manufactured by ADEKA CORPORATION), or N-1919 (carbazole and oxime ester skeleton-containing photoinitiator (manufactured by ADEKA CORPORATION)) can also be used.

In addition, as oxime compounds other than the above-described oxime compounds, the compound which is described in JP2009-519904A and in which oxime is linked to a N-position of carbazole; the compound which is described in U.S. Pat. No. 7,626,957B and in which a hetero substituent is introduced into a benzophenone moiety; the compounds which are described in JP2010-015025A and US2009/292039A and in which a nitro group is introduced into the moiety of a coloring agent; the ketoxime compound described in WO2009/131189A; the compound which is described in U.S. Pat. No. 7,556,910B and includes a triazine skeleton and an oxime skeleton in the same molecule; the compound which is described in JP2009-221114A, has an absorption maximum at 405 nm, and exhibits favorable sensitivity with respect to a light source of a g-line; and the like may be used.

Reference can be made to, for example, paragraphs 0274 and 0275 of JP2013-029760A, the contents of which are incorporated into the present specification.

Specifically, as the oxime compound, a compound represented by Formula (OX-1) is preferable. In addition, a N—O bond in the oxime compound may be an (E) isomer, a (Z) isomer, or a mixture of an (E) isomer and a (Z) isomer.

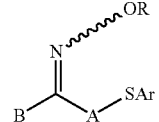

(OX-1)

In Formula (OX-1), R and B each independently represent a monovalent substituent, A represents a divalent organic group, and Ar represents an aryl group.

In Formula (OX-1), the monovalent substituent represented by R is preferably a group of monovalent non-metal atom.

Examples of the group of monovalent non-metal atom include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. Furthermore, each of the substituents may be further substituted with another substituent.

Examples of the substituent include a halogen atom, an aryloxy group, an alkoxycarbonyl group or an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable, and an aryl group or a heterocyclic group is more preferable. These groups may have one or more substituents. Examples of the substituents include the above-described substituents.

As the divalent organic group represented by A in Formula (OX-1), an alkylene group having 1 to 12 carbon atoms, a cycloalkylene group, or an alkynylene group is preferable. These groups may have one or more substituents. Examples of the substituents include the above-described substituents.

As the photopolymerization initiator, a fluorine atom-containing oxime compound can also be used. Specific examples of the fluorine atom-containing oxime compound include the compound described in JP2010-262028A; the compounds 24 and 36 to 40 described in JP2014-500852A;

and the compound (C-3) described in JP2013-164471A. The contents thereof are incorporated into the present specification.

As the photopolymerization initiator, compounds represented by Formulae (1) to (4) can also be used.

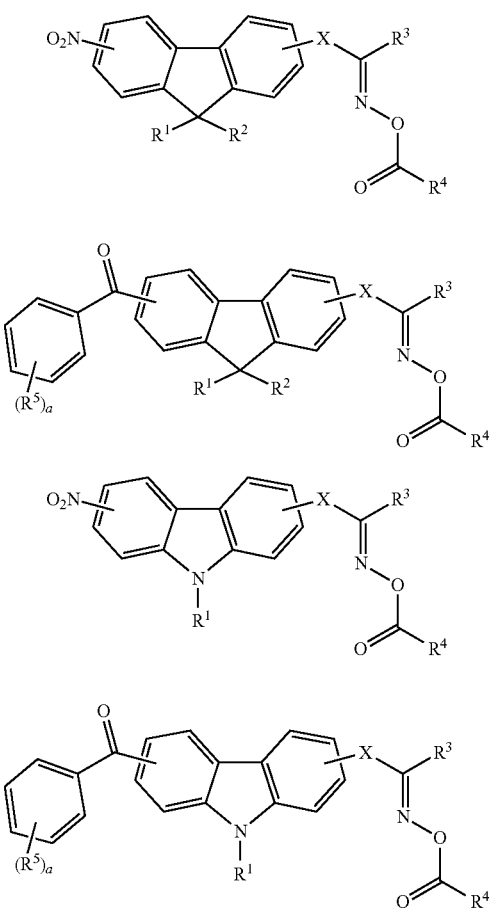

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, in a case where $R^1$ and $R^2$ each represent a phenyl group, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (2), $R^1$, $R^2$, $R^3$, and $R^4$ have the same definitions as $R^1$, $R^2$, $R^3$, and $R^4$ in Formula (1), $R^5$ represents —$R^6$, —$OR^6$, —$SR^6$, —$COR^E$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formula (3), $R^1$ represents an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (4), $R^1$, $R^3$, and $R^4$ have the same definitions as $R^1$, $R^3$, and $R^4$ in Formula (3), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formulae (1) and (2), $R^1$ and $R^2$ are preferably each independently a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Furthermore, in Formulae (3) and (4), $R^1$'s are preferably each independently a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formula (1) and Formula (2) include the compound described in paragraphs 0076 to 0079 of JP2014-137466A. The contents thereof are incorporated into the present specification.

In addition, as the oxime compound, a compound represented by Formula (1) is also preferable.

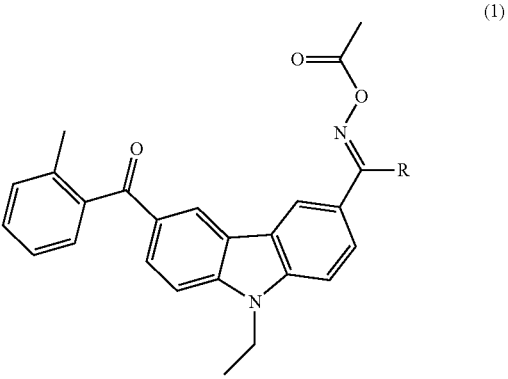

In Formula (1), R represents a group represented by Formula (Ia).

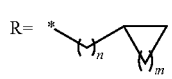
(1a)

In Formula (Ia), n represents an integer of 1 to 5. m represents an integer of 1 to 6. * represents a bonding position.

m is preferably 3 or 4.

For example, the compound represented by Formula (1) can be synthesized according to the synthesis method described in JP2012-519191A.

Specific examples of an oxime compound preferably used in the composition are shown below.

Furthermore, as the oxime compound, the compounds described in Table 1 of WO2015/036910A can also be used, the contents of which are incorporated into the present specification.

(C-1)

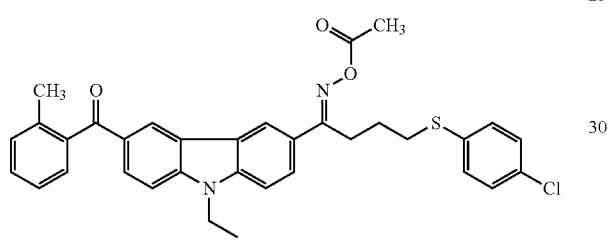

(C-2)

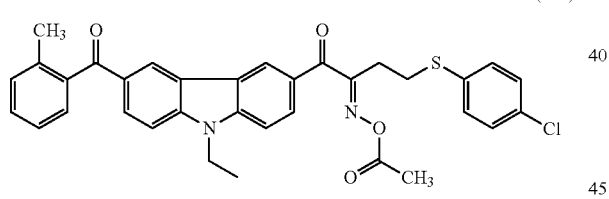

(C-3)

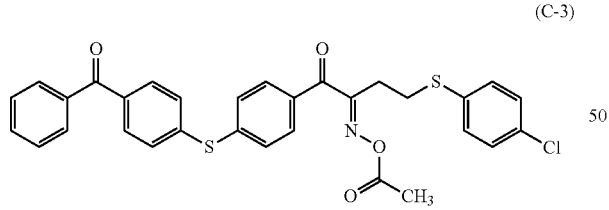

(C-4)

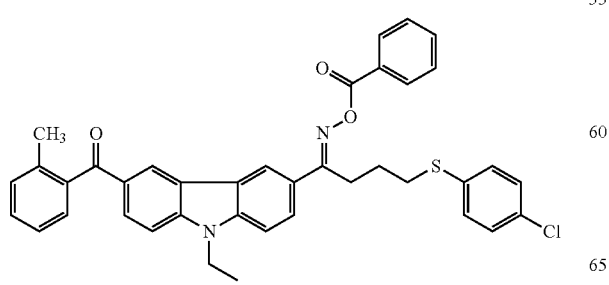

(C-5)

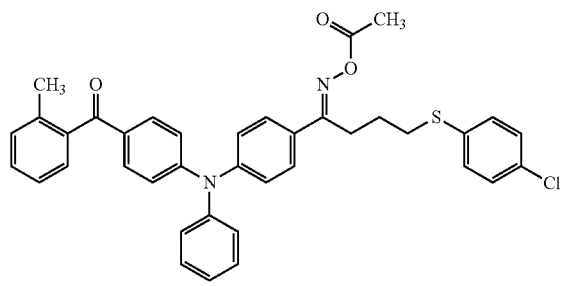

(C-6)

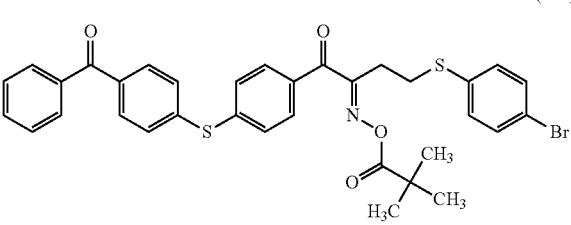

(C-7)

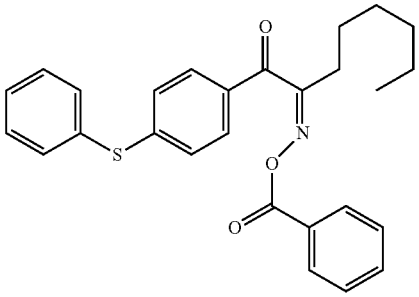

(C-8)

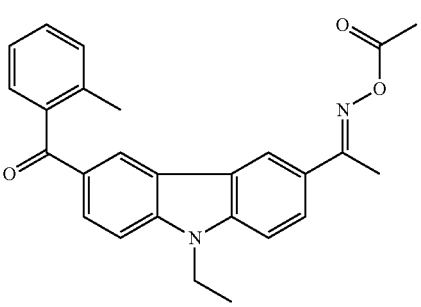

(C-9)

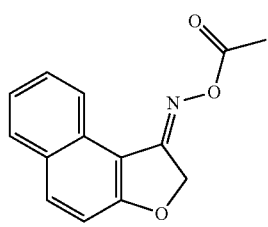

-continued

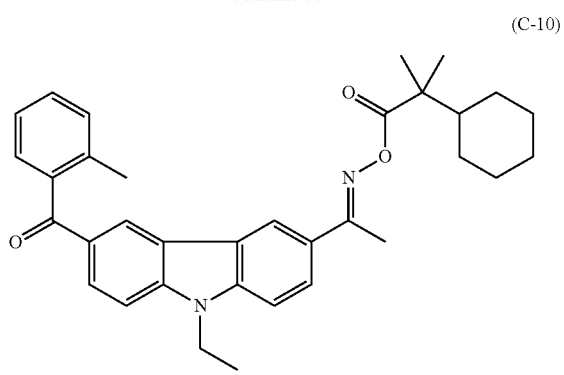
(C-10)

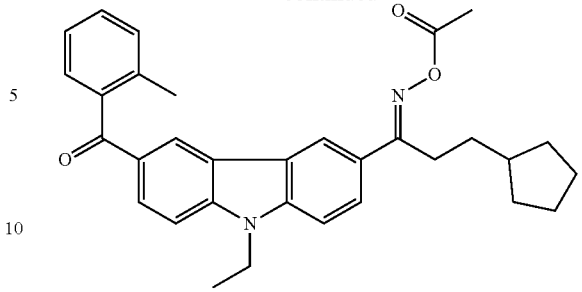
(C-11 label appears with next structure)

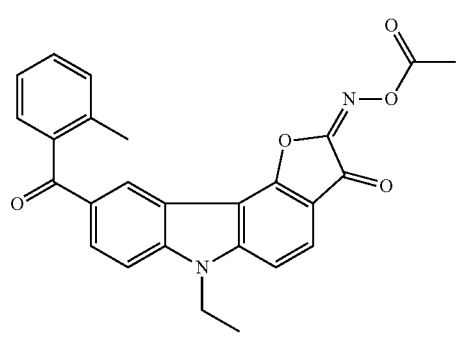
(C-11)

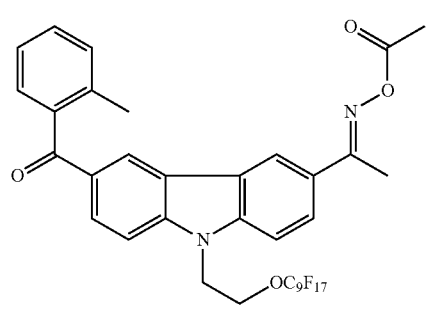
(C-12)

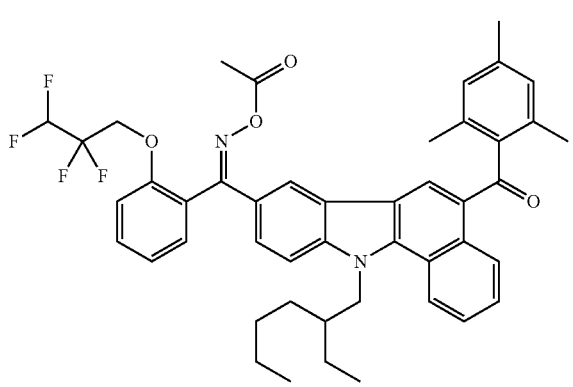
(C-13)

The oxime compound preferably has a maximal absorption wavelength in a wavelength range of 350 to 500 nm, more preferably has a maximal absorption wavelength absorption wavelength in a wavelength range of 360 to 480 nm, and still more preferably has a high absorbance at wavelengths of 365 nm and 405 nm.

From the viewpoint of sensitivity, a molar absorption coefficient of the oxime compound at 365 nm or 405 nm is preferably 1,000 to 300,000, more preferably 2,000 to 300,000, and still more preferably 5,000 to 200,000.

The molar absorption coefficient of the compound can be measured by known methods, but for example, it is preferable that the measurement is carried out with an ultraviolet and visible spectrophotometer (Cary-5 spectrophotometer manufactured by Varian, Inc.) at a concentration of 0.01 g/L using ethyl acetate.

Two or more photopolymerization initiators may be used in combination, as needed.

In addition, as the photopolymerization initiator, the compounds described in paragraph 0052 of JP2008-260927A, paragraphs 0033 to 0037 of JP2010-097210A, and paragraph 0044 of JP2015-068893A can also be used, the contents of which are incorporated into the present specification.

As the polymerization initiator, from the viewpoint that the effects of the present invention are more excellent, an oxime ester-based polymerization initiator is preferable, and the above-described compound represented by Formula (1) is more preferable.

Polymerizable Compound

The composition according to the embodiment of the present invention preferably includes a polymerizable compound.

In the present specification, the polymerizable compound means a compound which is polymerized by the action of the polymerization initiator which will be described later, and a component different from the above-described dispersant and alkali-soluble resin.

Moreover, the polymerizable compound means a component different from an epoxy group-containing compound described later.

A content of the polymerizable compound in the composition is not particularly limited, but is preferably 5% to 35% by mass, more preferably 10% to 30% by mass, and still more preferably 15% to 25% by mass with respect to the total solid content of the composition. The polymerizable compound may be used singly or in combination of two or more thereof. In a case where two or more polymerizable compounds are used in combination, the total content thereof is preferably within the above-described range.

The polymerizable compound is preferably a low-molecular-weight compound, and the low-molecular-weight compound mentioned here is a compound having a molecular weight of 2000 or less.

The polymerizable compound is preferably a compound including an unsaturated double bond.

Specifically, the compound including an unsaturated double bond is preferably a compound having a group including an ethylenically unsaturated bond (hereinafter, also simply referred to as an "ethylenically unsaturated group").

The composition according to the embodiment of the present invention preferably includes a low-molecular-weight compound including an ethylenically unsaturated group as the polymerizable compound.

The polymerizable compound is preferably a compound including one or more ethylenically unsaturated bonds, more preferably a compound including two or more ethylenically unsaturated bonds (bi- or higher functional compound), and from the viewpoint that the effects of the present invention are more excellent, still more preferably a compound including three or more ethylenically unsaturated bonds (tri- or higher functional compound), particularly preferably a compound including four or more ethylenically unsaturated bonds (tetra- or higher functional compound), and most preferably a compound including six or more ethylenically unsaturated bonds (hexa- or higher functional compound). For example, the upper limit thereof is 15 or less (15 or less functionals), preferably 10 or less (10 or less functionals). Examples of the ethylenically unsaturated group include a vinyl group, a (meth)allyl group, and a (meth)acryloyl group.

As the polymerizable compound, for example, the compounds described in paragraph 0050 of JP2008-260927A and paragraph 0040 of JP2015-068893A can be used, the contents of which are incorporated into the present specification.

The polymerizable compound may be in any chemical form such as a monomer, a prepolymer, an oligomer, a mixture thereof, and a multimer thereof.

The polymerizable compound is preferably a tri- to pentadeca-functional (meth)acrylate compound, and more preferably a tri- to hexa-functional (meth)acrylate compound.

As the polymerizable compound, a compound which includes one or more ethylenically unsaturated groups and has a boiling point equal to or higher than 100° C. under normal pressure is also preferable. Reference can be made to, for example, the compounds described in paragraph 0227 of JP2013-029760A and paragraphs 0254 to 0257 of JP2008-292970A, the contents of which are incorporated into the present specification.

As the polymerizable compound, dipentaerythritol triacrylate (as a commercial product, KAYARAD D-330; manufactured by Nippon Kayaku Co., Ltd.), dipentaerythritol tetraacrylate (as a commercial product, KAYARAD D-320; manufactured by Nippon Kayaku Co., Ltd.), dipentaerythritol penta(meth)acrylate (as a commercial product, KAYARAD D-310; manufactured by Nippon Kayaku Co., Ltd.), dipentaerythritol hexa(meth)acrylate (as a commercial product, KAYARAD DPHA; manufactured by Nippon Kayaku Co., Ltd., and A-DPH-12E; manufactured by Shin-Nakamura Chemical Co., Ltd.), and a structure (for example, SR454 and SR499 commercially available from Sartomer) in which an ethylene glycol residue or a propylene glycol residue is between these (meth)acryloyl groups are preferable. Oligomer types thereof can also be used. In addition, NK ESTER A-TMMT (pentaerythritol tetraacrylate, manufactured by Shin-Nakamura Chemical Co., Ltd.), KAYARAD RP-1040, KAYARAD DPEA-12LT, KAYARAD DPHA LT, KAYARAD RP-3060, and KAYARAD DPEA-12 (manufactured by Nippon Kayaku Co., Ltd.), or the like may be used.

The preferred aspects of the polymerizable compound are shown below.

The polymerizable compound may have an acid group such as a carboxylic acid group, a sulfonic acid group, and a phosphoric acid group. The polymerizable compound including an acid group is preferably an ester of an aliphatic polyhydroxy compound and an unsaturated carboxylic acid, more preferably a polymerizable compound having an acid group by reacting a nonaromatic carboxylic acid anhydride with an unreacted hydroxyl group of an aliphatic polyhydroxy compound, and still more preferably a compound in which the aliphatic polyhydroxy compound in the ester is pentaerythritol and/or dipentaerythritol. Examples of a commercial product thereof include ARONIX TO-2349, M-305, M-309, M-510, and M-520 manufactured by TOAGOSEI CO., LTD.

The acid value of the polymerizable compound including an acid group is preferably 0.1 to 40 mgKOH/g and more preferably 5 to 30 mgKOH/g. In a case where the acid value of the polymerizable compound is 0.1 mgKOH/g or more, development dissolution characteristics are favorable, and in a case where the acid value is 40 mgKOH/g or less, the polymerizable compound is advantageous in terms of production and/or handling. In addition, a photopolymerization performance is favorable, and curing properties are excellent.

As the polymerizable compound, a compound having a caprolactone structure is also a preferred aspect.

The compound having a caprolactone structure is not particularly limited as long as the compound has a caprolactone structure in a molecule, but examples thereof include ε-caprolactone-modified polyfunctional (meth)acrylate which is obtained by esterifying polyhydric alcohol such as trimethylolethane, ditrimethylolethane, trimethylolpropane, ditrimethylolpropane, pentaerythritol, dipentaerythritol, tripentaerythritol, glycerin, diglycerol, and trimethylol melamine, (meth)acrylic acid, and ε-caprolactone. Among them, a compound which has a caprolactone structure and is represented by Formula (Z-1) is preferable.

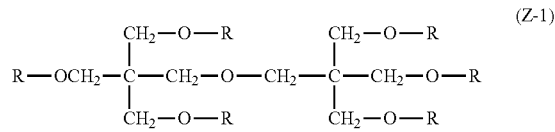

In Formula (Z-1), all six R's are groups represented by Formula (Z-2), or one to five among the six R's are groups represented by Formula (Z-2) and the others are groups represented by Formula (Z-3).

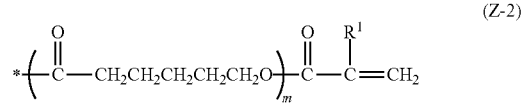

In Formula (Z-2), $R^1$ represents a hydrogen atom or a methyl group, m represents a number of 1 or 2, and "*" represents a bonding site.

(Z-3)

In Formula (Z-3), $R^1$ represents a hydrogen atom or a methyl group, and "*" represents a bonding site.

The polymerizable compound having a caprolactone structure is commercially available, for example, as a KAYARAD DPCA series from Nippon Kayaku Co., Ltd., and examples thereof include DPCA-20 (a compound in which m in Formulae (Z-1) to (Z-3) is 1, the number of groups represented by Formula (Z-2) is 2, and all of $R^1$'s represent hydrogen atoms), DPCA-30 (a compound in which m in Formulae (Z-1) to (Z-3) is 1, the number of groups represented by Formula (Z-2) is 3, and all of $R^1$'s represent hydrogen atoms), DPCA-60 (a compound in which m in Formulae (Z-1) to (Z-3) is 1, the number of groups represented by Formula (Z-2) is 6, and all of $R^1$'s represent hydrogen atoms), and DPCA-120 (a compound in which m in Formulae (Z-1) to (Z-3) is 2, the number of groups represented by Formula (Z-2) is 6, and all of $R^1$'s represent hydrogen atoms).

As the polymerizable compound, a compound represented by Formula (Z-4) or (Z-5) can also be used.

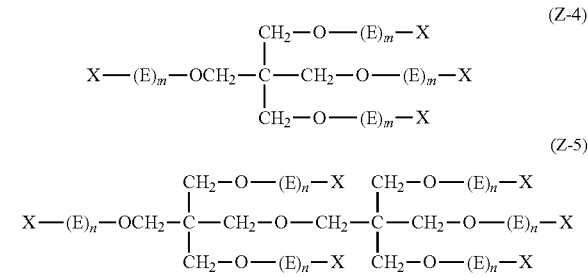

In Formulae (Z-4) and (Z-5), E's each independently represent —$((CH_2)_yCH_2O)$— or —$((CH_2)_yCH(CH_3)O)$—, y's each independently represent an integer of 0 to 10, and X's each independently represent a (meth)acryloyl group, a hydrogen atom, or a carboxylic acid group.

In Formula (Z-4), the total number of (meth)acryloyl groups is 3 or 4, m's each independently represent an integer of 0 to 10, and the total number of m's is an integer of 0 to 40.

In Formula (Z-5), the total number of (meth)acryloyl groups is 5 or 6, n's each independently represent an integer of 0 to 10, and the total number of n's is an integer of 0 to 60.

In Formula (Z-4), m is preferably an integer of 0 to 6 and more preferably an integer of 0 to 4.

In addition, the total number of m's is preferably an integer of 2 to 40, more preferably an integer of 2 to 16, and still more preferably an integer of 4 to 8.

In Formula (Z-5), n is preferably an integer of 0 to 6 and more preferably an integer of 0 to 4.

In addition, the total number of n's is preferably an integer of 3 to 60, more preferably an integer of 3 to 24, and still more preferably an integer of 6 to 12.

Furthermore, a form in which a terminal on the oxygen atom side of —$((CH_2)_yCH_2O)$— or —$((CH_2)_yCH(CH_3)O)$— in Formula (Z-4) or Formula (Z-5) is bonded to X is preferable.

The compound represented by Formula (Z-4) or Formula (Z-5) may be used alone or in combination of two or more thereof. In particular, aspects such as a form in which all of six X's in Formula (Z-5) are acryloyl groups, and a mixture of a compound in which all of six X's in Formula (Z-5) are acryloyl groups and a compound in which at least one among the six X's is a hydrogen atom are preferable. With such a configuration, the developability can be further improved.

Furthermore, the total content of the compounds represented by Formula (Z-4) or Formula (Z-5) in the polymerizable compound is preferably 20% by mass or more and more preferably 50% by mass or more.

Among the compounds represented by Formula (Z-4) or Formula (Z-5), a pentaerythritol derivative and/or a dipentaerythritol derivative is more preferable.

In addition, the polymerizable compound may have a cardo skeleton.

As the polymerizable compound having a cardo skeleton, a polymerizable compound having a 9,9-bisarylfluorene skeleton is preferable.

The polymerizable compound having a cardo skeleton is not limited, but examples thereof include an ONCOAT EX series (manufactured by NAGASE & CO., LTD.), and OGSOL (manufactured by Osaka Gas Chemicals Co., Ltd.).

As the polymerizable compound, a compound having an isocyanuric acid skeleton as a core is also preferable. Examples of such a polymerizable compound include NK ESTER A-9300 (manufactured by Shin-Nakamura Chemical Co., Ltd.).

The content (which means a value obtained by dividing the number of ethylenically unsaturated groups in the polymerizable compound by the molecular weight (g/mol) of the polymerizable compound) of the ethylenically unsaturated group in the polymerizable compound is preferably 5.0 mmol/g or more. The upper limit thereof is not particularly limited, but is generally 20.0 mmol/g or less.

Furthermore, in a case where the composition contains a plurality of types of polymerizable compounds and double bond equivalents of respective polymerizable compounds are not the same, a value obtained by summing up products of mass ratios of respective polymerizable compounds in all the polymerizable compounds and double bond equivalents of respective polymerizable compounds is preferably within the above-described range.

Epoxy Group-Containing Compound

In the composition according to the embodiment of the present invention, an epoxy group-containing compound may be used.

Examples of the epoxy group-containing compound include compounds having one or more epoxy groups in one molecule, and compounds having two or more epoxy groups in one molecule are preferable. It is preferable that 1 to 100 epoxy groups are contained in one molecule. The upper limit thereof may be 10 or less or 5 or less, for example. The lower limit thereof is preferably 2 or more.

In addition, the epoxy group-containing compound means a component different from the above-described dispersant, alkali-soluble resin, and polymerizable compound.

An epoxy equivalent (=molecular weight of epoxy group-containing compound/number of epoxy groups) of the epoxy group-containing compound is preferably equal to or less than 500 g/equivalent, more preferably 100 to 400 g/equivalent, and still more preferably 100 to 300 g/equivalent.

The epoxy group-containing compound may be a low-molecular-weight compound (for example, the molecular weight is less than 2000) or a high-molecular-weight compound (macromolecule) (for example, the molecular weight is 2000 or more, and in a case of a polymer, the weight-average molecular weight is 2000 or more). A weight-average molecular weight of the epoxy group-containing compound is preferably 200 to 100000 and more preferably 500 to 50000. The upper limit of the weight-average molecular weight is more preferably 10000 or less, still more preferably 5000 or less, and particularly preferably 3000 or less.

A commercial product may be used for the epoxy group-containing compound. Examples thereof include EHPE3150 (manufactured by DAICEL CORPORATION) and EPI-CLON N-695 (manufactured by DIC CORPORATION). Moreover, as the epoxy group-containing compound, the compounds described in paragraphs 0034 to 0036 of JP2013-011869A, paragraphs 0147 to 0156 of JP2014-043556A, and paragraphs 0085 to 0092 of JP2014-089408A may be used. The contents of the above-described documents are incorporated into the present specification.

In a case where the composition includes an epoxy group-containing compound, a content of the epoxy group-containing compound in the composition is preferably 0.1% to 10% by mass, more preferably 0.5% to 8% by mass, and still more preferably 1.0% to 6% by mass with respect to the total solid content in the composition.

The epoxy group-containing compound may be used singly or in combination of two or more thereof. In a case where the above-described composition includes two or more epoxy group-containing compounds, the total content thereof is preferably within the above-described range.

Ultraviolet Absorber

The composition may include an ultraviolet absorber. As a result, the pattern shape of the cured film formed by exposure can be made into a more excellent (fine) shape.

As the ultraviolet absorber, salicylate-based, benzophenone-based, benzotriazole-based, substituted acrylonitrile-based, and triazine-based ultraviolet absorbers can be used. As specific examples thereof, the compound described in paragraphs 0137 to 0142 of JP2012-068418A (corresponding to paragraphs 0251 to 0254 of US2012/0068292A) can be used, the contents of which can be incorporated by reference into the present specification.

In addition to the above-described compounds, a diethylamino-phenylsulfonyl-based ultraviolet absorber (manufactured by DAITO CHEMICAL CO., LTD., trade name: UV-503) or the like is also suitably used.

Examples of the ultraviolet absorber include the compounds exemplified in paragraphs 0134 to 0148 of JP2012-032556A.

In a case where the composition includes the ultraviolet absorber, a content of the ultraviolet absorber is preferably 0.001% to 15% by mass, more preferably 0.01% to 10% by mass, and still more preferably 0.1% to 5% by mass with respect to the total solid content of the composition.

Silane Coupling Agent (Adhesive Agent)

The composition may include a silane coupling agent.

The silane coupling agent functions as an adhesive agent which improves adhesiveness between a substrate and a cured film in a case where the cured film is formed on the substrate.

The silane coupling agent is a compound including a hydrolyzable group and other functional groups in a molecule. In addition, the hydrolyzable group such as an alkoxy group is bonded to the silicon atom.

The hydrolyzable group refers to a substituent which is directly bonded to a silicon atom and can form a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group includes a carbon atom, the number of carbon atoms is preferably 6 or less and more preferably 4 or less. In particular, an alkoxy group having 4 or less carbon atoms or an alkenyloxy group having 4 or less carbon atoms is preferable.

Furthermore, in a case where a cured film is formed on a substrate, in order to improve adhesiveness between the substrate and the cured film, the silane coupling agent preferably does not include a fluorine atom and a silicon atom (here, a silicon atom to which a hydrolyzable group is bonded is excluded), and desirably does not include a fluorine atom, a silicon atom (here, a silicon atom to which a hydrolyzable group is bonded is excluded), an alkylene group substituted with a silicon atom, a linear alkyl group having 8 or more carbon atoms, and a branched alkyl group having 3 or more carbon atoms.

The silane coupling agent may include an ethylenically unsaturated group such as a (meth)acryloyl group. In a case where the silane coupling agent includes an ethylenically unsaturated group, the number thereof is preferably 1 to 10 and more preferably 4 to 8. Moreover, the silane coupling agent (for example, a compound which includes a hydrolyzable group and an ethylenically unsaturated group and has a molecular weight of 2000 or less) including an ethylenically unsaturated group does not correspond to the above-described polymerizable compound.

A content of the silane coupling agent in the composition is preferably 0.1% to 10% by mass, more preferably 0.5% to 8% by mass, and still more preferably 1.0% to 6% by mass with respect to the total solid content in the composition.

The composition may include one silane coupling agent singly or two or more silane coupling agents. In a case where the composition includes two or more silane coupling agents, the total amount thereof may be within the above-described range.

Examples of the silane coupling agent include 3-glycidoxypropyl trimethoxysilane, 3-glycidoxypropyl triethoxysilane, 3-glycidoxypropyl methyldimethoxysilane, 3-glycidoxypropyl methyldiethoxysilane, vinyltrimethoxysilane, and vinyltriethoxysilane.

Surfactant

The composition may include a surfactant. The surfactant contributes to improvement in coating properties of the composition.

In a case where the composition includes a surfactant, a content of the surfactant is preferably 0.001% to 2.0% by mass, more preferably 0.005% to 0.5% by mass, and still more preferably 0.01% to 0.1% by mass with respect to the total solid content of the composition.

The surfactant may be used alone or in combination of two or more thereof. In a case where two or more surfactants are used in combination, the total amount thereof is preferably within the above-described range.

Examples of the surfactant include a silicone-based surfactant, a fluorine-based surfactant, a nonionic surfactant, a cationic surfactant, and an anionic surfactant.

From the viewpoint that the effects of the present invention are more excellent, the surfactant preferably includes a silicone-based surfactant.

Examples of the silicone-based surfactant include a linear polymer consisting of a siloxane bond and a modified siloxane polymer with an organic group introduced in the side chain and/or the terminal.

Specific examples of the silicone-based surfactant include DOWSIL (registered trademark) series such as DC3PA, SH7PA, DC11PA, SH21PA, SH28PA, SH29PA, SH30PA, and SH8400 (all manufactured by Dow Corning Corporation); X-22-4952, X-22-4272, X-22-6266, KF-351A, K354L, KF-355A, KF-945, KF-640, KF-642, KF-643, X-22-6191, X-22-4515, KF-6000, KF-6004, KP-323, KP-341, KF-6001, and KF-6002 (all manufactured by Shin-Etsu Chemical Co., Ltd.); F-4440, TSF-4300, TSF-4445, TSF-4460, and TSF-4452 (all manufactured by Momentive Performance Materials Japan LLC); and BYK307, BYK323, and BYK330 (all manufactured by BYK-Chemie GmbH).

As a suitable aspect of the silicone-based surfactant, from the viewpoint that the effects of the present invention are more excellent, an aromatic group-modified silicone-based surfactant (silicone-based surfactant having an aromatic group) is preferable, and a phenyl-modified silicone-based surfactant (silicone-based surfactant having a phenyl group) is more preferable.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC1068, SURFLON SC-381, SURFLON SC-383, SURFLON 5393, and SURFLON KH-40 (all manufactured by ASAHI GLASS CO., LTD.), and PF636, PF656, PF6320, PF6520, and PF7002 (manufactured by OMNOVA Solutions Inc.).

As the fluorine-based surfactant, a block polymer can also be used, and specific examples thereof include the compound described in JP2011-89090A.

Pigment

The composition may further include a pigment other than the carbon black and the barium sulfate described above.

Black Pigment

Examples of the above-described pigment include black pigments other than the carbon black.

As the black pigment, various known black pigments can be used. The black pigment may be an inorganic pigment or an organic pigment.

Examples of the black inorganic pigment include a metal oxide, a metal nitride, and a metal oxynitride which include a metallic element of group 4 such as titanium (Ti) and zirconium (Zr), a metallic element of group 5 such as vanadium (V) and niobium (Nb), or one or more metallic elements selected from the group consisting of cobalt (Co), chromium (Cr), copper (Cu), manganese (Mn), ruthenium (Ru), iron (Fe), nickel (Ni), tin (Sn), and silver (Ag).

The inorganic pigment may be subjected to a surface modification treatment. For example, inorganic particles, which are subjected to a surface modification treatment with a surface-treating agent having both a silicone group and an alkyl group, are mentioned, and examples thereof include "KTP-09" series (manufactured by Shin-Etsu Chemical Co., Ltd.). Moreover, the metal oxide, the metal nitride, and the metal oxynitride may be used as particles in which other atoms are further mixed. For example, the metal oxide, the metal nitride, and the metal oxynitride may be used as a metal oxide, a metal nitride, and a metal oxynitride which further include an atom (preferably, a sulfur atom) selected from the group consisting of elements of groups 13 to 17 of the periodic table.

Among them, as the black pigment, it is preferable to include one or more kinds of metal-containing particles selected from the group consisting of a metal nitride and a metal oxynitride.

The above-described metal-containing particles are preferably a nitride or oxynitride of a metallic element of group 4, or a nitride or oxynitride of a metallic element of group 5, and more preferably a nitride or oxynitride of titanium, a nitride or oxynitride of zirconium, a nitride or oxynitride of vanadium, or a nitride or oxynitride of niobium.

Furthermore, the nitride of titanium is titanium nitride, the nitride of zirconium is zirconium nitride, the nitride of vanadium is vanadium nitride, and the nitride of niobium is niobium nitride. In addition, the oxynitride of titanium is titanium oxynitride, the oxynitride of zirconium is zirconium oxynitride, the oxynitride of vanadium is vanadium oxynitride, and the oxynitride of niobium is niobium oxynitride.

In a case where the composition includes, as the black pigment, one or more kinds of metal-containing particles selected from the group consisting of a metal nitride and a metal oxynitride, a content of the one or more kinds of metal-containing particles selected from the group consisting of a metal nitride and a metal oxynitride is, for example, preferably 0.1% to 30% by mass and more preferably 5% to 25% by mass with respect to the total solid content of the composition.

The black pigment is preferably a pigment as fine as possible. Even considering handleability, an average primary particle diameter of the black pigment is preferably 0.01 to 0.1 μm and more preferably 0.01 to 0.05 μm.

In addition, in the present specification, the titanium nitride means TiN, and may include an oxygen atom (for example, the surfaces of TiN particles are unintentionally oxidized, or the like) which is unavoidable in production.

In the present specification, the titanium nitride means a compound in which a diffraction angle 2θ of a peak derived from a (200) plane in a case where Cukα rays are used as an X-ray source is 42.5° to 42.8°.

In addition, in the present specification, the titanium oxynitride means a compound in which the diffraction angle 2θ of the peak derived from the (200) plane in a case where the Cukα rays are used as an X-ray source is more than 42.8°. The upper limit value of the diffraction angle 2θ of the titanium oxynitride is not particularly limited, but is preferably 43.5° or less.

Examples of the titanium oxynitride include titanium black, and more specifically, for example, an aspect in which lower titanium oxide represented by $TiO_2$ or $Ti_nO_{2n-1}$ ($1 \leq n \leq 20$) and/or a titanium oxynitride represented by $TiN_xO_y$ ($0<x<2.0$ and $0.1<y<2.0$) is included can be mentioned. In the following description, the titanium nitride (the diffraction angle 2θ is 42.5° to 42.8°) and the titanium oxynitride (the diffraction angle 2θ is greater than 42.8°) are collectively referred to as a titanium nitride, and an aspect thereof will be described.

Furthermore, the titanium nitride may be used as particles in which other atoms are further mixed. For example, the titanium nitride may be used as titanium nitride-containing particles which further include an atom (preferably, a sulfur atom) selected from the group consisting of elements of groups 13 to 17 of the periodic table. In addition, the same applies to other metal nitrides, and the metal nitride, which refers to both the metal nitride and the metal oxynitride, may be used as particles in which other atoms are further mixed. For example, the metal nitride may be used as a metal nitride which further includes an atom (preferably, a sulfur atom) selected from the group consisting of elements of groups 13 to 17 of the periodic table.

In a case where the X-ray diffraction spectrum of the titanium nitride is measured using the Cuka rays as an X-ray source, as a peak with the highest intensity, for TiN, a peak derived from the (200) plane is observed near 2θ of 42.5°, and for TiO, a peak derived from the (200) plane is observed near 2θ of 43.4°. Meanwhile, although the peak is not a peak with the highest intensity, for anatase-type $TiO_2$, a peak derived from the (200) plane is observed near 2θ of 48.1°, and for rutile-type $TiO_2$, a peak derived from the (200) plane is observed near 2θ of 39.2°. Therefore, as the titanium oxynitride includes more oxygen atoms, the peak position shifts to a side of an angle of 42.5° or more.

In a case where the titanium nitride includes titanium oxide $TiO_2$, as a peak with the highest intensity, a peak derived from anatase-type $TiO_2$ (101) is found near 2θ of 25.3°, and a peak derived from rutile-type $TiO_2$ (110) is found near 2θ of 27.4°. However, $TiO_2$ is white and is a factor which causes deterioration of light shielding properties of a light shielding film formed of the composition, and thus it is preferable that $TiO_2$ is reduced to such an extent that $TiO_2$ is not observed as a peak.

A size of a crystallite constituting the titanium nitride can be determined from a half-width of the peak obtained by the measurement of the X-ray diffraction spectrum. The crystallite size can be calculated using the Scherrer equation.

The size of the crystallite constituting the titanium nitride is preferably 50 nm or less, and is preferably 20 nm or more. In a case where the crystallite size is 20 to 50 nm, it is likely to have a higher transmittance of an ultraviolet ray (particularly, an i-line (wavelength of 365 nm)), and a composition having higher photosensitivity can be obtained.

A specific surface area of the titanium nitride is not particularly limited, but is determined by the Brunauer-Emmett-Teller (BET) method. The specific surface area of the titanium nitride is preferably 5 to 100 $m^2/g$ and more preferably 10 to 60 $m^2/g$.

A method for producing the black pigment is not particularly limited, known production methods can be used, and examples thereof include a gas-phase reaction method. Examples of the gas-phase reaction method include an electric furnace method and a thermal plasma method, but from the viewpoints that few impurities are mixed in, particle diameters are easily uniform, and productivity is high, a thermal plasma method is preferable.

In the thermal plasma method, the method for generating thermal plasma is not particularly limited, examples thereof include direct-current arc discharge, multi-layer arc discharge, radio-frequency (RF) plasma, and hybrid plasma, and a radio-frequency plasma in which few impurities are mixed in from an electrode is more preferable.

A specific method for producing the black pigment by the thermal plasma method is not particularly limited, but for example, as a method for producing the titanium nitride, a method (JP1990-022110A (JP-H2-022110A)) for reacting titanium tetrachloride with an ammonia gas in a plasma flame, a method (JP1986-011140A (JP-S61-011140A)) for performing synthesis by evaporating a titanium powder by radio-frequency thermal plasma, introducing nitrogen as a carrier gas, and performing nitriding in a cooling process, a method (JP1988-085007A (JP-S63-085007A)) for blowing an ammonia gas into a peripheral portion of plasma, and the like can be mentioned.

Here, the method for producing the black pigment is not limited to the above-described method, and the production method is not limited as long as a black pigment having desired physical properties is obtained.

The black pigment may include, on the surface thereof, a layer of a compound (hereinafter, referred to as a "silicon-containing compound") including silicon. That is, the black pigment may be a black pigment obtained by coating the (oxy)nitride of the metallic atom with the silicon-containing compound.

A method for coating the (oxy)nitride of the metallic atom is not particularly limited, known methods can be used, and examples thereof include the method (the (oxy)nitride of the metallic atom is used instead of the titanium oxide) described on page 2, lower right to page 4, upper right in JP1978-033228A (JP-S53-033228A), the method (the (oxy)nitride of the metallic atom is used instead of the fine titanium dioxide particles) described in paragraphs 0015 to 0043 of JP2008-069193A, and the method (the (oxy)nitride of the metallic atom is used instead of the fine metal oxide particles) described in paragraphs 0020 and 0124 to 0138 of JP2016-074870A, the contents of which are incorporated into the present specification.

The black pigment may be used singly or in combination of two or more thereof

Other Pigments

The pigment may be another pigment other than the black pigment, and the other pigment may be an inorganic pigment or an organic pigment. However, the pigment is a pigment other than the above-described barium sulfate.

Inorganic Pigment

The inorganic pigment is not particularly limited, and known inorganic pigments can be used.

Examples of the inorganic pigment include zinc oxide, white lead, lithopone, titanium oxide, chromium oxide, iron oxide, red lead, red iron oxide, chrome yellow, zinc yellow (zinc yellow type 1 and zinc yellow type 2), ultramarine blue, Prussian blue (potassium ferric ferrocyanide), zircon grey, Praseodymium yellow, chromium titanium yellow, chrome green, peacock, Victoria green, iron blue (irrelevant to Prussian blue), vanadium zirconium blue, chrome tin pink, manganese pink, and salmon pink.

The inorganic pigment may be subjected to a surface modification treatment. For example, an inorganic pigment, which is subjected to a surface modification treatment with a surface-treating agent having both a silicone group and an alkyl group, is mentioned, and examples thereof include "KTP-09" series (manufactured by Shin-Etsu Chemical Co., Ltd.).

A pigment having infrared-absorbing properties can also be used.

As the pigment having infrared-absorbing properties, a tungsten compound, a metal boride, and the like are preferable. Among them, from the viewpoint that light shielding properties at a wavelength in an infrared range are excellent, a tungsten compound is preferable. In particular, from the viewpoint that translucency in a visible light range and a light absorption wavelength range of an oxime ester-based polymerization initiator, which is related to curing efficiency due to exposure, is excellent, a tungsten compound is preferable.

These pigments may be used in combination of two or more thereof, and may be used in combination with a dye which will be described later. In order to adjust tint and to enhance light shielding properties in a desired wavelength range, for example, an aspect in which a dye described later or a pigment which has a chromatic color such as red, green, yellow, orange, violet, and blue is mixed with a pigment which is black or has infrared ray-shielding properties can be mentioned. It is preferable that a red pigment or dye or a violet pigment or dye is mixed with the pigment having infrared ray-shielding properties, and more preferable that a red pigment is mixed with a pigment having infrared ray-shielding properties.

Furthermore, an infrared absorber will be described later may be added.

Organic Pigment

Examples of organic pigments include Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like;

C. I. Pigment Orange 2, 5, 13, 16, 17:1, 31, 34, 36, 38, 43, 46, 48, 49, 51, 52, 55, 59, 60, 61, 62, 64, 71, 73, and the like;

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like;

C. I. Pigment Green 10, 37, 58, 59, and the like;

C. I. Pigment Violet 1, 19, 23, 27, 32, 37, 42, and the like; and

C. I. Pigment Blue 1, 2, 16, 22, 60, 64, 66, 79, 80, and the like. Furthermore, the pigment may be used singly or in combination of two or more thereof.

Dye

As a coloring dye, for example, the colorant described in paragraphs 0027 to 0200 of JP2014-042375A can also be used in addition to a dye (chromatic dye) having a chromatic color such as red (R), green (G), and blue (B). In addition, a black dye can be used.

As the dye, for example, the coloring agents disclosed in JP1989-090403A (JP-S64-090403A), JP1989-091102A (JP-S64-091102A), JP1989-094301A (JP-H01-094301A), JP1994-011614A (JP-H06-011614A), JP2592207B, U.S. Pat. No. 4,808,501A, US505950A, U.S. Pat. No. 5,667,920A, JP1993-333207A (JP-H5-333207A), JP1994-035183A (JP-H6-035183A), JP1994-051115A (JP-H06-051115A), JP1994-194828A (JP-H06-194828A), and the like can be used. In a case where the dyes are sorted based on the chemical structure, a pyrazole azo compound, a pyrromethene compound, an anilinoazo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, or the like can be used. In addition, a coloring agent multimer may be used as the dye. Examples of the coloring agent multimer include the compounds described in JP2011-213925A and JP2013-041097A. Furthermore, a polymerizable dye having a polymerizable group in a molecule may be used, and examples of a commercial product thereof include RDW series manufactured by FUJIFILM Wako Pure Chemical Corporation.

Infrared Absorber

The above-described colorant may further include an infrared absorber.

The infrared absorber refers to a compound having absorption in a wavelength range of an infrared range (preferably, wavelengths of 650 to 1300 nm). The infrared absorber is preferably a compound having a maximal absorption wavelength in a wavelength range of 675 to 900 nm.

Examples of a colorant having such spectral characteristics include a pyrrolo pyrrole compound, a copper compound, a cyanine compound, a phthalocyanine compound (however, a phthalocyanine compound other than copper phthalocyanine and the copper phthalocyanine derivative), an iminium compound, a thiol complex-based compound, a transition metal oxide-based compound, a squarylium compound, a naphthalocyanine compound, a quaterrylene compound, a dithiol metal complex-based compound, and a croconium compound.

As the phthalocyanine compound (however, a phthalocyanine compound other than copper phthalocyanine and the copper phthalocyanine derivative), the naphthalocyanine compound, the iminium compound, the cyanine compound, the squarylium compound, and the croconium compound, the compounds described in paragraphs 0010 to 0081 of JP2010-111750A may be used, the contents of which are incorporated into the present specification. Regarding the cyanine compound, reference can be made to, for example, "Functional Dyes, written by Makoto OKAWARA, Masaru MATSUOKA, Teijiro KITAO, and Tsuneaki HIRASHIMA, Kodansha Scientific Ltd.", the contents of which are incorporated into the specification of the present application.

As the colorant having spectral characteristics, the compound described in paragraphs 0004 to 0016 of JP1995-164729A (JP-H07-164729A) and/or the compound described in paragraphs 0027 to 0062 of JP2002-146254A, and the near-infrared absorption particles which are described in paragraphs 0034 to 0067 of JP2011-164583A, consist of crystallites of an oxide including Cu and/or P, and have a number-average aggregated particle diameter of 5 to 200 nm may be used.

As the compound having a maximal absorption wavelength in a wavelength range of 675 to 900 nm, one or more kinds selected from the group consisting of a cyanine compound, a pyrrolo pyrrole compound, a squarylium compound, a phthalocyanine compound (however, a phthalocyanine compound other than copper phthalocyanine and the copper phthalocyanine derivative), and a naphthalocyanine compound are preferable.

Furthermore, the infrared absorber is preferably a compound which is dissolved in an amount of 1% by mass or more in water at 25° C., and more preferably a compound which is dissolved in an amount of 10% by mass or more in water at 25° C. In a case where such a compound is used, solvent resistance is improved.

Regarding the pyrrolo pyrrole compound, reference can be made to paragraphs 0049 to 0062 of JP2010-222557A, the contents of which are incorporated into the present specification. Regarding the cyanine compound and the squarylium compound, reference can be made to paragraphs 0022 to 0063 of WO2014/088063A, paragraphs 0053 to 0118 of WO2014/030628A, paragraphs 0028 to 0074 of JP2014-059550A, paragraphs 0013 to 0091 of WO2012/169447A, paragraphs 0019 to 0033 of JP2015-176046A, paragraphs 0053 to 0099 of JP2014-063144A, paragraphs 0085 to 0150 of JP2014-052431A, paragraphs 0076 to 0124 of JP2014-044301A, paragraphs 0045 to 0078 of JP2012-008532A, paragraphs 0027 to 0067 of JP2015-172102A, paragraphs 0029 to 0067 of JP2015-172004A, paragraphs 0029 to 0085 of JP2015-040895A, paragraphs 0022 to 0036 of JP2014-126642A, paragraphs 0011 to 0017 of JP2014-148567A, paragraphs 0010 to 0025 of JP2015-157893A, paragraphs 0013 to 0026 of JP2014-095007A, paragraphs 0013 to 0047 of JP2014-080487A, paragraphs 0007 to 0028 of JP2013-227403A, and the like, the contents of which are incorporated into the present specification.

Other Optional Components

The composition may further include optional components other than the above-described components. Examples thereof include a polymerization inhibitor, a sensitizer, a co-sensitizer, a crosslinking agent, a curing accelerator, a filler, a heat curing accelerator, a plasticizer, a diluent, and an oil sensitizing agent, and known additives such as an adhesion promoter to the surface of the substrate and other auxiliaries (for example, conductive particles, a filling agent, an anti-foaming agent, a flame retardant, a leveling agent, a peeling accelerator, an antioxidant, a fragrance, a surface tension adjuster, a chain transfer agent, and the like) may be added as necessary.

Regarding these components, reference can be made to, for example, the descriptions in paragraphs 0183 to 0228 of JP2012-003225A (corresponding to paragraphs 0237 to 0309 of US2013/0034812A), paragraphs 0101, 0102, 0103, 0104, and 0107 to 0109 of JP2008-250074A, and paragraphs 0159 to 0184 of JP2013-195480A, the contents of which are incorporated into the specification of the present application.

Solid Content of Composition

A solid content of the composition is preferably 10% to 40% by mass and more preferably 15% to 30% by mass with respect to the total mass of the composition. That is, the content of the solvent in the composition is not particularly limited, but it is preferable that the solid content of the composition is adjusted to the above-described content.

Method for Producing Composition

The composition is preferably obtained by first producing a dispersion composition in which carbon black is dispersed, and further mixing the obtained dispersion composition with other components.

The dispersion composition is preferably prepared by mixing carbon black, barium sulfate, copper phthalocyanines, a resin (preferably, a dispersant), any metal-containing particles (for example, a metal nitride, a metal oxynitride, and the like), and a solvent. Moreover, it is also preferable that a polymerization inhibitor is introduced into the dispersion composition. The solvent used in the preparation of the dispersion composition may be any one or more of the solvents A to C, or may be a solvent other than the solvents A to C.

The dispersion composition can be prepared by mixing the respective components described above by known mixing methods (for example, mixing methods using a stirrer, a homogenizer, a high-pressure emulsification device, a wet-type pulverizer, a wet-type disperser, or the like).

After preparing the dispersion composition, the composition can be prepared by mixing the above-described dispersion composition, a resin (alkali-soluble resin), a polymerizable compound, a polymerization initiator, and solvents (the solvent A, the solvent B, and the solvent C).

In a case of preparing the composition, the respective components may be formulated at once, or each of the components may be dissolved or dispersed in a solvent and then sequentially formulated. In addition, the input order and the operation conditions during the formulation are not particularly limited.

For the purpose of removing foreign substances, reducing defects, and the like, the composition is preferably filtered with a filter. The filter can be used without particular limitation as long as the filter has been used in the related art in a filtration application or the like. Examples of the filter include filters made of a fluororesin such as polytetrafluoroethylene (PTFE), a polyamide-based resin such as nylon, a polyolefin-based resin (having a high density and an ultrahigh molecular weight) such as polyethylene and polypropylene (PP), or the like. Among these materials, polypropylene (including high-density polypropylene) and nylon are preferable.

A pore diameter of the filter is preferably 0.1 to 7.0 µm, more preferably 0.2 to 2.5 µm, still more preferably 0.2 to 1.5 µm, and particularly preferably 0.3 to 0.7 µM. In a case where the pore diameter is within the above-described range, it is possible to reliably remove fine foreign substances such as impurities and aggregates included in a pigment while suppressing filtration clogging of the pigment (including a light shielding pigment).

In a case of using a filter, different filters may be combined. In this case, filtering with a first filter may be performed only once, or may be performed twice or more times. In a case where filtering is performed twice or more times with a combination of different filters, the pore diameters of the filters used in the second and subsequent filtering are preferably the same as or larger than the pore diameter of the filter used in the first filtering. In addition, the first filters having different pore diameters within the above range may be combined. Regarding the pore diameter mentioned here, reference can be made to nominal values of filter manufacturers. A commercial filter can be selected from various filters provided by, for example, Nihon Pall Ltd., Advantec Toyo Kaisha, Ltd., Nihon Entegris K.K. (formerly Nippon Microlith Co., Ltd.), Kitz Micro Filter Corporation, and the like.

As a second filter, a filter formed of the same material as that of the first filter, or the like can be used. A pore diameter of the second filter is preferably 0.2 to 10.0 µm, more preferably 0.2 to 7.0 µm, and still more preferably 0.3 to 6.0 µm.

The composition preferably does not include impurities such as a metal, a halogen-containing metal salt, an acid, and an alkali. A content of impurities included in these materials is preferably 1 ppm or less, more preferably 1 ppb or less, still more preferably 100 ppt or less, and particularly preferably 10 ppt or less, and it is most preferable that the impurities are substantially not included (the content is equal to or less than the detection limit of the measuring device).

Furthermore, the impurities can be measured using an inductively coupled plasma mass spectrometer (manufactured by Agilent Technologies, Inc., Agilent 7500cs model).

Method for Manufacturing Cured Film

In a case where the composition includes a polymerization initiator and a polymerizable compound, a method for manufacturing a cured film preferably includes the following steps. By going through the following steps, for example, a pattern-like cured film can be formed.

Composition layer forming step
Exposure step
Development step

Hereinafter, each of the steps will be described.

Composition Layer Forming Step

In the composition layer forming step, prior to exposure, the composition is applied on a support or the like to form a layer (composition layer) of the composition. As the support, for example, a substrate for a solid-state imaging element, in which an imaging element (light-receiving element) such as a charge coupled device (CCD) or a complementary metal-oxide semiconductor (CMOS) is provided on a substrate (for example, a silicon substrate), can be used. In addition, in order to improve adhesion with the upper layer, prevent the diffusion of substances, and planarize the surface of the substrate, an undercoat layer may be provided on the support, as needed.

As a method for applying the composition onto the support, various coating methods such as a slit coating method, an ink jet method, a spin coating method, a cast coating method, a roll coating method, and a screen printing method can be applied. The film thickness of the composition layer is preferably 0.1 to 10 µm, more preferably 0.2 to 5 µm, and still more preferably 0.2 to 3 µm. The composition layer applied on the support can be dried (pre-baked) at a temperature of 50° C. to 140° C. for 10 to 300 seconds using a hot plate, an oven, or the like.

Exposure Step

The exposure step is a step of exposing the composition layer formed in the composition layer forming step by irradiating the composition layer with actinic rays or radiations. Specifically, the exposure step is a step of exposing the composition layer formed in the composition layer forming step by irradiating the composition layer with actinic rays or radiations to cure a light irradiation region of the composition layer.

The method of light irradiation is not particularly limited, but light irradiation is preferably performed through a photo mask having a pattern-like opening portion.

The exposure is preferably performed by irradiation with radiations, ultraviolet rays such as a g-line, an h-line, and an i-line are particularly preferable as the radiations which can be used during the exposure, and a high-pressure mercury lamp is preferable as a light source. The irradiation intensity is preferably 5 to 1500 mJ/cm$^2$ and more preferably 10 to 1000 mJ/cm$^2$.

In a case where the composition includes a thermal polymerization initiator, it is also preferable to heat the composition layer in the above-described exposure step. A heating temperature is not particularly limited, but is preferably 80° C. to 250° C. A heating time is not particularly limited, but is preferably 30 to 300 seconds.

Furthermore, in a case where the composition layer is heated in the exposure step, the exposure step may serve as a post-heating step which will be described later. In other words, in a case where the composition layer is heated in the exposure step, the method for manufacturing a cured film may not include the post-heating step.

Development Step

The development step is a step of performing a development treatment on the composition layer after the exposure. By this step, the composition layer in the light exposed region in the exposure step is eluted, and only the photo-cured portion remains. For example, in a case where the light irradiation is performed through a photo mask having a pattern-like opening portion in the exposure step, a pattern-like cured film is obtained.

A type of a developer used in the development step is not particularly limited, but an alkaline developer which does not damage the underlying imaging element and circuit or the like is desirable.

The development temperature is 20° C. to 30° C., for example.

The development time is 20 to 90 seconds, for example. In order to further remove the residues, in recent years, the development may be performed for 120 to 180 seconds. Furthermore, in order to improve residue removability, a step of shaking off the developer every 60 seconds and further supplying a fresh developer may be repeated several times.

The alkaline developer is preferably an alkaline aqueous solution which is prepared by dissolving an alkaline compound in water so that the concentration thereof is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropyl ammonium hydroxide, tetrabutylammonium hydroxide, benzyltrimethylammonium hydroxide, choline, pyrrole, piperidine, and 1,8-diazabicyclo[5.4.0]-7-undecene (among them, organic alkalis are preferable).

Furthermore, in a case where the alkaline compound is used as an alkali developer, the alkaline compound is generally subjected to a washing treatment with water after development.

Post-Baking

A heating treatment (post-baking) is preferably performed after the exposure step. The post-baking is a heating treatment after development to complete the curing. The heating temperature is preferably 240° C. or lower and more preferably 220° C. or lower. The lower limit thereof is not particularly limited, but is preferably 50° C. or higher and more preferably 100° C. or higher, in consideration of an efficient and effective treatment.

The post-baking can be performed continuously or batch-wise by using a heating unit such as a hot plate, a convection oven (hot-air circulating dryer), and a radio-frequency heater.

The post-baking is preferably performed in an atmosphere of a low oxygen concentration. The oxygen concentration is preferably 19% by volume or less, more preferably 15% by volume or less, still more preferably 10% by volume or less, particularly preferably 7% by volume or less, and most preferably 3% by volume or less. The lower limit thereof is not particularly limited, but is practically 10 ppm by volume or more.

In addition, the curing may be completed by irradiation with ultraviolet rays (UV) instead of the post-baking by heating.

In this case, it is preferable that the above-described composition further includes a UV curing agent. The UV curing agent is preferably a UV curing agent which can be cured at a wavelength shorter than 365 nm that is an exposure wavelength of a polymerization initiator added for a lithography step by ordinary i-line exposure. Examples of the UV curing agent include CIBA IRGACURE 2959 (trade name) In a case where UV irradiation is performed, the composition layer is preferably a material which is cured at a wavelength of 340 nm or less. The lower limit value of the wavelength is not particularly limited, but is generally 220 nm or more. In addition, an exposure amount of the UV irradiation is preferably 100 to 5000 mJ, more preferably 300 to 4000 mJ, and still more preferably 800 to 3500 mJ. The UV curing step is preferably performed after the lithography step because low-temperature curing is more effectively performed. As an exposure light source, an ozoneless mercury lamp is preferably used.

Physical Properties of Cured Film and Application of Cured Film

Physical Properties of Cured Film

From the viewpoint that excellent light shielding properties are exhibited, in a cured film obtained by using the composition according to the embodiment of the present invention, an optical density (OD) per film thickness of 1.5 µm in a wavelength range of 400 to 1000 nm is preferably 2.5 or more and more preferably 3.5 or more. In addition, the upper limit value thereof is not particularly limited, but is preferably 10 or less, in general. The cured film can be preferably used as a light shielding film.

In the present specification, the expression that the optical density per film thickness of 1.5 µm in a wavelength range of 400 to 1000 nm is 3.5 or more means that an optical density per film thickness of 1.5 µm in the entire wavelength range of 400 to 1000 nm is 3.5 or more.

In the present specification, as a method for measuring the optical density of the cured film, a cured film is first formed on a glass substrate, and the optical density is measured using a spectrophotometer (for example, U-4100 manufactured by Hitachi High-Technologies Corporation).

The film thickness of the cured film is, for example, preferably 0.1 to 4.0 µm and more preferably 1.0 to 2.5 µm. The cured film may be thinner or thicker than the above range depending on the application.

Moreover, from the viewpoint that excellent low reflection properties are exhibited, in the cured film obtained by using the composition according to the embodiment of the present invention, the maximum reflectivity (incidence angle: 5°) per film thickness of 1.5 µM in a wavelength range of 400 to 700 nm is preferably less than 4%, more preferably less than 2%, and still more preferably less than 1%. The lower limit value thereof is not particularly limited, but is generally 0% or more.

In the present specification, as a method for measuring the maximum reflectivity of the cured film, a cured film is first formed on a glass substrate, and using a spectrometer (for example, VAR unit of a spectrometer V7200 manufactured by JASCO Corporation), a reflectivity spectrum with respect to the incidence angle of 5° is obtained, and a reflectivity of light having a wavelength showing the maximum reflectivity in the wavelength range of 400 to 700 nm is obtained.

In addition, the cured film is suitable for a light shielding member, a light shielding film, an antireflection member, and an antireflection film of optical filters and modules used in portable instruments such as a personal computer, a tablet PC, a mobile phone, a smartphone, and a digital camera; office automation (OA) instruments such as a printer composite machine and a scanner; industrial instruments such as a monitoring camera, a barcode reader, an automated teller machine (ATM), a high-speed camera, an instrument having a personal authentication function using face image authentication; in-vehicle camera instruments; medical camera instruments such as an endoscope, a capsule endoscope, and a catheter; a biosensor, a military reconnaissance camera, a camera for a three-dimensional map, a camera for observing weather and sea, a camera for a land resource exploration, space instruments such as an exploration camera for the astronomy of the space and a deep space target; and the like.

The cured film can also be used in applications of a micro light emitting diode (LED), a micro organic light emitting diode (OLED), and the like. The cured film is suitable for an optical filter and an optical film used in the micro LED and the micro OLED and for a member which imparts a light shielding function or an antireflection function.

Examples of the micro LED and the micro OLED include the examples described in JP2015-500562A and JP2014-533890A.

The cured film is also suitable as an optical filter and an optical film used in a quantum dot sensor and a quantum dot solid-state imaging element. In addition, the cured film is suitable as a member which imparts a light shielding function or an antireflection function. Examples of the quantum dot sensor and the quantum dot solid-state imaging element include the examples described in US2012/37789A and WO2008/131313A.

Light Shielding Film, Solid-State Imaging Element, and Solid-State Imaging Device It is also preferable that the cured film obtained by using the composition according to the embodiment of the present invention is used as a so-called light shielding film. It is also preferable that such a light shielding film is used in a solid-state imaging element.

Furthermore, the light shielding film is one of the preferable applications in the cured film obtained by using the composition according to the embodiment of the present invention, and the light shielding film can be manufactured in the same manner as the method for manufacturing a cured film described above. Specifically, a light shielding film can be manufactured by applying the composition to a substrate to form a composition layer, and performing exposure and development on the composition layer.

In addition, the solid-state imaging element according to the embodiment of the present invention is a solid-state imaging element including the cured film (light shielding film) obtained by using the composition according to the embodiment of the present invention.

As described above, the solid-state imaging element according to the embodiment of the present invention includes the above-described cured film (light shielding film). An aspect in which the solid-state imaging element includes the cured film (light shielding film) is not particularly limited, and examples thereof include an aspect in which a plurality of photodiodes and light-receiving elements consisting of polysilicon or the like constituting a light-receiving area of a solid-state imaging element (a CCD image sensor, a CMOS image sensor, or the like) are provided on a substrate, and solid-state imaging element includes the cured film on a surface side (for example, a portion other than light receiving sections and/or pixels for adjusting color, and the like) of a support on which the light-receiving elements are formed or on a side opposite to the surface on which the light-receiving elements are formed.

In addition, in a case where the cured film (light shielding film) is used as a light attenuating film, for example, by disposing a light attenuating film so that a part of light passes through the light attenuating film and then is incident on a light-receiving element, the dynamic range of the solid-state imaging element can be improved.

The solid-state imaging device includes the above-described solid-state imaging element.

Figure 2:
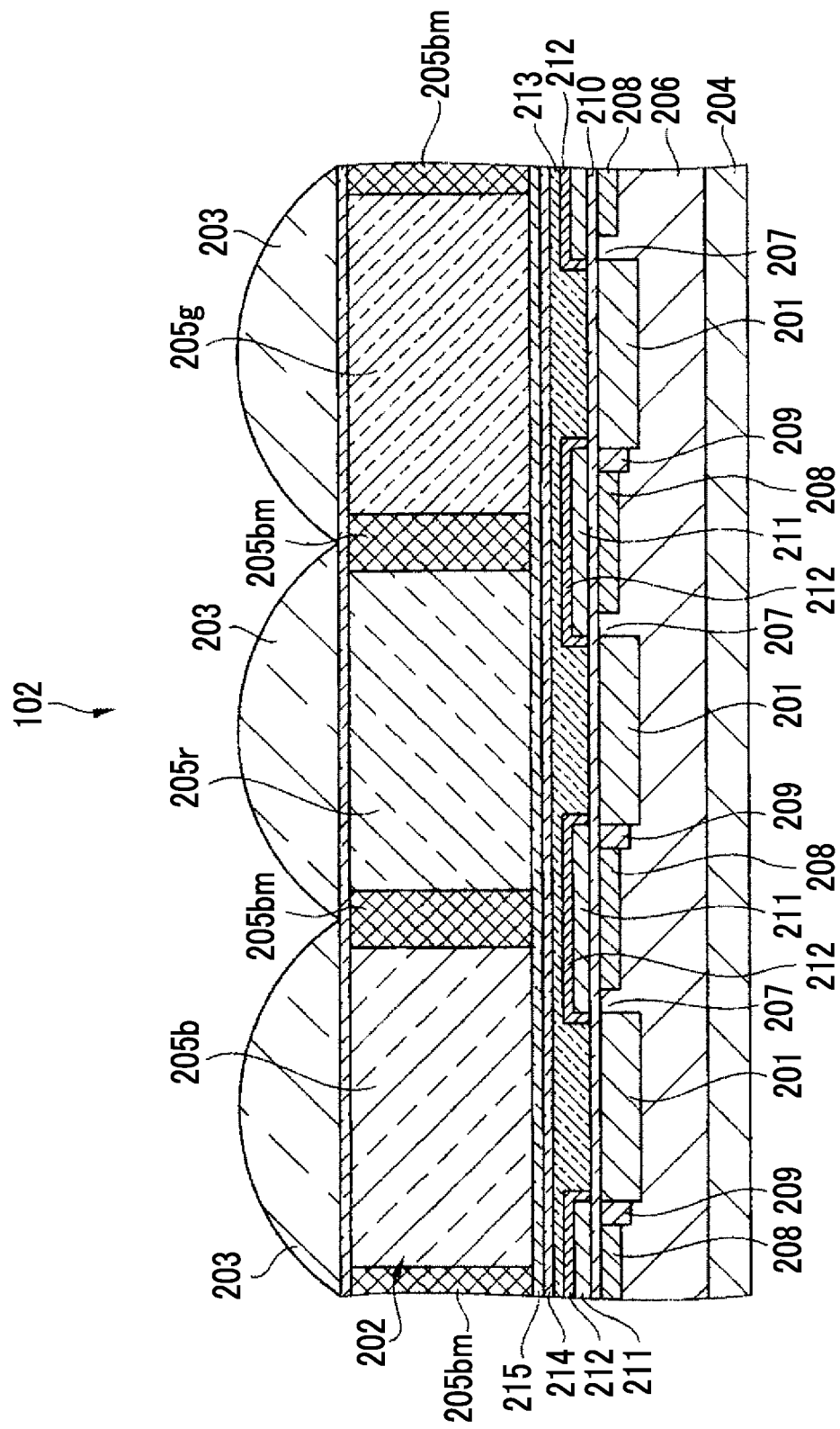
FIG. 2 is a schematic cross-sectional view showing an imaging part in FIG. 1 in an enlarged manner.

Examples of the constitutions of the solid-state imaging device and the solid-state imaging element will be described with reference to FIGS. 1 and 2. In FIGS. 1 and 2, in order that each portion is clearly seen, some portions are magnified in disregard of a thickness ratio and/or a width ratio between the portions.

As shown in FIG. 1, a solid-state imaging device 100 comprises a rectangular solid-state imaging element 101 and a transparent cover glass 103 which is held above the solid-state imaging element 101 and seals the solid-state imaging element 101. In addition, on the cover glass 103, a lens layer 111 is superposably provided through a spacer 104. The lens layer 111 includes a support 113 and a lens material 112. The lens layer 111 may have a configuration in which the support 113 and the lens material 112 are integrally formed. In a case where stray light is incident on the peripheral edge region of the lens layer 111, due to the diffusion of light, an effect of light condensation on the lens material 112 is weakened, and thus the light reaching an imaging part 102 is reduced. In addition, noise is also generated due to the stray light. Therefore, a light shielding film 114 is provided in the peripheral edge region of the lens layer 111 so as to shield the lens layer 111 from light. The cured film obtained by using the composition according to the embodiment of the present invention can also be used as the above-described light shielding film 114.

The solid-state imaging element 101 performs photoelectric conversion on an optical image formed on the imaging part 102 serving as a light-receiving surface of the solid-state imaging element 101, and outputs the converted optical image as an image signal. The solid-state imaging element 101 comprises a laminated substrate 105 obtained by laminating two sheets of substrates. The laminated substrate 105 consists of a chip substrate 106 and a circuit substrate 107 which have the same size and a rectangular shape, and the circuit substrate 107 is laminated on the rear surface of the chip substrate 106.

A material of the substrate used as the chip substrate 106 is not particularly limited, and known materials can be used.

The imaging part 102 is provided in the central part of the surface of the chip substrate 106. In addition, in a case where stray light is incident on the peripheral region of the imaging part 102, a dark current (noise) is generated from the circuit in the peripheral region, and thus a light shielding film 115 is provided in the peripheral region so as to shield the imaging part 102 from light. The cured film obtained by using the composition according to the embodiment of the present invention is preferably used as the light shielding film 115.

A plurality of electrode pads 108 are provided at an edge part of the surface of the chip substrate 106. The electrode pads 108 are electrically connected to the imaging part 102 through a signal line (a bonding wire can also be used) (not shown) provided on the surface of the chip substrate 106.

On the rear surface of the circuit substrate 107, external connection terminals 109 are provided at positions approximately below the electrode pads 108, respectively. The external connection terminals 109 are respectively connected to the electrode pads 108 through a through-electrode 110 vertically passing through the laminated substrate 105. In addition, the external connection terminals 109 are connected to a control circuit controlling the driving of the solid-state imaging element 101, an image processing circuit performing image processing on an imaging signal output from the solid-state imaging element 101, and the like through a wiring line (not shown).

As shown in FIG. 2, the imaging part 102 includes the parts, such as a light-receiving element 201, a color filter 202, and a microlens 203, provided on a substrate 204. The color filter 202 has a blue pixel 205b, a red pixel 205r, a green pixel 205g, and a black matrix 205bm. The cured film obtained by using the composition according to the embodiment of the present invention may be used as the black matrix 205bm.

As the material of the substrate 204, the same material as that of the chip substrate 106 can be used. On the surface layer of the substrate 204, a p-well layer 206 is formed. In the p-well layer 206, the light-receiving elements 201, which consist of an n-type layer and generate and accumulate signal charges by photoelectric conversion, are formed to be arranged in a square lattice form.

On one lateral side of each light-receiving element 201, through a reading gate part 207 on the surface layer of the p-well layer 206, a vertical electric charge transfer path 208 consisting of an n-type layer is formed. In addition, on the other lateral side of each light-receiving element 201, through an element separation region 209 consisting of a p-type layer, a vertical electric charge transfer path 208 belonging to the adjacent pixel is formed. The reading gate part 207 is a channel region for the signal charges accumulated in the light-receiving element 201 to be read out toward the vertical electric charge transfer path 208.

On the surface of the substrate 204, a gate insulating film 210 consisting of an oxide-nitride-oxide (ONO) film is formed. On the gate insulating film 210, vertical electric charge transfer electrodes 211 consisting of polysilicon or amorphous silicon are formed to cover the portions which are approximately immediately above the vertical electric charge transfer path 208, the reading gate part 207, and the element separation region 209. The vertical electric charge transfer electrodes 211 function as driving electrodes for driving the vertical electric charge transfer path 208 and performing charge transfer and as reading electrodes for driving the reading gate part 207 and reading out signal charges. The signal charges are transferred to a horizontal electric charge transfer path and an output part (floating diffusion amplifier), which are not shown in the drawing, in this order from the vertical electric charge transfer path 208, and then output as voltage signals.

On each of the vertical electric charge transfer electrodes 211, a light shielding film 212 is formed to cover the surface of the electrode. The light shielding film 212 has an opening portion at a position immediately above the light-receiving element 201 and shields a region other than the opening portion from light. The cured film obtained by using the composition according to the embodiment of the present invention may be used as the light shielding film 212.

On the light shielding film 212, a transparent interlayer, which consists of an insulating film 213 consisting of borophosphosilicate glass (BPSG), an insulating film (passivation film) 214 consisting of P—SiN, and a planarization film 215 consisting of a transparent resin or the like, is provided. The color filter 202 is formed on the interlayer.

Image Display Device

It is also preferable that the cured film obtained by using the composition according to the embodiment of the present invention is also preferably applied to an image display device.

An image display device according to the embodiment of the present invention includes the cured film obtained by using the composition according to the embodiment of the present invention.

Examples of the aspect in which the image display device has a cured film include an aspect in which a cured film is contained in a black matrix and a color filter including such a black matrix is used in an image display device.

Next, a black matrix and a color filter including the black matrix will be described, and a liquid crystal display device including such a color filter will be described as a specific example of the image display device.

Black Matrix

It is also preferable that the cured film obtained by using the composition according to the embodiment of the present invention is contained in a black matrix. The black matrix is incorporated into a color filter, a solid-state imaging element, and an image display device such as a liquid crystal display device in some cases.

Examples of the black matrix include those described above; a black rim provided in the peripheral portion of an image display device such as a liquid crystal display device;

a lattice-like and/or stripe-like black portion between pixels of red, blue, and green; and a dot-like and/or linear black pattern for shielding a thin film transistor (TFT) from light. The definition of the black matrix is described in, for example, "Glossary of liquid crystal display manufacturing device", written by Yasuhira KANNO, 2nd edition, NIKKAN KOGYO SHIMBUN, LTD., 1996, p. 64.

In order to improve the display contrast and to prevent image quality deterioration resulting from current leakage of light in a case of an active matrix driving-type liquid crystal display device using a thin film transistor (TFT), the black matrix preferably has high light shielding properties (the optical density OD is 3 or more).

The method for manufacturing the black matrix is not particularly limited, but the black matrix can be manufactured in the same manner as the method for manufacturing the cured film. Specifically, by applying the composition on a substrate to form a composition layer and performing exposure and development on the composition layer, a pattern-like cured film (black matrix) can be manufactured. The film thickness of the cured film used as the black matrix is preferably 0.1 to 4.0 µm.

The material of the substrate is not particularly limited, but preferably has a transmittance of 80% or more for visible light (wavelength of 400 to 800 nm). Specific examples of such a material include glass such as soda lime glass, alkali-free glass, quartz glass, and borosilicate glass, and plastic such as a polyester-based resin and a polyolefin-based resin, and from the viewpoints of chemical resistance and heat resistance, alkali-free glass, quartz glass, or the like is preferable.

Color Filter

It is also preferable that the cured film obtained by using the composition according to the embodiment of the present invention is contained in a color filter.

The aspect in which the color filter includes the cured film is not particularly limited, but examples thereof include a color filter comprising a substrate and the above-described black matrix. That is, examples thereof include a color filter comprising colored pixels of red, green, and blue which are formed in the opening portion of the black matrix formed on a substrate.

The color filter including a black matrix (cured film) can be manufactured, for example, by the following method.

First, in an opening portion of a patterned black matrix formed on a substrate, a coating film (composition layer) of a composition containing each of pigments corresponding to the respective colored pixels of the color filter is formed. The composition for each color is not particularly limited, known compositions can be used, but in the composition described in the present specification, it is preferable that a composition in which the light shielding pigment is replaced with a colorant corresponding to each pixel is used.

Subsequently, the composition layer is subjected to exposure through a photo mask having a pattern corresponding to the opening portion of the black matrix. Next, colored pixels can be formed in the opening portion of the black matrix by removing a non-exposed portion by a development treatment, and then performing baking. In a case where the series of operations are performed using, for example, a composition for each color containing red, green, and blue pigments, a color filter having red, green, and blue pixels can be manufactured.

Liquid Crystal Display Device

It is also preferable that the cured film obtained by using the composition according to the embodiment of the present invention is contained in a liquid crystal display device. The aspect in which the liquid crystal display device includes the cured film is not particularly limited, and examples thereof include an aspect in which the liquid crystal display device includes a color filter including the black matrix (cured film) described above.

Examples of the liquid crystal display device include an aspect in which the liquid crystal display device comprises a pair of substrates disposed to face each other and a liquid crystal compound sealed into the space between the substrates. The substrates are as described above as the substrate for a black matrix.

Examples of a specific aspect of the liquid crystal display device include a laminate having polarizing plate/substrate/color filter/transparent electrode layer/alignment film/liquid crystal layer/alignment film/transparent electrode layer/thin film transistor (TFT) element/substrate/polarizing plate/backlight unit in this order from the user side.

In addition, the liquid crystal display device is not limited to the above-described liquid crystal display devices, and examples thereof include the liquid crystal display devices described in "Electronic display device (written by Akio SASAKI, Kogyo Chosakai Publishing Co., Ltd., published in 1990)", "Display Device (written by Sumiaki Sangyo Tosho Publishing Co., Ltd., published in 1989)", or the like. In addition, examples thereof include the liquid crystal display device described in "Next-Generation Liquid Crystal Display Technology (edited by Tatsuo UCHIDA, Kogyo Chosakai Publishing Co., Ltd., published in 1994)".

Infrared Sensor

It is also preferable that the cured film obtained by using the composition according to the embodiment of the present invention is contained in an infrared sensor.

The infrared sensor according to the embodiment will be described with reference to FIG. 3. In an infrared sensor 300 shown in FIG. 3, a reference 310 represents a solid-state imaging element.

An imaging region provided on the solid-state imaging element 310 is configured by combining an infrared absorption filter 311 and a color filter 312 according to the embodiment of the present invention.

The infrared absorption filter 311 is a film which transmits light (for example, light having a wavelength of 400 to 700 nm) in the visible light range and shields from light (for example, light having a wavelength of 800 to 1300 nm, preferably having a wavelength of 900 to 1200 nm, and more preferably having a wavelength of 900 to 1000 nm) in the infrared range, and a cured film including an infrared absorber (the aspect of the infrared absorber is as described above) as a colorant can be used.

The color filter 312 is a color filter in which pixels transmitting or absorbing light having a specific wavelength in the visible light range are formed, for example, a color filter in which pixels of red (R), green (G), and blue (B) are formed, or the like is used, and the form thereof is as described above.

Between an infrared transmitting filter 313 and the solid-state imaging element 310, a resin film 314 (for example, a transparent resin film or the like), which transmits light having a wavelength transmitted through the infrared transmitting filter 313, is disposed.

The infrared transmitting filter 313 is a filter which has visible light shielding properties and transmits infrared rays having a specific wavelength, and the cured film which is obtained by using the composition according to the embodiment of the present invention and includes a colorant (for example, a perylene compound and/or a bisbenzofuranone compound) which absorbs light in a visible light range, and an infrared absorber (for example, a pyrrolo pyrrole compound, a phthalocyanine compound (however, a phthalocyanine compound other than copper phthalocyanine and the copper phthalocyanine derivative), a naphthalocyanine compound, a polymethine compound, and the like) can be used. It is preferable that the infrared transmitting filter 313 shields from light having a wavelength of 400 to 830 nm and transmits light having a wavelength of 900 to 1300 nm, for example.

On an incidence ray hv side of the color filter 312 and the infrared transmitting filter 313, microlenses 315 are arranged. A planarization film 316 is formed to cover the microlenses 315.

Figure 3:
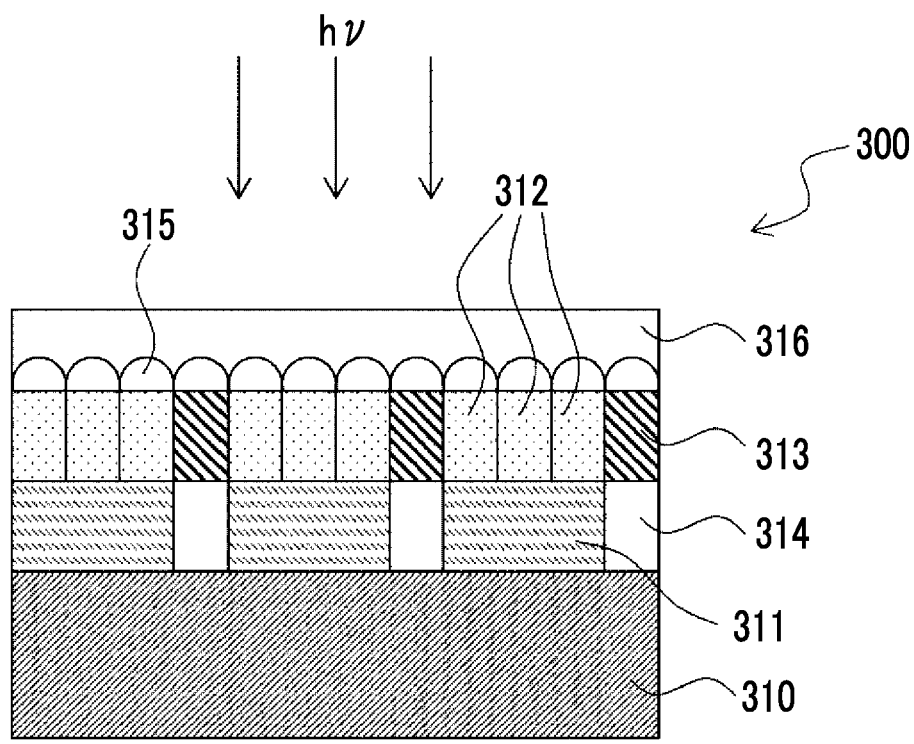
FIG. 3 is a schematic cross-sectional view showing an example of the constitution of an infrared sensor.

In the form shown in FIG. 3, the resin film 314 is disposed, but the infrared transmitting filter 313 may be formed instead of the resin film 314. That is, on the solid-state imaging element 310, the infrared transmitting filter 313 may be formed.

In the form shown in FIG. 3, the film thickness of the color filter 312 is the same as the film thickness of the infrared transmitting filter 313, but both the film thicknesses may be different from each other.

In the form shown in FIG. 3, the color filter 312 is provided to be closer to the incidence ray hv side than the infrared absorption filter 311, but the order of the infrared absorption filter 311 and the color filter 312 may be switched so that the infrared absorption filter 311 is provided to be closer to the incidence ray hv side than the color filter 312.

In the form shown in FIG. 3, the infrared absorption filter 311 and the color filter 312 are laminated to be adjacent to each other, but both the filters are not necessarily adjacent to each other, and another layer may be provided between the filters. The cured film obtained by using the composition according to the embodiment of the present invention can be used as a light shielding film on an edge of the surface and/or a lateral surface of the infrared absorption filter 311, and, by being used as a device inner wall of an infrared sensor, can prevent internal reflection and/or unintended incidence of light on the light receiving section and can improve sensitivity.

According to the infrared sensor, image information can be simultaneously taken in, and thus motion sensing or the like by which a subject whose movement is to be detected is recognized can be carried out. Furthermore, because distance information can be obtained, images including 3D information and the like can be captured.

Next, a solid-state imaging device to which the above-described infrared sensor is applied will be described.

The above-described solid-state imaging device includes a lens optical system, a solid-state imaging element, an infrared emission diode, and the like. Furthermore, regarding each of the configurations of the solid-state imaging device, reference can be made to paragraphs 0032 to 0036 of JP2011-233983A, the contents of which are incorporated into the specification of the present application.

EXAMPLES

Hereinafter, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Accordingly, the scope of the present invention is not limited to the following Examples.

Preparation of Pigment Dispersion Liquid

A pigment dispersion liquid was prepared using the raw materials shown below.

Raw Material for Pigment Dispersion Liquid

Carbon Black

The following CB-1 to CB-5 were used as carbon black.
CB-1: #2350 (average primary particle diameter: 15 nm, pH: 2.5, manufactured by Mitsubishi Chemical Corporation)
CB-2: MA77 (average primary particle diameter: 23 nm, pH: 2.5, manufactured by Mitsubishi Chemical Corporation)
CB-3: Raven1080 (average primary particle diameter: 28 nm, pH: 2.4, manufactured by Columbia Chemical)
CB-4: MA220 (average primary particle diameter: 55 nm, pH: 3.0, manufactured by Mitsubishi Chemical Corporation)
CB-5: #2600 (average primary particle diameter: 13 nm, pH: 6.5, manufactured by Mitsubishi Chemical Corporation)

Nitride Particles or Oxynitride Particles

The following P-1 to P-3 were used as nitride particles or oxynitride particles.
P-1: 13M-T (titanium oxynitride, manufactured by Mitsubishi Materials Corporation)
P-2: titanium nitride particles (titanium nitride, manufactured by Hefei Kai'er Nanometer Technology and Development Co., Ltd)
P-3: zirconium oxynitride particles (zirconium oxynitride, manufactured by Mitsubishi Materials Corporation)

Barium Sulfate

BS-1: BF-20 (manufactured by SAKAI CHEMICAL INDUSTRY CO., LTD.) (average particle diameter: 0.03 μm, pH: 10)

Copper Phthalocyanine or Copper Phthalocyanine Derivative

CP-1: Pigment Blue 15 (copper phthalocyanine, manufactured by Tokyo Chemical Industry Co., Ltd.)
CP-2: copper phthalocyanine-3,4',4",4'''-tetrasulfonic acid tetrasodium salt (copper phthalocyanine derivative, manufactured by Sigma-Aldrich Co., LLC)
CP-3: Solsperse 5000 (copper phthalocyanine derivative, manufactured by Lubrizol Limited)

The "CP-3 (Solsperse 5000)" corresponds to a salt composed of copper phthalocyanine having a sulfonic acid group and dimethyldioctadecylammonium.

Dispersant

As a dispersant, dispersants H-1 to H-4 having the following structures were used. A numerical value described in each structural unit included in a main chain means % by mole of each structural unit with respect to all structural units. A numerical value described in each structural unit included in a side chain indicates a repetition number.
H-1: dispersant having the following structure (acid value=103 mgKOH/g, amine value=103 mgKOH/g, weight-average molecular weight=13,000)

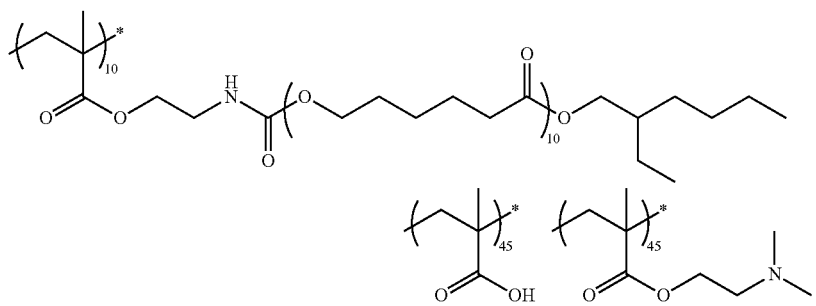

H-2: dispersant having the following structure (acid value=52 mgKOH/g, weight-average molecular weight=13,000)

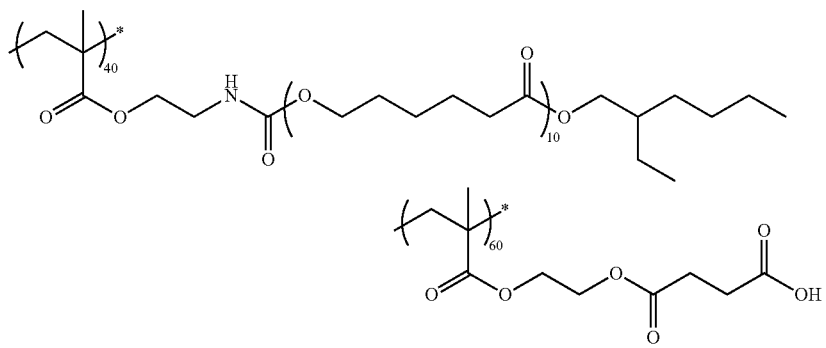

H-3: dispersant having the following structure (acid value=33 mgKOH/g, amine value=44 mgKOH/g, weight-average molecular weight=23,000)

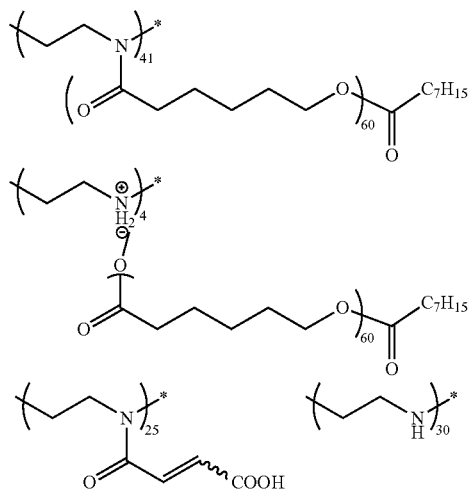

H-4: Disperbyk167 (manufactured by BYK-Chemie GmbH)

Solvent

Propylene glycol monomethyl ether acetate (PGMEA, corresponding to the solvent B)

Butyl acetate (corresponding to the solvent C)

Cyclopentanone (corresponding to the solvent C)

Preparation of Pigment Dispersion Liquid

First, the carbon black, the barium sulfate, the copper phthalocyanines (one or more kinds selected from the copper phthalocyanine and the copper phthalocyanine derivative), the dispersant, the solvent, and the optionally added nitride or oxynitride were mixed with a stirrer (EUROSTAR manufactured by IKA Works GmbH & Co. KG) for 15 minutes in composition and formulating amount shown in Table 4 to obtain a mixed solution. Next, the obtained mixed solution was subjected to a dispersion treatment using NPM-Pilot manufactured by Shinmaru Enterprises Corporation under the following conditions to obtain a pigment dispersion liquid.

Dispersion Conditions

Bead size: φ 0.05 mm, (zirconia beads manufactured by NIKKATO CORPORATION, YTZ)

Bead filling rate: 65% by volume

Circumferential speed of mill 10 m/sec

Circumferential speed of separator: 13 m/s

Amount of mixed solution subjected to dispersion treatment: 15 kg

Circulation flow rate (pump supply rate): 90 kg/hour

Temperature of treatment liquid: 19° C. to 21° C.

Coolant: water

Treatment time: about 22 hours

The compositions of the pigment dispersion liquids are shown in the tables below.

TABLE 4

|  | Carbon black | | Barium sulfate | | Copper phthalocyanines | | Dispersant (resin 1) | | Solvent | |
|---|---|---|---|---|---|---|---|---|---|---|
|  | Type | Addition amount (part by mass) | Type | Addition amount (part by mass) | Type | Addition amount (part by mass) | Type | Addition amount (part by mass) | Type | Addition amount (part by mass) |
| Dispersion liquid 1 | CB-1 | 15.6 | BS-1 | 2.3 | CP-1 | 1.6 | H-1 | 9.7 | PGMEA | 70.8 |
| Dispersion liquid 2 | CB-1 | 15.6 | BS-1 | 2.3 | CP-2 | 1.6 | H-1 | 9.7 | PGMEA | 70.8 |
| Dispersion liquid 3 | CB-1 | 15.6 | BS-1 | 2.3 | CP-3 | 1.6 | H-1 | 9.7 | PGMEA | 70.8 |
| Dispersion liquid 4 | CB-1 | 15.6 | BS-1 | 2.3 | CP-3 | 1.6 | H-2 | 9.7 | PGMEA | 70.8 |
| Dispersion liquid 5 | CB-1 | 15.6 | BS-1 | 2.3 | CP-3 | 1.6 | H-3 | 9.7 | PGMEA | 70.8 |
| Dispersion liquid 6 | CB-1 | 15.6 | BS-1 | 2.3 | CP-3 | 1.6 | H-4 | 9.7 | PGMEA | 70.8 |
| Dispersion liquid 7 | CB-1 | 15.6 | BS-1 | 0.8 | CP-3 | 3.1 | H-3 | 9.7 | PGMEA | 70.8 |
| Dispersion liquid 8 | CB-1 | 15.6 | BS-1 | 3.1 | CP-3 | 0.8 | H-3 | 9.7 | PGMEA | 70.8 |
| Dispersion liquid 9 | CB-2 | 15.6 | BS-1 | 2.3 | CP-3 | 1.6 | H-4 | 9.7 | PGMEA | 70.8 |
| Dispersion liquid 10 | CB-3 | 15.6 | BS-1 | 2.3 | CP-3 | 1.6 | H-4 | 9.7 | PGMEA | 70.8 |
| Dispersion liquid 11 | CB-4 | 15.6 | BS-1 | 2.3 | CP-3 | 1.6 | H-4 | 9.7 | PGMEA | 70.8 |
| Dispersion liquid 12 | CB-5 | 15.6 | BS-1 | 2.3 | CP-3 | 1.6 | H-4 | 9.7 | PGMEA | 70.8 |
| Dispersion liquid 13 | CB-1 | 15.6 | BS-1 | 3.1 | CP-3 | 0.8 | H-3 | 9.7 | PGMEA | 60 |
|  |  |  |  |  |  |  |  |  | Butyl acetate | 10.8 |
| Dispersion liquid 14 | CB-1 | 15.6 | BS-1 | 3.1 | CP-3 | 0.8 | H-3 | 9.7 | PGMEA | 35.4 |
|  |  |  |  |  |  |  |  |  | Butyl acetate | 35.4 |
| Dispersion liquid 15 | CB-1 | 15.6 | BS-1 | 3.1 | CP-3 | 0.8 | H-3 | 9.7 | PGMEA | 60 |
|  |  |  |  |  |  |  |  |  | Cyclopentanone | 10.8 |
| Comparative dispersion liquid 1 | CB-4 | 15.6 | — | 0.0 | CP-3 | 3.9 | H-4 | 9.7 | PGMEA | 70.8 |
| Comparative dispersion liquid 2 | CB-4 | 15.6 | BS-1 | 2.3 | — | 0.0 | H-4 | 9.7 | PGMEA | 74.7 |
| Dispersion liquid 16 | P-1 | 15.6 | — | 0.0 | — | 0.0 | H-3 | 9.7 | PGMEA | 74.7 |
| Dispersion liquid 17 | P-2 | 15.6 | — | 0.0 | — | 0.0 | H-3 | 9.7 | PGMEA | 74.7 |
| Dispersion liquid 18 | P-3 | 15.6 | — | 0.0 | — | 0.0 | H-3 | 9.7 | PGMEA | 74.7 |

Preparation of Composition

A composition was prepared using the raw materials shown below.

Raw Materials for Composition

Pigment Dispersion Liquid

As a pigment dispersion liquid, the pigment dispersion liquids (dispersion liquids 1 to 18 and comparative dispersion liquids 1 and 2) prepared in the above part were used.

Alkali-Soluble Resin

As an alkali-soluble resin, the following resins C-1 and C-2 were used. The structures of the resins C-1 and C-2 are shown below. A numerical value described in each structural unit means % by mole of each structural unit with respect to all structural units.

C-1: resin having the following structure (acid value=110 mgKOH/g, weight-average molecular weight=33,000)

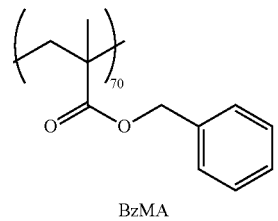

BzMA

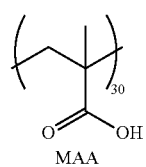

MAA

C-2: resin having the following structure (acid value=70 mgKOH/g, weight-average molecular weight=11,000)

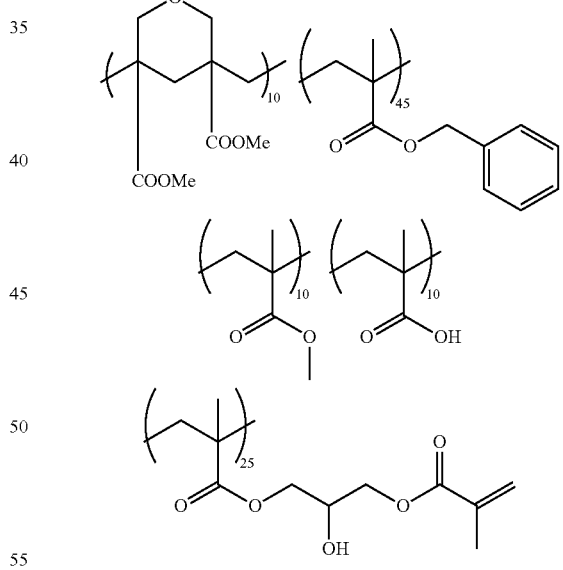

Polymerizable Compound

As a polymerizable compound, the following D-1 to D-3 were used.

D-1: KAYARAD DPHA (manufactured by Nippon Kayaku Co., Ltd., 6-functional monomer)

D-2: NK ESTER A-TMMT (manufactured by Shin-Nakamura Chemical Co., Ltd., 4-functional monomer)

D-3: ARONIX M-309 (manufactured by TOAGOSEI CO., LTD., 3-functional monomer)

Photopolymerization Initiator

As a photopolymerization initiator, the following E-1 to E-8 were used.

E-1: IRGACURE OXE01 (manufactured by BASF SE, oxime ester-based polymerization initiator)

E-2: IRGACURE OXE02 (manufactured by BASF SE, oxime ester-based polymerization initiator)

E-3: compound having the following structure (oxime ester-based polymerization initiator)

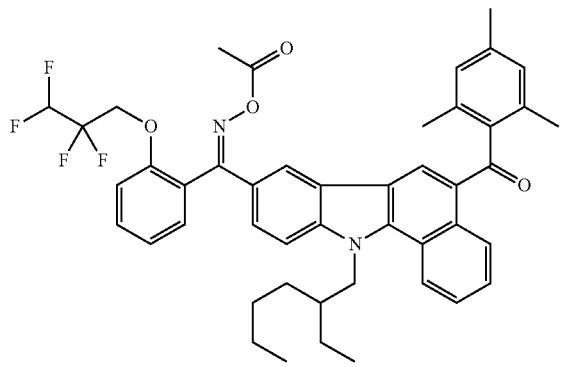 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

E-4: compound having the following structure (oxime ester-based polymerization initiator)

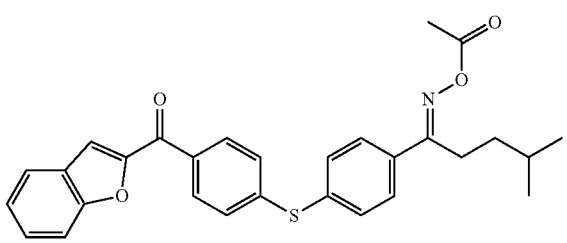 [SMILES: CC(=O)O/N=C(\CCC(C)C)c1ccc(Sc2ccc(C(=O)c3cc4ccccc4o3)cc2)cc1]

E-5: NCI-831 (manufactured by ADEKA CORPORATION, oxime ester-based polymerization initiator)

E-6: compound having the following structure (corresponding to the compound represented by Formula (1) described above, oxime ester-based polymerization initiator)

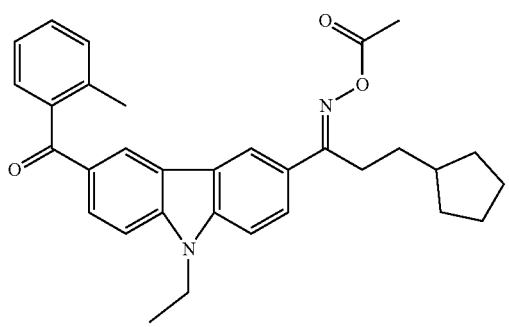 [SMILES: CCn1c2ccc(C(=O)c3ccccc3C)cc2c2cc(/C(CCC3CCCC3)=N/OC(C)=O)ccc21]

E-7: Omnirad 369 (manufactured by IGM Resins B.V., non-oxime ester-based polymerization initiator)

E-8: Omnirad 379 (manufactured by IGM Resins B.V., non-oxime ester-based polymerization initiator)

Solvent

As a solvent, the following solvents S-1 to S-19 were used.

TABLE 5

| | Number | Solvent type | Boiling point (760 mmHg) [° C.] | Solubility parameter [(cal/cm$^3$)$^{1/2}$] |
|---|---|---|---|---|
| Solvent having boiling point of 180° C. or higher (solvent A) | S-1 | n-Butyl lactate | 185 | 9.7 |
| | S-2 | Dimethyl sulfoxide | 189 | 12.9 |
| | S-3 | Diethylene glycol monoethyl ether | 202 | 11.0 |
| | S-4 | γ-Butyrolactone | 204 | 12.8 |
| | S-5 | Benzyl alcohol | 206 | 12.0 |
| | S-6 | 1,3-Butanediol | 208 | 14.1 |
| | S-7 | Dipropylene glycol | 232 | 15.5 |
| Solvent having boiling point of 140° C. or higher and lower than 180° C. (solvent B) | S-8 | Isoamyl acetate | 142 | 8.3 |
| | S-9 | PGMEA | 146 | 9.4 |
| | S-10 | Ethyl lactate | 155 | 10.6 |
| | S-11 | Cyclohexanone | 156 | 9.9 |
| | S-12 | Cyclohexanol | 161 | 11.0 |
| | S-13 | Diacetone alcohol | 168 | 10.2 |
| Solvent having boiling point of 100° C. or higher and lower than 140° C. (solvent C) | S-14 | Propyl acetate | 102 | 8.7 |
| | S-15 | Isobutyl acetate | 118 | 8.4 |
| | S-16 | Butyl acetate | 126 | 8.5 |
| | S-17 | Cyclopentanone | 131 | 10.8 |
| | S-18 | n-Pentanol | 138 | 10.6 |
| | S-19 | Ethyl butyrate | 121 | 8.5 |

Other Components

As other components, the following G-1 to G-8 were used.

G-1: EHPE 3150 (manufactured by DAICEL CORPORATION) (epoxy group-containing compound)

G-2: EPICLON N-695 (manufactured by DIC CORPORATION) (epoxy group-containing compound)

G-3: compound having the following structure (ultraviolet absorber (diethylamino-phenylsulfonyl-based ultraviolet absorber))

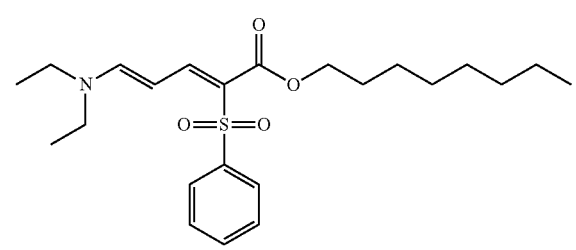 [SMILES: CCCCCCCCOC(=O)/C(=C/C=C/N(CC)CC)S(=O)(=O)c1ccccc1]

G-4: compound having the following structure (adhesive agent)

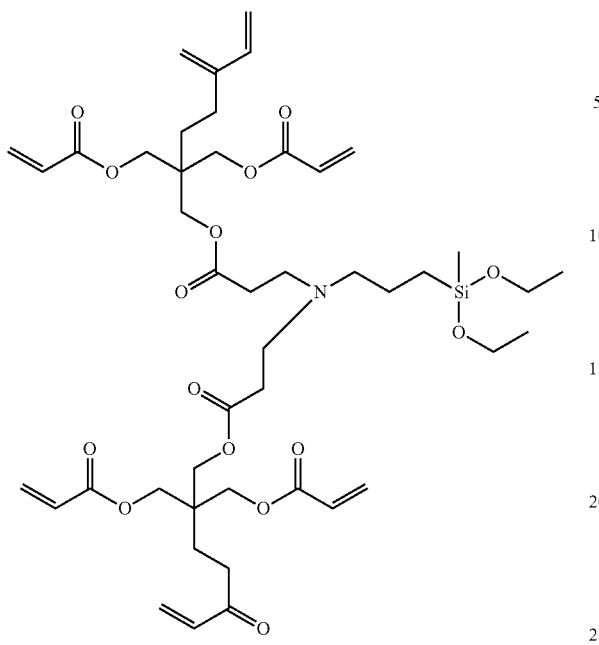

W-1: compound having the following structure (fluorine-based surfactant, weight-average molecular weight=15000; in the following formula, contents of a left structural unit and a right structural unit are 62% by mass and 38% by mass, respectively)

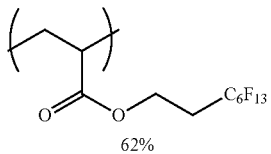

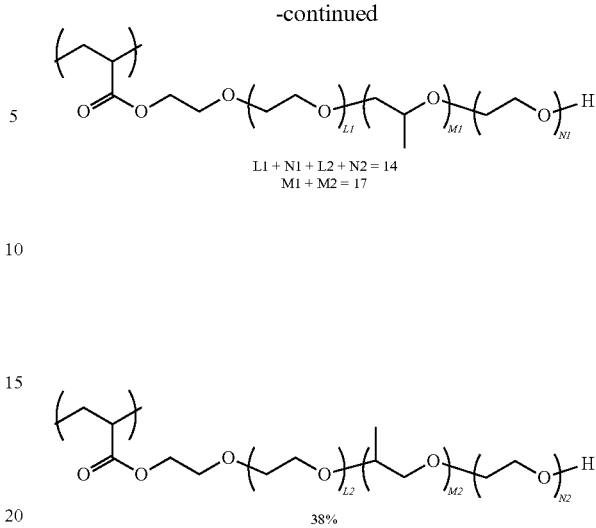

L1 + N1 + L2 + N2 = 14
M1 + M2 = 17

38%

W-2: KF-6000 (silicone-based surfactant (carbinol-modified silicone; dimethyl type), manufactured by Shin-Etsu Chemical Co., Ltd.)

W-3: Dowsil SH-8400 Fluid (silicone-based surfactant (EO-modified silicone; dimethyl type), manufactured by Dow Chemical Company)

W-4: KP323 (silicone-based surfactant (phenyl-modified silicone), manufactured by Shin-Etsu Chemical Co., Ltd.)

Preparation of Composition

The components shown in Tables 6 to 10 were mixed with the above-described pigment dispersion liquid at a proportion shown in Tables 6 to 10 to obtain each composition of Examples and Comparative Examples.

Compositions of the obtained compositions are shown in Tables 6 to 10.

TABLE 6

|  | Pigment dispersion liquid | | Alkali-soluble resin (resin 2) | | Polymerizable compound | | Photopolymerization initiator | | Solvent having boiling point of 180° C. or higher (solvent A) | | Solvent having boiling point of 140° C. or higher and lower than 180° C. (solvent B) | |
|---|---|---|---|---|---|---|---|---|---|---|---|---|
|  | Type | Part by mass | Type | Part by mass | Type | Part by mass | Type | Part by mass | Type | Part by mass | Type | Part by mass |
| Example Composition-1 | Dispersion liquid 5 | 54.1 | C-1 | 2.5 | D-1 | 5.2 | E-1 | 1.5 | S-1 | 10 | S-9 | 21.7 |
| Example Composition-2 | Dispersion liquid 5 | 54.1 | C-1 | 2.5 | D-1 | 5.2 | E-1 | 1.5 | S-2 | 10 | S-9 | 21.7 |
| Example Composition-3 | Dispersion liquid 5 | 54.1 | C-1 | 2.5 | D-1 | 5.2 | E-1 | 1.5 | S-3 | 10 | S-9 | 21.7 |
| Example Composition-4 | Dispersion liquid 5 | 54.1 | C-1 | 2.5 | D-1 | 5.2 | E-1 | 1.5 | S-4 | 10 | S-9 | 21.7 |
| Example Composition-5 | Dispersion liquid 5 | 54.1 | C-1 | 2.5 | D-1 | 5.2 | E-1 | 1.5 | S-5 | 10 | S-9 | 21.7 |
| Example Composition-6 | Dispersion liquid 5 | 54.1 | C-1 | 2.5 | D-1 | 5.2 | E-1 | 1.5 | S-6 | 10 | S-9 | 21.7 |
| Example Composition-7 | Dispersion liquid 5 | 54.1 | C-1 | 2.5 | D-1 | 5.2 | E-1 | 1.5 | S-7 | 10 | S-9 | 21.7 |
| Example Composition-8 | Dispersion liquid 5 | 54.1 | C-1 | 2.5 | D-1 | 5.2 | E-1 | 1.5 | S-2 | 10 | S-8 | 21.7 |
| Example Composition-9 | Dispersion liquid 5 | 54.1 | C-1 | 2.5 | D-1 | 5.2 | E-1 | 1.5 | S-2 | 10 | S-10 | 21.7 |
| Example Composition-10 | Dispersion liquid 5 | 54.1 | C-1 | 2.5 | D-1 | 5.2 | E-1 | 1.5 | S-2 | 10 | S-11 | 21.7 |

TABLE 6-continued

| | Pigment dispersion liquid | | Alkali-soluble resin (resin 2) | | Polymerizable compound | | Photopolymerization initiator | | Solvent having boiling point of 180° C. or higher (solvent A) | | Solvent having boiling point of 140° C. or higher and lower than 180° C. (solvent B) | |
|---|---|---|---|---|---|---|---|---|---|---|---|---|
| | Type | Part by mass | Type | Part by mass | Type | Part by mass | Type | Part by mass | Type | Part by mass | Type | Part by mass |
| Example Composition-11 | Dispersion liquid 5 | 54.1 | C-1 | 2.5 | D-1 | 5.2 | E-1 | 1.5 | S-2 | 10 | S-12 | 21.7 |
| Example Composition-12 | Dispersion liquid 5 | 54.1 | C-1 | 2.5 | D-1 | 5.2 | E-1 | 1.5 | S-2 | 10 | S-13 | 21.7 |
| Example Composition-13 | Dispersion liquid 5 | 54.1 | C-1 | 2.5 | D-1 | 5.2 | E-1 | 1.5 | S-2 | 10 | S-9 | 21.7 |
| Example Composition-14 | Dispersion liquid 5 | 54.1 | C-1 | 2.5 | D-1 | 5.2 | E-1 | 1.5 | S-2 | 10 | S-9 | 21.7 |
| Example Composition-15 | Dispersion liquid 5 | 54.1 | C-1 | 2.5 | D-1 | 5.2 | E-1 | 1.5 | S-2 | 10 | S-9 | 21.7 |

| | Solvent having boiling point of 100° C. or higher and lower than 140° C. (solvent C) | | Compound having epoxy group | | Ultraviolet absorber | | Adhesive agent | | Surfactant | |
|---|---|---|---|---|---|---|---|---|---|---|
| | Type | Part by mass | Type | Part by mass | Type | Part by mass | Type | Part by mass | Type | Part by mass |
| Example Composition-1 | S-16 | 5.0 | — | | — | | — | | W-1 | 0.01 |
| Example Composition-2 | S-16 | 5.0 | — | | — | | — | | W-1 | 0.01 |
| Example Composition-3 | S-16 | 5.0 | — | | — | | — | | W-1 | 0.01 |
| Example Composition-4 | S-16 | 5.0 | — | | — | | — | | W-1 | 0.01 |
| Example Composition-5 | S-16 | 5.0 | — | | — | | — | | W-1 | 0.01 |
| Example Composition-6 | S-16 | 5.0 | — | | — | | — | | W-1 | 0.01 |
| Example Composition-7 | S-16 | 5.0 | — | | — | | — | | W-1 | 0.01 |
| Example Composition-8 | S-16 | 5.0 | — | | — | | — | | W-1 | 0.01 |
| Example Composition-9 | S-16 | 5.0 | — | | — | | — | | W-1 | 0.01 |
| Example Composition-10 | S-16 | 5.0 | — | | — | | — | | W-1 | 0.01 |
| Example Composition-11 | S-16 | 5.0 | — | | — | | — | | W-1 | 0.01 |
| Example Composition-12 | S-16 | 5.0 | — | | — | | — | | W-1 | 0.01 |
| Example Composition-13 | S-14 | 5.0 | — | | — | | — | | W-1 | 0.01 |
| Example Composition-14 | S-15 | 5.0 | — | | — | | — | | W-1 | 0.01 |
| Example Composition-15 | S-17 | 5.0 | — | | — | | — | | W-1 | 0.01 |

TABLE 7

| | Pigment dispersion liquid | | Alkali-soluble resin (resin 2) | | Polymerizable compound | | Photopolymerization initiator | | Solvent having boiling point of 180° C. or higher (solvent A) | | Solvent having boiling point of 140° C. or higher and lower than 180° C. (solvent B) | |
|---|---|---|---|---|---|---|---|---|---|---|---|---|
| | Type | Part by mass | Type | Part by mass | Type | Part by mass | Type | Part by mass | Type | Part by mass | Type | Part by mass |
| Example Composition-16 | Dispersion liquid 5 | 54.1 | C-1 | 2.5 | D-1 | 5.2 | E-1 | 1.5 | S-2 | 10 | S-9 | 21.7 |
| Example Composition-17 | Dispersion liquid 5 | 54.1 | C-2 | 2.5 | D-1 | 5.2 | E-1 | 1.5 | S-2 | 10 | S-9 | 21.7 |
| Example Composition-18 | Dispersion liquid 5 | 54.1 | C-2 | 2.5 | D-2 | 5.2 | E-1 | 1.5 | S-2 | 10 | S-9 | 21.7 |
| Example Composition-19 | Dispersion liquid 5 | 54.1 | C-2 | 2.5 | D-3 | 5.2 | E-1 | 1.5 | S-2 | 10 | S-9 | 21.7 |
| Example Composition-20 | Dispersion liquid 5 | 54.1 | C-2 | 2.5 | D-1 | 5.2 | E-2 | 1.5 | S-2 | 10 | S-9 | 21.7 |
| Example Composition-21 | Dispersion liquid 5 | 54.1 | C-2 | 2.5 | D-1 | 5.2 | E-3 | 1.5 | S-2 | 10 | S-9 | 21.7 |
| Example Composition-22 | Dispersion liquid 5 | 54.1 | C-2 | 2.5 | D-1 | 5.2 | E-4 | 1.5 | S-2 | 10 | S-9 | 21.7 |

TABLE 7-continued

| | | | | | | | | | | | | |
|---|---|---|---|---|---|---|---|---|---|---|---|---|
| Example Composition-23 | Dispersion liquid 5 | 54.1 | C-2 | 2.5 | D-1 | 5.2 | E-5 | 1.5 | S-2 | 10 | S-9 | 21.7 |
| Example Composition-24 | Dispersion liquid 5 | 54.1 | C-2 | 2.5 | D-1 | 5.2 | E-6 | 1.5 | S-2 | 10 | S-9 | 21.7 |
| Example Composition-25 | Dispersion liquid 5 | 54.1 | C-2 | 2.5 | D-1 | 5.2 | E-7 | 1.5 | S-2 | 10 | S-9 | 21.7 |
| Example Composition-26 | Dispersion liquid 5 | 54.1 | C-2 | 2.5 | D-1 | 5.2 | E-8 | 1.5 | S-2 | 10 | S-9 | 21.7 |
| Example Composition-27 | Dispersion liquid 5 | 54.1 | C-2 | 2.5 | D-1 | 5.2 | E-1 | 1.5 | S-2 | 10 | S-9 | 21.2 |
| Example Composition-28 | Dispersion liquid 5 | 54.1 | C-2 | 2.5 | D-1 | 5.2 | E-1 | 1.5 | S-2 | 10 | S-9 | 21.2 |
| Example Composition-29 | Dispersion liquid 5 | 54.1 | C-2 | 2.5 | D-1 | 5.2 | E-6 | 1.5 | S-2 | 10 | S-9 | 21.4 |
| Example Composition-30 | Dispersion liquid 5 | 54.1 | C-2 | 2.5 | D-1 | 5.2 | E-6 | 1.5 | S-2 | 10 | S-9 | 21.2 |

| | Solvent having boiling point of 100° C. or higher and lower than 140° C. (solvent C) | | Compound having epoxy group | | Ultraviolet absorber | | Adhesive agent | | Surfactant | |
|---|---|---|---|---|---|---|---|---|---|---|
| | Type | Part by mass | Type | Part by mass | Type | Part by mass | Type | Part by mass | Type | Part by mass |
| Example Composition-16 | S-18 | 5.0 | — | | — | | — | | W-1 | 0.01 |
| Example Composition-17 | S-16 | 5.0 | — | | — | | — | | W-1 | 0.01 |
| Example Composition-18 | S-16 | 5.0 | — | | — | | — | | W-1 | 0.01 |
| Example Composition-19 | S-16 | 5.0 | — | | — | | — | | W-1 | 0.01 |
| Example Composition-20 | S-16 | 5.0 | — | | — | | — | | W-1 | 0.01 |
| Example Composition-21 | S-16 | 5.0 | — | | — | | — | | W-1 | 0.01 |
| Example Composition-22 | S-16 | 5.0 | — | | — | | — | | W-1 | 0.01 |
| Example Composition-23 | S-16 | 5.0 | — | | — | | — | | W-1 | 0.01 |
| Example Composition-24 | S-16 | 5.0 | — | | — | | — | | W-1 | 0.01 |
| Example Composition-25 | S-16 | 5.0 | — | | — | | — | | W-1 | 0.01 |
| Example Composition-26 | S-16 | 5.0 | — | | — | | — | | W-1 | 0.01 |
| Example Composition-27 | S-16 | 5.0 | G-1 | 0.5 | — | | — | | W-1 | 0.01 |
| Example Composition-28 | S-16 | 5.0 | G-2 | 0.5 | — | | — | | W-1 | 0.01 |
| Example Composition-29 | S-16 | 5.0 | — | | G-3 | 0.3 | — | | W-1 | 0.01 |
| Example Composition-30 | S-16 | 5.0 | — | | — | | G-4 | 0.5 | W-1 | 0.01 |

TABLE 8

| | Pigment dispersion liquid | | Alkali-soluble resin (resin 2) | | Polymerizable compound | | Photopolymerization initiator | | Solvent having boiling point of 180° C. or higher (solvent A) | | Solvent having boiling point of 140° C. or higher and lower than 180° C. (solvent B) | |
|---|---|---|---|---|---|---|---|---|---|---|---|---|
| | Type | Part by mass | Type | Part by mass | Type | Part by mass | Type | Part by mass | Type | Part by mass | Type | Part by mass |
| Example Composition-31 | Dispersion liquid 5 | 54.1 | C-2 | 2.5 | D-1 | 5.2 | E-6 | 1.5 | S-2 | 10 | S-9 | 21.7 |
| Example Composition-32 | Dispersion liquid 5 | 54.1 | C-2 | 2.5 | D-1 | 5.2 | E-6 | 1.5 | S-2 | 10 | S-9 | 21.7 |
| Example Composition-33 | Dispersion liquid 5 | 54.1 | C-2 | 2.5 | D-1 | 5.2 | E-6 | 1.5 | S-2 | 10 | S-9 | 21.7 |
| Example Composition-34 | Dispersion liquid 5 | 54.1 | C-1/C-2 | 1.0/1.5 | D-1/D-2 | 2.0/3.2 | E-6/E-2 | 1.3/0.2 | S-2 | 10 | S-9 | 21.7 |

TABLE 8-continued

| | | | | | | | | | | | |
|---|---|---|---|---|---|---|---|---|---|---|---|
| Example Composition-35 | Dispersion liquid 1 | 54.1 | C-2 | 2.5 | D-1 | 5.2 | E-6 | 1.5 | S-2 | 10 | S-9 | 21.7 |
| Example Composition-36 | Dispersion liquid 2 | 54.1 | C-2 | 2.5 | D-1 | 5.2 | E-6 | 1.5 | S-2 | 10 | S-9 | 21.7 |
| Example Composition-37 | Dispersion liquid 3 | 54.1 | C-2 | 2.5 | D-1 | 5.2 | E-6 | 1.5 | S-2 | 10 | S-9 | 21.7 |
| Example Composition-38 | Dispersion liquid 4 | 54.1 | C-2 | 2.5 | D-1 | 5.2 | E-6 | 1.5 | S-2 | 10 | S-9 | 21.7 |
| Example Composition-39 | Dispersion liquid 6 | 54.1 | C-2 | 2.5 | D-1 | 5.2 | E-6 | 1.5 | S-2 | 10 | S-9 | 21.7 |
| Example Composition-40 | Dispersion liquid 7 | 54.1 | C-2 | 2.5 | D-1 | 5.2 | E-6 | 1.5 | S-2 | 10 | S-9 | 21.7 |
| Example Composition-41 | Dispersion liquid 8 | 54.1 | C-2 | 2.5 | D-1 | 5.2 | E-6 | 1.5 | S-2 | 10 | S-9 | 21.7 |
| Example Composition-42 | Dispersion liquid 9 | 54.1 | C-2 | 2.5 | D-1 | 5.2 | E-6 | 1.5 | S-2 | 10 | S-9 | 21.7 |
| Example Composition-43 | Dispersion liquid 10 | 54.1 | C-2 | 2.5 | D-1 | 5.2 | E-6 | 1.5 | S-2 | 10 | S-9 | 21.7 |
| Example Composition-44 | Dispersion liquid 11 | 54.1 | C-2 | 2.5 | D-1 | 5.2 | E-6 | 1.5 | S-2 | 10 | S-9 | 21.7 |
| Example Composition-45 | Dispersion liquid 12 | 54.1 | C-2 | 2.5 | D-1 | 5.2 | E-6 | 1.5 | S-2 | 10 | S-9 | 21.7 |

| | Solvent having boiling point of 100° C. or higher and lower than 140° C. (solvent C) | | Compound having epoxy group | | Ultraviolet absorber | | Adhesive agent | | Surfactant | |
|---|---|---|---|---|---|---|---|---|---|---|
| | Type | Part by mass | Type | Part by mass | Type | Part by mass | Type | Part by mass | Type | Part by mass |
| Example Composition-31 | S-16 | 5.0 | — | | — | | — | | W-2 | 0.01 |
| Example Composition-32 | S-16 | 5.0 | — | | — | | — | | W-3 | 0.01 |
| Example Composition-33 | S-16 | 5.0 | — | | — | | — | | W-4 | 0.01 |
| Example Composition-34 | S-16 | 5.0 | — | | — | | — | | W-1 | 0.01 |
| Example Composition-35 | S-16 | 5.0 | — | | — | | — | | W-4 | 0.01 |
| Example Composition-36 | S-16 | 5.0 | — | | — | | — | | W-4 | 0.01 |
| Example Composition-37 | S-16 | 5.0 | — | | — | | — | | W-4 | 0.01 |
| Example Composition-38 | S-16 | 5.0 | — | | — | | — | | W-4 | 0.01 |
| Example Composition-39 | S-16 | 5.0 | — | | — | | — | | W-4 | 0.01 |
| Example Composition-40 | S-16 | 5.0 | — | | — | | — | | W-4 | 0.01 |
| Example Composition-41 | S-16 | 5.0 | — | | — | | — | | W-4 | 0.01 |
| Example Composition-42 | S-16 | 5.0 | — | | — | | — | | W-4 | 0.01 |
| Example Composition-43 | S-16 | 5.0 | — | | — | | — | | W-4 | 0.01 |
| Example Composition-44 | S-16 | 5.0 | — | | — | | — | | W-4 | 0.01 |
| Example Composition-45 | S-16 | 5.0 | — | | — | | — | | W-4 | 0.01 |

TABLE 9

| | Pigment dispersion liquid | | Alkali-soluble resin (resin 2) | | Polymerizable compound | | Photopolymerization initiator | | Solvent having boiling point of 180° C. or higher (solvent A) | | Solvent having boiling point of 140° C. or higher and lower than 180° C. (solvent B) | | Solvent having boiling point of 100° C. or higher and lower than 140° C. (solvent C) | | Compound having epoxy group | | Ultraviolet absorber | | Adhesive agent | | Surfactant | |
|---|---|---|---|---|---|---|---|---|---|---|---|---|---|---|---|---|---|---|---|---|---|---|
| | Type | Part by mass | Type | Part by mass | Type | Part by mass | Type | Part by mass | Type | Part by mass | Type | Part by mass | Type | Part by mass | Type | Part by mass | Type | Part by mass | Type | Part by mass | Type | Part by mass |
| Example Composition-46 | Dispersion liquid 13 | 54.1 | C-2 | 2.5 | D-1 | 5.2 | E-6 | 1.5 | S-2 | 10 | S-9 | 21.7 | S-16 | 5.0 | — | | — | | — | | W-4 | 0.01 |
| Example Composition-47 | Dispersion liquid 14 | 54.1 | C-2 | 2.5 | D-1 | 5.2 | E-6 | 1.5 | S-2 | 10 | S-9 | 21.7 | S-16 | 5.0 | — | | — | | — | | W-4 | 0.01 |
| Example Composition-48 | Dispersion liquid 15 | 54.1 | C-2 | 2.5 | D-1 | 5.2 | E-6 | 1.5 | S-2 | 10 | S-9 | 21.7 | S-16 | 5.0 | — | | — | | — | | W-4 | 0.01 |
| Example Composition-49 | Dispersion liquid 5 | 54.1 | C-2 | 2.5 | D-1 | 5.2 | E-6 | 1.5 | S-2 | 2.5 | S-9 | 29.2 | S-16 | 5.0 | — | | — | | — | | W-4 | 0.01 |
| Example Composition-50 | Dispersion liquid 5 | 54.1 | C-2 | 2.5 | D-1 | 5.2 | E-6 | 1.5 | S-2 | 5 | S-9 | 26.7 | S-16 | 5.0 | — | | — | | — | | W-4 | 0.01 |
| Example Composition-51 | Dispersion liquid 5 | 54.1 | C-2 | 2.5 | D-1 | 5.2 | E-6 | 1.5 | S-2 | 15 | S-9 | 16.7 | S-16 | 5.0 | — | | — | | — | | W-4 | 0.01 |
| Example Composition-52 | Dispersion liquid 5 | 54.1 | C-2 | 2.5 | D-1 | 5.2 | E-6 | 1.5 | S-2 | 20 | S-9 | 11.7 | S-16 | 5.0 | — | | — | | — | | W-4 | 0.01 |
| Example Composition-53 | Dispersion liquid 5 | 54.1 | C-2 | 2.5 | D-1 | 5.2 | E-6 | 1.5 | S-2 | 10 | S-9 | 24.2 | S-16 | 2.5 | — | | — | | — | | W-4 | 0.01 |
| Example Composition-54 | Dispersion liquid 5 | 54.1 | C-2 | 2.5 | D-1 | 5.2 | E-6 | 1.5 | S-2 | 10 | S-9 | 16.7 | S-16 | 10.0 | — | | — | | — | | W-4 | 0.01 |
| Example Composition-55 | Dispersion liquid 5 | 54.1 | C-2 | 2.5 | D-1 | 5.2 | E-6 | 1.5 | S-2 | 10 | S-9 | 11.7 | S-16 | 15.0 | — | | — | | — | | W-4 | 0.01 |
| Example Composition-56 | Dispersion liquid 5 | 54.1 | C-2 | 2.5 | D-1 | 5.2 | E-6 | 1.5 | S-2 | 10 | S-9 | 6.7 | S-16 | 20.0 | — | | — | | — | | W-4 | 0.01 |
| Example Composition-57 | Dispersion liquid 5 Dispersion liquid 16 | 27.027.1 | C-2 | 2.5 | D-1 | 5.2 | E-6 | 1.5 | S-2 | 10 | S-9 | 21.7 | S-16 | 5.0 | — | | — | | — | | W-4 | 0.01 |
| Example Composition-58 | Dispersion liquid 5 Dispersion liquid 17 | 27.027.1 | C-2 | 2.5 | D-1 | 5.2 | E-6 | 1.5 | S-2 | 10 | S-9 | 21.7 | | | | | | | | | | |
| Example Composition-59 | Dispersion liquid 5 Dispersion liquid 18 | 27.027.1 | C-2 | 2.5 | D-1 | 5.2 | E-6 | 1.5 | S-2 | 10 | S-9 | 21.7 | | | | | | | | | | |
| Example Composition-60 | Dispersion liquid 5 | 54.1 | C-1 | 2.5 | D-1 | 5.2 | E-1 | 1.5 | S-2 | 10 | S-9 | 21.7 | | | | | | | | | | |

TABLE 9-continued

|  |  |  |  |  |  |  |  |
|---|---|---|---|---|---|---|---|
| Example Composition-58 | S-16 | 5.0 | — | — | — | W-4 | 0.01 |
| Example Composition-59 | S-16 | 5.0 | — | — | — | W-4 | 0.01 |
| Example Composition-60 | S-19 | 5.0 | — | — | — | W-1 | 0.01 |

TABLE 10

|  | Pigment dispersion liquid | | Alkali-soluble resin (resin 2) | | Polymerizable compound | | Photopolymerization initiator | | Solvent having boiling point of 180° C. or higher (solvent A) | | Solvent having boiling point of 140° C. or higher and lower than 180° C. (solvent B) | |
|---|---|---|---|---|---|---|---|---|---|---|---|---|
|  | Type | Part by mass | Type | Part by mass | Type | Part by mass | Type | Part by mass | Type | Part by mass | Type | Part by mass |
| Comparative Composition-1 | Comparative dispersion liquid 1 | 54.1 | C-1 | 2.5 | D-1 | 5.2 | E-1 | 1.5 | S-2 | 10 | S-9 | 21.7 |
| Comparative Composition-2 | Comparative dispersion liquid 2 | 54.1 | C-1 | 2.5 | D-1 | 5.2 | E-1 | 1.5 | S-2 | 10 | S-9 | 21.7 |
| Comparative Composition-3 | Dispersion liquid 11 | 54.1 | C-1 | 2.5 | D-1 | 5.2 | E-1 | 1.5 | — | 0 | S-9 | 31.7 |
| Comparative Composition-4 | Dispersion liquid 11 | 54.1 | C-1 | 2.5 | D-1 | 5.2 | E-1 | 1.5 | S-2 | 10 | S-9 | 26.7 |
| Comparative Composition-5 | Dispersion liquid 11 | 54.1 | C-1 | 2.5 | D-1 | 5.2 | E-1 | 1.5 | — | 0 | S-9 | 36.7 |

|  | Solvent having boiling point of 100° C. or higher and lower than 140° C. (solvent C) | | Compound having epoxy group | | Ultraviolet absorber | | Adhesive agent | | Surfactant | |
|---|---|---|---|---|---|---|---|---|---|---|
|  | Type | Part by mass | Type | Part by mass | Type | Part by mass | Type | Part by mass | Type | Part by mass |
| Comparative Composition-1 | S-16 | 5.0 | — | — | — | — | — | — | W-1 | 0.01 |
| Comparative Composition-2 | S-16 | 5.0 | — | — | — | — | — | — | W-1 | 0.01 |
| Comparative Composition-3 | S-16 | 5.0 | — | — | — | — | — | — | W-1 | 0.01 |
| Comparative Composition-4 | — | 0 | — | — | — | — | — | — | W-1 | 0.01 |
| Comparative Composition-5 | — | 0 | — | — | — | — | — | — | W-1 | 0.01 |

Evaluation

The obtained compositions were used for the following tests and evaluations.

Minimum OD Value at 400 to 1000 nm

A film was formed on a glass plate (Eagle XG, manufactured by Corning Incorporated) having a thickness of 0.7 mm and 10 cm square through spin coating by using the compositions of Examples and Comparative Examples obtained above and adjusting the rotation speed so that the film thickness was 1.5 µm. The formed film was dried on a hot plate by a heat treatment at 100° C. for 2 minutes, and then using an exposure device (light source: ultra-high pressure mercury lamp) manufactured by USHIO LIGHTING, INC., exposure was performed at an exposure amount of 1000 mJ/cm², and post-heating was performed on a hot plate at 220° C. for 5 minutes to obtain a cured film. Regarding a substrate including the obtained cured film, an optical density (OD value) was measured with a spectrophotometer U-4100 (manufactured by Hitachi High-Technologies Corporation). As the OD value is higher, the cured film has excellent light shielding properties. The evaluation was performed according to the following determination criterions.

The lowest OD value in a wavelength range of 400 to 1000 nm was defined as the minimum OD value.

In the following determination criterion, A to C are levels which are unproblematic for practical use.

Determination Criterion

A: The minimum OD value at 400 to 1000 nm was 3.5 or more.

B: The minimum OD value at 400 to 1000 nm was 3.0 or more and less than 3.5.

C: The minimum OD value at 400 to 1000 nm was 2.5 or more and less than 3.0.

D: The minimum OD value at 400 to 1000 nm was less than 2.5.

Maximum reflectivity at 400 to 700 nm

A film was formed on a glass plate (Eagle XG, manufactured by Corning Incorporated) having a thickness of 0.7 mm and 10 cm square through spin coating by using the compositions of Examples and Comparative Examples obtained above and adjusting the rotation speed so that the film thickness was 1.5 μm. The formed film was dried on a hot plate by a heat treatment at 100° C. for 2 minutes, and then using an exposure device (light source: ultra-high pressure mercury lamp) manufactured by USHIO LIGHTING, INC., exposure was performed at an exposure amount of 1000 mJ/cm², and post-heating was performed on a hot plate at 220° C. for 5 minutes to obtain a cured film. Light having a wavelength of 400 to 700 nm was incident on a substrate including the obtained cured film at an incidence angle of 5° using a VAR unit of a spectrometer V7200 (product name) manufactured by JASCO Corporation, and a reflectivity was obtained from the obtained reflectivity spectrum. Specifically, the reflectivity of light having a wavelength which exhibits the maximum reflectivity in a wavelength range of 400 to 700 nm is taken as the reflectivity of the cured film.

In the following determination criterion, A to C are levels which are unproblematic for practical use.
Determination Criterion
  A: The maximum reflectivity at 400 to 700 nm was less than 1%.
  B: The maximum reflectivity at 400 to 700 nm was 1% or more and less than 2%.
  C: The maximum reflectivity at 400 to 700 nm was 2% or more and less than 4%.
  D: The maximum reflectivity at 400 to 700 nm was 4% or more and less than 6%.
  E: The maximum reflectivity at 400 to 700 nm was 6% or more.

Viscosity stability over time (rate of change in viscosity over time after 1 year of refrigeration)

The change in viscosity of the composition obtained above after 1 year lapsed in an environment of a temperature of 7° C. was evaluated. The viscosity was measured with a standard cone rotor (1° 34'×R24) and E-type rotational viscometer RE85L manufactured by TOKI SANGYO CO., LTD. by setting a rotation speed to 50 rpm and adjusting the temperature of a sample cup to 23±0.2° C. The evaluation was performed according to the following determination criterions.

In the following determination criterion, A to C are levels which are unproblematic for practical use.
Determination Criterion
  A: The change in viscosity before and after the test over time was 0.0% or more and less than 3.0%.
  B: The change in viscosity before and after the test over time was 3.0% or more and less than 5.0%.
  C: The change in viscosity before and after the test over time was 5.0% or more and less than 10.0%.
  D: The change in viscosity before and after the test over time was 10.0% or more and less than 15.0%.
  E: The change in viscosity before and after the test over time was 15.0% or more.

Minimum Transmittance (Solvent Resistance) of Glass Substrate after Development

Each composition obtained above was applied to an 8-inch glass wafer with an undercoat layer (CT-4000L manufactured by Fujifilm Electronic Materials Co., Ltd.) using a spin coater such that a film thickness after drying was 1.5 μm. Thereafter, the composition was heat-treated (pre-baked) using a hot plate at 110° C. for 120 minutes.

Next, using a mask aligner exposure device EVG6200 (manufactured by EV Group), the resultant was exposed to light having a wavelength of 365 nm at 1000 mJ/cm² through a mask having a pattern of 2 cm×2 cm.

Thereafter, the glass wafer on which the exposed coating film was formed was placed on a horizontal rotary table of a spin shower developing machine (DW-30 type, manufactured by Chemitronics Co., Ltd.), and subjected to puddle development at 23° C. for 60 seconds using an aqueous solution of 0.3% tetramethylammonium hydroxide (TMAH), thereby forming a pattern of 2 cm×2 cm on the glass wafer.

The glass wafer on which a pattern of 2 cm×2 cm was formed was fixed to the horizontal rotary table by a vacuum chuck method, subjected to a rinse treatment by supplying pure water in a form of a shower from a spray nozzle from above the rotation center while rotating the glass wafer at a rotation speed of 50 rpm by a rotation device, and then spray-dried. Then, a heating treatment (post-baking: 220° C./5 minutes) was performed for 5 minutes using a hot plate at 220° C.

The minimum transmittance at a wavelength of 400 to 1000 nm in the non-image area after producing the 2 cm×2 cm pattern formed above was measured with a spectrophotometer U-4100 (manufactured by Hitachi High-Technologies Corporation), and the minimum transmittance of the glass substrate after development was evaluated. As the fluctuation is smaller, the solvent resistance is better, which is more desirable.

In the following determination criterion, A to C are levels which are unproblematic for practical use.
Determination Criterion
  A: The minimum transmittance was 99% or more and 100% or less.
  B: The minimum transmittance was 98% or more and less than 99%.
  C: The minimum transmittance was 97% or more and less than 98%.
  D: The minimum transmittance was 95% or more and less than 97%.
  E: The minimum transmittance was less than 95%.

Undercut

The compositions of Examples and Comparative Examples obtained above were prepared. The composition was applied onto an 8-inch silicon wafer with an undercoat layer (CT-4000L manufactured by FUJIFILM Electronic Materials Co., Ltd.) by a spin coating method so that the film thickness after application was 1.5 μm, and then heated on a hot plate at 110° C. for 2 minutes to obtain a composition layer.

Next, using a mask aligner exposure device EVG6200 (manufactured by EV Group), the obtained composition layer was exposed (exposure amount of 500 mJ/cm²) in a form of a line-and-space pattern of 300 μm through a mask.

Subsequently, a development treatment was performed using a development device (Act-8 manufactured by Tokyo Electron Limited). Shower development was performed at 23° C. for 60 seconds by using an aqueous solution of 0.3% tetramethylammonium hydroxide (TMAH) as a developer. Thereafter, rinse was performed with a spin shower using pure water to obtain a line-and-space pattern of 300 μm. An undercut width was measured by observing the cross section of the obtained pattern with a scanning electron microscope (SEM) (S-4800, manufactured by Hitachi High-Technologies Corporation), and evaluated according to the following determination criterions.

In the following determination criterion, A to C are levels which are unproblematic for practical use.

Determination Criterion
A: 0.0 μm or more and less than 3.0 μm
B: 3.0 μm or more and less than 6.0 μm
C: 6.0 μm or more and less than 10.0 μm
D: 10.0 μm or more and less than 25.0 μm
E: 25.0 μm or more Coating Unevenness (Coating Properties)

The obtained composition was applied onto a silicon wafer using a spin coater so that the film thickness after drying was 1.5 μm, and subjected to a heating treatment (pre-baking) for 120 seconds using a hot plate at 110° C. A surface of the obtained film was observed with an optical microscope (1x magnification) to confirm the presence or absence of wavy coating unevenness, and evaluated according to the following criterion.

In the following determination criterion, A and B are levels which are unproblematic for practical use.

Determination Criterion
A: no streak-like coating unevenness
B: Very slight streak-like coating unevenness was observed.
C: Many streak-like coating unevennesses were observed.

Evaluation of Pencil Hardness

Each composition obtained above was applied to an 8-inch silicon wafer with an undercoat layer (CT-4000L manufactured by Fujifilm Electronic Materials Co., Ltd.) using a spin coater such that a film thickness after drying was 1.5 μm. Thereafter, the composition was heat-treated (pre-baked) using a hot plate at 110° C. for 120 minutes.

Next, using a mask aligner exposure device EVG6200 (manufactured by EV Group), the resultant was exposed to light having a wavelength of 365 nm at 1000 mJ/cm$^2$ through a mask having a pattern of 5 cm×5 cm.

Thereafter, the silicon wafer on which the exposed coating film was formed was placed on a horizontal rotary table of a spin shower developing machine (DW-30 type, manufactured by Chemitronics Co., Ltd.), and subjected to puddle development at 23° C. for 60 seconds using an aqueous solution of 0.3% tetramethylammonium hydroxide (TMAH), thereby forming a pattern of 5 cm×5 cm on the silicon wafer.

The glass wafer on which a pattern of 5 cm×5 cm was formed was fixed to the horizontal rotary table by a vacuum chuck method, subjected to a rinse treatment by supplying pure water in a form of a shower from a spray nozzle from above the rotation center while rotating the glass wafer at a rotation speed of 50 rpm by a rotation device, and then spray-dried. Then, a heating treatment (post-baking: 220° C./5 minutes) was performed for 5 minutes using a hot plate at 220° C.

A pencil hardness of the 5 cm×5 cm pattern formed above was evaluated by the method described in JIS K5600-5-4 using a continuous weighted scratch resistance strength tester TYPE: 18 (manufactured by Shinto Scientific Co., Ltd.).

In the following determination criterion, A to C are levels which are unproblematic for practical use.

Determination Criterion
A: The pencil hardness was 4H or more.
B: The pencil hardness was 3H.
C: The pencil hardness was 2H.
D: The pencil hardness was 1H or less.

Evaluation of Peeling after Humidity Test

The compositions of Examples and Comparative Examples obtained above were prepared. The composition was applied onto an 8-inch silicon wafer with an undercoat layer (CT-4000L manufactured by FUJIFILM Electronic Materials Co., Ltd.) by a spin coating method so that the film thickness after application was 1.5 μm, and then heated on a hot plate at 110° C. for 2 minutes to obtain a composition layer.

Next, using a mask aligner exposure device EVG6200 (manufactured by EV Group), the obtained composition layer was exposed (exposure amount of 500 mJ/cm$^2$) in a form of a line-and-space pattern of 300 μm through a mask.

Subsequently, a development treatment was performed using a development device (Act-8 manufactured by Tokyo Electron Limited). Shower development was performed at 23° C. for 60 seconds by using an aqueous solution of 0.3% tetramethylammonium hydroxide (TMAH) as a developer. Thereafter, rinse was performed with a spin shower using pure water to obtain a line-and-space pattern of 300 μm.

The substrate with the obtained pattern was left to stand for 750 hours, 1000 hours, and 1,500 hours in an atmosphere of a temperature of 85° C. and a relative humidity of 85% using a constant temperature and humidity machine (EHS-221M) manufactured by Yamato Scientific Co., Ltd.

The presence or absence of peeling was observed by observing the cross section of the pattern after each humidity test with the scanning electron microscope (SEM) (S-4800, manufactured by Hitachi High-Technologies Corporation).

In the following determination criterion, A and B are levels which are unproblematic for practical use.

Determination Criterion
A: There was no peeling in a case of being left to stand for 1500 hours.
B: There was peeling in a case of being left to stand for 1500 hours.
C: There was peeling in a case of being left to stand for 1000 hours.
D: There was peeling in a case of being left to stand for 750 hours.

Results

The test results of the compositions used in the test are shown in Tables 11 and 12.

TABLE 11

| | Light shielding resist composition number | Minimum OD value at 400 to 1000 nm | Maximum reflectivity at 400 to 700 nm | Viscosity stability over time | Minimum transmittance of glass substrate after development | Undercut | Coating unevenness | Pencil hardness | Peeling after humidity test |
|---|---|---|---|---|---|---|---|---|---|
| Example 1 | Example Composition 1 | B | C | B | B | C | B | C | B |
| Example 2 | Example Composition 2 | B | B | A | B | C | A | C | B |
| Example 3 | Example Composition 3 | B | B | A | B | C | B | C | B |

TABLE 11-continued

| | Light shielding resist composition number | Minimum OD value at 400 to 1000 nm | Maximum reflectivity at 400 to 700 nm | Viscosity stability over time | Minimum transmittance of glass substrate after development | Undercut | Coating unevenness | Pencil hardness | Peeling after humidity test |
|---|---|---|---|---|---|---|---|---|---|
| Example 4 | Example Composition 4 | B | B | A | B | C | A | C | B |
| Example 5 | Example Composition 5 | B | B | A | B | C | B | C | B |
| Example 6 | Example Composition 6 | B | C | B | B | C | B | C | B |
| Example 7 | Example Composition 7 | B | C | B | B | C | B | C | B |
| Example 8 | Example Composition 8 | B | B | A | B | C | B | C | B |
| Example 9 | Example Composition 9 | B | B | A | B | C | B | C | B |
| Example 10 | Example Composition 10 | B | B | A | B | C | A | C | B |
| Example 11 | Example Composition 11 | B | B | B | B | C | B | C | B |
| Example 12 | Example Composition 12 | B | B | B | B | C | B | C | B |
| Example 13 | Example Composition 13 | B | B | A | B | C | B | C | B |
| Example 14 | Example Composition 14 | B | B | A | B | C | B | C | B |
| Example 15 | Example Composition 15 | B | B | A | B | C | A | C | B |
| Example 16 | Example Composition 16 | B | B | B | B | C | B | C | B |
| Example 17 | Example Composition 17 | B | B | A | B | B | A | B | A |
| Example 18 | Example Composition 18 | B | B | A | B | B | A | C | B |
| Example 19 | Example Composition 19 | B | B | A | B | C | A | C | B |
| Example 20 | Example Composition 20 | B | B | A | B | B | A | B | B |
| Example 21 | Example Composition 21 | B | B | A | B | B | A | A | B |
| Example 22 | Example Composition 22 | B | B | A | B | B | A | A | B |
| Example 23 | Example Composition 23 | B | B | A | B | B | A | A | B |
| Example 24 | Example Composition 24 | B | B | A | B | B | A | A | A |
| Example 25 | Example Composition 25 | B | B | A | B | C | A | C | B |
| Example 26 | Example Composition 26 | B | B | A | B | C | A | C | B |
| Example 27 | Example Composition 27 | B | B | A | B | B | A | A | A |
| Example 28 | Example Composition 28 | B | B | A | B | B | A | A | B |
| Example 29 | Example Composition 29 | B | B | A | B | B | A | A | B |
| Example 30 | Example Composition 30 | B | B | A | B | A | A | A | A |
| Example 31 | Example Composition 31 | B | A | A | B | B | A | A | A |
| Example 32 | Example Composition 32 | B | A | A | B | B | A | A | A |
| Example 33 | Example Composition 33 | B | A | A | B | B | A | A | A |
| Example 34 | Example Composition 34 | B | B | A | B | C | A | B | B |

TABLE 12

| Light shielding resist composition number | Minimum OD value at 400 to 1000 nm | Maximum reflectivity at 400 to 700 nm | Viscosity stability over time | Minimum transmittance of glass substrate after development | Undercut | Coating unevenness | Pencil hardness | Peeling after humidity test |
|---|---|---|---|---|---|---|---|---|
| Example 35 | Example Composition 35 | B | B | B | C | B | A | A | A |
| Example 36 | Example Composition 36 | B | B | B | C | B | A | A | A |
| Example 37 | Example Composition 37 | B | B | B | B | B | A | A | A |
| Example 38 | Example Composition 38 | B | C | C | A | B | A | A | B |
| Example 39 | Example Composition 39 | B | B | A | C | A | A | A | A |
| Example 40 | Example Composition 40 | B | C | A | B | B | A | A | A |
| Example 41 | Example Composition 41 | B | A | C | B | A | A | A | A |
| Example 42 | Example Composition 42 | B | A | A | B | B | A | A | A |
| Example 43 | Example Composition 43 | B | A | A | B | B | A | A | A |
| Example 44 | Example Composition 44 | C | B | A | B | B | A | A | A |
| Example 45 | Example Composition 45 | B | B | C | B | B | A | A | A |
| Example 46 | Example Composition 46 | B | A | A | B | A | A | A | A |
| Example 47 | Example Composition 47 | B | A | A | B | A | B | A | A |
| Example 48 | Example Composition 48 | B | A | A | B | A | A | A | A |
| Example 49 | Example Composition 49 | B | B | A | B | A | A | A | A |
| Example 50 | Example Composition 50 | B | A | A | B | A | A | A | A |
| Example 51 | Example Composition 51 | B | B | B | B | B | B | A | B |
| Example 52 | Example Composition 52 | B | B | B | B | B | B | A | B |
| Example 53 | Example Composition 53 | B | A | A | B | A | B | A | A |
| Example 54 | Example Composition 54 | B | A | A | B | A | A | A | A |
| Example 55 | Example Composition 55 | B | A | A | B | A | B | A | A |
| Example 56 | Example Composition 56 | B | A | A | B | A | B | A | A |
| Example 57 | Example Composition 57 | A | A | A | A | A | A | A | A |
| Example 58 | Example Composition 58 | A | A | A | A | A | A | A | A |
| Example 59 | Example Composition 59 | A | A | A | A | A | A | A | A |
| Example 60 | Example Composition 60 | B | B | A | B | C | A | C | B |
| Comparative Example 1 | Comparative Composition 1 | C | E | D | D | E | C | D | D |
| Comparative Example 2 | Comparative Composition 2 | C | D | E | E | D | C | D | C |
| Comparative Example 3 | Comparative Composition 3 | C | E | D | E | D | C | D | C |
| Comparative Example 4 | Comparative Composition 4 | C | D | D | D | E | C | D | D |
| Comparative Example 5 | Comparative Composition 5 | C | E | D | E | D | C | D | C |

From the results of Tables 11 and 12, it is found that a cured film produced by the composition of Examples has excellent light shielding properties (high minimum OD value at a wavelength of 400 to 1000 nm) and excellent low reflection properties (low maximum reflectivity at a wavelength of 400 to 700 nm).

Moreover, from the comparison of Examples 1 to 7, it is confirmed that, in a case where the composition includes, as the solvent A, a solvent having a solubility parameter of 11.0 to 14.0 $(\text{cal/cm}^3)^{1/2}$, the maximum reflectivity at a wavelength of 400 to 700 nm is lower and the viscosity stability over time is more excellent. Among them, it is further confirmed that, in a case where the composition includes, as the solvent A, a solvent having a solubility parameter of 12.0 to 13.0 $(\text{cal/cm}^3)^{1/2}$, the coating properties are also more excellent.

In addition, from the comparison of Example 2 and Examples 8 to 12, it is confirmed that, in a case where the solvent B in the composition is a solvent having a boiling point of 140° C. to 160° C., the viscosity stability over time is more excellent. Among them, it is further confirmed that, in a case where the solvent B in the composition includes cyclohexanone, the coating properties are also more excellent.

In addition, from the comparison of Example 2 and Examples 13 to 16, it is confirmed that, in a case where the solvent C in the composition is a solvent having a boiling point of 100° C. to 135° C., the viscosity stability over time is more excellent. Among them, it is further confirmed that, in a case where the solvent C in the composition is a solvent having a boiling point of 120° C. to 135° C. (preferably, butyl acetate or cyclopentanone), the coating properties are also more excellent.

From the comparison of Example 2 and Example 17, it is confirmed that, in a case where the alkali-soluble resin has a double bond in the side chain (preferably, a case where the side chain includes an ethylenically unsaturated group), the undercut suppression, the pencil hardness, and the peeling resistance against moisture after aging are more excellent.

From the comparison of Examples 17 to 19, it is confirmed that, in a case where the polymerizable compound is a 4- or higher functional ethylenically unsaturated compound, the undercut suppression is more excellent. Among them, it is confirmed that, in a case where the polymerizable compound is a 6- or higher functional ethylenically unsaturated compound, in addition to the undercut suppression, the pencil hardness and the peeling resistance against moisture after aging are also more excellent.

From the comparison of Example 17 and Examples 20 to 26, it is confirmed that, in a case where the polymerization initiator is an oxime ester-based polymerization initiator, the undercut suppression and the pencil hardness are more excellent. Among them, it is confirmed that, in a case where the polymerization initiator is the compound represented by Formula (1) described above, in addition to the undercut suppression and the pencil hardness, the peeling resistance against moisture after aging is also more excellent.

From the comparison of Example 17 and Examples 27 and 28, it is confirmed that, in a case where a compound having an epoxy group is added, the pencil hardness is further improved.

From the comparison of Examples 24 and 30, it is confirmed that, in a case where the adhesive agent is added, the undercut suppression is more excellent.

From the comparison of Example 24 and Examples 31 to 33, it is confirmed that, in a case where the composition includes a silicone-based surfactant, the maximum reflectivity at a wavelength of 400 to 700 nm is lower.

From the composition of Example 24 and Examples 35 and 36, it is confirmed that, in a case where the composition includes a salt composed of copper phthalocyanine having a sulfonic acid group and dimethyldioctadecylammonium as the compound selected from copper phthalocyanine and a copper phthalocyanine derivative, the minimum transmittance of the glass substrate after development is lower.

From the comparison of Example 24 and Examples 37 to 39, it is confirmed that, in a case where the composition includes the above-described resin X1 as the dispersant, various performances such as the viscosity stability over time are more excellent.

From the comparison of Example 24 and Examples 40 and 41, it is confirmed that, in a case where a content ratio of the barium sulfate to the copper phthalocyanines in the composition (mass ratio; content of barium sulfate/content of copper phthalocyanines) is 1.0 to 3.0, the viscosity stability over time is more excellent and the maximum reflectivity at a wavelength of 400 to 700 nm is lower (in a case where the content ratio is less than 1.0, the viscosity stability over time is excellent but the maximum reflectivity at a wavelength of 400 to 700 nm may be high; on the other hand, in a case where the content ratio is more than 3.0, the maximum reflectivity at a wavelength of 400 to 700 nm is lower but the viscosity stability over time may be deteriorated).

From the comparison of Example 39 and Examples 42 to 45, it is confirmed that, in a case where the average primary particle diameter of the carbon black is 10 to 30 nm, the minimum OD value at a wavelength of 400 to 1000 nm is higher. Moreover, it is confirmed that, in a case where the carbon black is acidic, the viscosity stability over time is more excellent.

From the comparison of Example 24 and Examples 49 to 52, it is confirmed that, in a case where the content of the solvent A is 5.0% to 15.0% by mass with respect to the total mass of the solvent (total content of the solvent A, the solvent B, and the solvent C), the maximum reflectivity at a wavelength of 400 to 700 nm is lower.

From the comparison of Example 33, Examples 46 to 49, and Examples 53 to 56, it is confirmed that, in a case where the content of the solvent C is 5.0% to 15.0% by mass with respect to the total mass of the solvent (total content of the solvent A, the solvent B, and the solvent C), the coating unevenness is further suppressed.

From the comparison of Example 24 and Examples 57 to 59, it is confirmed that, in a case where the composition further includes one or more kinds selected from the group consisting of a metal nitride and a metal oxynitride, the minimum OD value at a wavelength of 400 to 1000 nm is high, the maximum reflectivity at a wavelength of 400 to 700 nm is low, and all other performances are excellent.

Examples 61 to 63

In a case where a water concentration of Example Composition 2 (Example 2) was measured, the content of water was 0.1% by mass with respect to the total mass of the composition. Next, an appropriate amount of water was added to Example Composition 2 so that the water content with respect to the total mass of the composition was 0.5% by mass, 1.0% by mass, and 1.5% by mass, respectively, (water content 0.5% by mass: Example Composition 2-1 (Example 61), water content 1.0% by mass: Example Composition 2-2 (Example 62), water content 1.5% by mass: Example Composition 2-3 (Example 63)). Thereafter, in a case where the viscosity stability over time was evaluated in the same manner as in Example Composition 2 (Example 2), the viscosity stability over time of Example Composition 2-1 (Example 61), Example Composition 2-2 (Example 62), and Example Composition 2-3 (Example 63) was A, A, B.

EXPLANATION OF REFERENCES

100: solid-state imaging device
101: solid-state imaging element
102: imaging part
103: cover glass
104: spacer
105: laminated substrate
106: chip substrate
107: circuit substrate 108: electrode pad
109: external connection terminal
110: through-electrode
111: lens layer
112: lens material
113: support
114, 115: cured film
201: light-receiving element
202: color filter
203: microlens
204: substrate
205b: blue pixel
205r: red pixel
205g: green pixel
205bm: black matrix
206: p-well layer
207: reading gate part
208: vertical electric charge transfer path
209: element separation region
210: gate insulating film
211: vertical electric charge transfer electrode
212: cured film
213, 214: insulating film
215: planarization film
300: infrared sensor
310: solid-state imaging element
311: infrared absorption filter
312: color filter
313: infrared transmitting filter
314: resin film
315: microlens
316: planarization film

What is claimed is:

1. A composition comprising:
carbon black;
barium sulfate;
one or more kinds selected from the group consisting of copper phthalocyanine and a copper phthalocyanine derivative;
a resin; and
a solvent,
wherein the solvent includes a solvent A having a boiling point of 180° C. or higher, a solvent B having a boiling point of 140° °C. or higher and lower than 180° C., and a solvent C having a boiling point of 100° C. or higher and lower than 140° C.; and wherein
a content of the solvent A is 5.0% to 15.0% by mass with respect to a total content of the solvent A, the solvent B, and the solvent C,
a content of the solvent B is 70.0% to 90.0% by mass with respect to the total content of the solvent A, the solvent B, and the solvent C, and
a content of the solvent C is 5.0% to 15.0% by mass with respect to the total content of the solvent A, the solvent B, and the solvent C.

2. The composition according to claim 1, further comprising:
a compound including an unsaturated double bond; and
a polymerization initiator.

3. The composition according to claim 2,
wherein the polymerization initiator includes a compound represented by Formula (1),

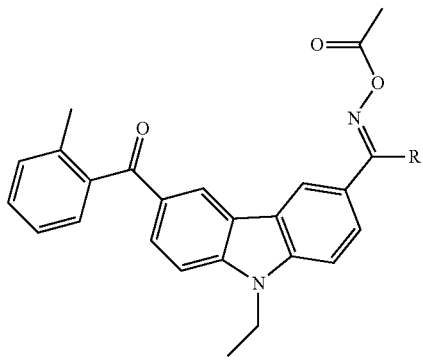

in Formula (1), R represents a group represented by Formula (1a),

in Formula (1a), n represents an integer of 1 to 5, m represents an integer of 1 to 6, and * represents a bonding position.

4. The composition according to claim 1,
wherein a solubility parameter of the solvent A is 11.0 to 14.0 $(cal/cm^3)^{1/2}$.

5. The composition according to claim 1,
wherein a solubility parameter of the solvent A is 12.0 to 13.0 $(cal/cm^3)^{1/2}$.

6. The composition according to claim 1,
wherein the solvent A is one or more kinds selected from the group consisting of γ-butyrolactone, dimethyl sulfoxide, and benzyl alcohol,
the solvent B is one or more kinds selected from the group consisting of propylene glycol monomethyl ether acetate and cyclohexanone, and
the solvent C is one or more kinds selected from the group consisting of butyl acetate and ethyl butyrate.

7. The composition according to claim 1,
wherein the copper phthalocyanine derivative is a salt composed of copper phthalocyanine having a sulfonic acid group and dimethyldioctadecylammonium.

8. The composition according to claim 1,
wherein a content of the carbon black is 15% to 40% by mass with respect to a total solid content of the composition.

9. The composition according to claim 1, further comprising:
one or more kinds of metal-containing particles selected from the group consisting of a metal nitride and a metal oxynitride.

10. The composition according to claim 9,
wherein the metal-containing particles are a nitride or an oxynitride of one or more kinds of metals selected from the group consisting of titanium, zirconium, vanadium, and niobium.

11. The composition according to claim 1, further comprising:
a silicone-based surfactant.

12. The composition according to claim 11,
wherein the silicone-based surfactant is a surfactant having a phenyl group.

13. The composition according to claim 1,
wherein a content of a solid content is 10% to 40% by mass.

14. The composition according to claim 1,
wherein a content of water is 1.0% by mass or less with respect to a total mass of the composition.

15. The composition according to claim 1,
wherein the composition is a composition for forming a light shielding film.

16. A light shielding film comprising:
a cured film formed from the composition according to claim 1.

17. A solid-state imaging element comprising:
a cured film formed from the composition according to claim 1.

18. An image display device comprising:
a cured film formed from the composition according to claim 1.

19. A method for manufacturing a cured film, comprising:
a composition layer forming step of forming a composition layer consisting of the composition according to claim 2 on a support;
an exposure step of exposing the composition layer by irradiating the composition layer with an actinic ray or a radiation; and
a development step of performing a development treatment on the composition layer after the exposure.

20. A composition comprising:
carbon black;
barium sulfate, wherein the primary particle diameter of the barium sulfate is 0.01 to 0.08 µm;
one or more kinds selected from the group consisting of copper phthalocyanine and a copper phthalocyanine derivative;
a resin; and
a solvent,
wherein the solvent includes a solvent A having a boiling point of 180° C. or higher, a solvent B having a boiling point of 140° ° C. or higher and lower than 180° C., and a solvent C having a boiling point of 100° C. or higher and lower than 140° C.

* * * * *